US009601706B2

(12) United States Patent
Iwai et al.

(10) Patent No.: US 9,601,706 B2
(45) Date of Patent: Mar. 21, 2017

(54) RESIN COMPOSITION FOR FORMING PROTECTIVE FILM, PROTECTIVE FILM, PATTERN FORMING METHOD, METHOD FOR MANUFACTURING ELECTRONIC DEVICE, AND ELECTRONIC DEVICE

(71) Applicant: FUJIFILM Corporation, Tokyo (JP)

(72) Inventors: Yu Iwai, Shizuoka (JP); Atsushi Nakamura, Shizuoka (JP); Yoshitaka Kamochi, Shizuoka (JP); Masafumi Yoshida, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/689,216

(22) Filed: Apr. 17, 2015

(65) Prior Publication Data

US 2015/0221881 A1 Aug. 6, 2015

Related U.S. Application Data

(63) Continuation of application No. PCT/JP2013/078098, filed on Oct. 16, 2013.

(30) Foreign Application Priority Data

Oct. 19, 2012 (JP) .................................. 2012-232416
Aug. 26, 2013 (JP) .................................. 2013-174743

(51) Int. Cl.
| | |
|---|---|
| *G03F 7/11* | (2006.01) |
| *H01L 51/00* | (2006.01) |
| *H01L 21/02* | (2006.01) |
| *G03F 7/027* | (2006.01) |
| *G03F 7/038* | (2006.01) |
| *G03F 7/039* | (2006.01) |
| *G03F 7/32* | (2006.01) |
| *C09D 101/00* | (2006.01) |
| *C09D 105/00* | (2006.01) |
| *G03F 7/20* | (2006.01) |
| *H01L 51/10* | (2006.01) |
| *H01L 51/44* | (2006.01) |
| *H01L 51/52* | (2006.01) |
| *H01L 51/56* | (2006.01) |

(52) U.S. Cl.
CPC ........ *H01L 51/0093* (2013.01); *C09D 101/00* (2013.01); *C09D 105/00* (2013.01); *G03F 7/027* (2013.01); *G03F 7/0388* (2013.01); *G03F 7/0392* (2013.01); *G03F 7/11* (2013.01); *G03F 7/20* (2013.01); *G03F 7/325* (2013.01); *H01L 21/02118* (2013.01); *H01L 51/004* (2013.01); *H01L 51/107* (2013.01); *H01L 51/448* (2013.01); *H01L 51/5253* (2013.01); *H01L 51/56* (2013.01)

(58) Field of Classification Search
USPC ..................................................... 430/273.1
See application file for complete search history.

(56) References Cited

U.S. PATENT DOCUMENTS

| | | | | | |
|---|---|---|---|---|---|
| 3,784,390 | A | * | 1/1974 | Hijiya ....................... | C08L 5/00 106/144.72 |
| 3,997,703 | A | * | 12/1976 | Nakashio ................ | B32B 27/00 156/328 |
| 4,917,885 | A | * | 4/1990 | Chiba .................. | A61K 9/4816 206/530 |
| 5,270,146 | A | * | 12/1993 | Tara .......................... | G03F 7/11 430/259 |
| 6,146,712 | A | * | 11/2000 | Maeda ..................... | B41M 5/52 427/493 |
| 2006/0173104 | A1 | * | 8/2006 | Gatenholm ................ | C08J 5/18 524/35 |
| 2011/0081746 | A1 | | 4/2011 | Nomoto et al. | |
| 2016/0172595 | A1 | * | 6/2016 | Malinowski ........ | H01L 51/0018 438/82 |

FOREIGN PATENT DOCUMENTS

| | | | |
|---|---|---|---|
| EP | 0267807 A2 | * | 5/1988 |
| JP | 60-200249 A | * | 10/1985 |
| JP | 05-027419 A | * | 2/1993 |
| JP | 09258453 A | | 10/1997 |
| JP | 2003525521 A | | 8/2003 |
| JP | 2006041317 A | | 2/2006 |
| JP | 2008300480 A | | 12/2008 |

(Continued)

OTHER PUBLICATIONS

Dlugunovich et al, Structural Transformations of Polysaccharides Exposed to CO2-Laser Radiation, Journal of Applied Spectroscopy, vol. 73, No. 2, year 2006 pp. 178-184.*
English abstract of JP 60-200249 a from Scifinder database indexed 1986 and downloaded 2016 with accesion No. 1986:17779 , three pages.*
English translation of JP 2011-254091, A (2011) from machine translation from AIPN Japan Patent Office National Center for Industrial Property Information and Training, generated Feb. 17, 2016, 18 pages.*
English translation of WO2015064603 generated from Google translate on the Patent scope website on Feb. 2016, 65 pages.*

(Continued)

*Primary Examiner* — Cynthia Hamilton
(74) *Attorney, Agent, or Firm* — Sughrue Mion, PLLC

(57) ABSTRACT

There is provided a resin composition for use in formation of a protective film to protect a substrate or a film formed on the substrate, from a developer containing an organic solvent to be used for development in pattern formation, and which contains two or more kinds of resins in which their main chain structures having a hydroxyl group are different, and contains water, a pattern forming method using the resin composition, and layered products comprising a substrate, an organic semiconductor film on the substrate, and a protective film comprising two or more kinds of resins in which their main chain structures having a hydroxyl group are different, on the organic semiconductor film.

6 Claims, No Drawings

(56) References Cited

FOREIGN PATENT DOCUMENTS

| JP | 2011077470 A | 4/2011 |
| JP | 2011254091 A | 12/2011 |
| WO | 0108241 A1 | 2/2001 |
| WO | 2010095504 A1 | 8/2010 |
| WO | 2015/028407 A1 * | 3/2015 |
| WO | 2015/064603 A1 * | 5/2015 |

OTHER PUBLICATIONS

English translation of JP 09-258453, A (1997) from machine translation from AIPN Japan Patent Office National Center for Industrial Property Information and Training, generated Feb. 20, 2016, 9 pages.*

English translation of JP 05-027419, A (1993) from machine translation from AIPN Japan Patent Office National Center for Industrial Property Information and Training, generated Feb. 11, 2016, 5 pages.*

English translation of JP, 2008-300480, A (2008) from machine translation from AIPN Japan Patent Office National Center for Industrial Property Information and Training, generated Feb. 17, 2016, 26 pages.*

International Search Report (PCT/ISA/210) issued Dec. 24, 2013, in related International Application No. PCT/JP2013/078098.

Written Opinion (PCT/ISA/237) issued Dec. 24, 2013, in related International Application No. PCT/JP2013/078098.

English translation of Written Opinion dated Dec. 24, 2013 issued by the International Searching Authority in counterpart International Patent Application No. PCT/JP2013/078098 (PCT/ISA/237).

Office Action issued Apr. 5, 2016, by the Japanese Patent Office in counterpart Japanese Patent Application No. 2013-174743.

Office Action issued on Jun. 21, 2016, by the Korean Intellectual Property Office in counterpart Korean Application No. 10-2015-7009932.

Office Action dated Dec. 2, 2016 issued by the Taiwan Intellectual Property Office in counterpart Taiwanese Patent Application No. 102137616.

Office Action dated Jan. 23, 2017, issued by the Korean Intellectual Property Office in counterpart Korean Application No. 10-2015-7009932.

* cited by examiner

RESIN COMPOSITION FOR FORMING PROTECTIVE FILM, PROTECTIVE FILM, PATTERN FORMING METHOD, METHOD FOR MANUFACTURING ELECTRONIC DEVICE, AND ELECTRONIC DEVICE

CROSS REFERENCE TO RELATED APPLICATION

This is a continuation of International Application No. PCT/JP2013/078098 filed on Oct. 16, 2013, and claims priority from Japanese Patent Application No. 2012-232416 filed on Oct. 19, 2012, Japanese Patent Application No. 2013-174743 filed on Aug. 26, 2013, the entire disclosures of which are incorporated therein by reference.

TECHNICAL FIELD

The present invention relates to a process for manufacturing semiconductors such as ICs, manufacture of circuit boards such as liquid crystal and thermal head, and further, a resin composition for forming a protective film suitable for lithography processes in photo fabrication, a protective film, a pattern forming method, a method for manufacturing electronic device, and an electronic device. In particular, the present invention relates to a resin composition for forming a protective film which is suitable for protecting an organic semiconductor film formed on a substrate, a protective layer, a pattern forming method, a method for manufacturing an electronic device and an electronic device.

BACKGROUND ART

Devices using organic semiconductors may be produced by a more simple process as compared with the process for devices using inorganic semiconductors such as conventional silicon, and further, it is possible to easily alter material properties by changing their molecular structure. Hence, it is considered that there are many possible variations in the material of organic semiconductors and that, further, it is possible for them to accomplish all of the functions or elements which could not be accomplished by the inorganic semiconductors. Recently, studies associated with this have been actively performed. For example, the organic semiconductors may be applicable for flexible electronic devices such as organic solar cells, organic electroluminescence displays, and organic light detectors.

Patterning of organic semiconductors has been carried out by printing techniques so far, but there was a limitation to a fine fabrication in patterning by printing techniques. Therefore, studies to apply the patterning by printing photolithography and etching which have been applied to the inorganic semiconductor such as conventional silicon, even to the patterning of the organic semiconductor, have been performed.

However, the organic semiconductors may have weak solvent resistance and deteriorate a film formed by organic semiconductors other than some alcohol or aqueous solution (hereinafter, called simply an organic semiconductor film). Also, the organic semiconductor film would be deteriorated even by an alkaline developer of 2.38% by mass TMAH (tetramethylammonium hydroxide aqueous solution), leading to deterioration of the electrical characteristics.

For the purpose of preventing deterioration of the organic semiconductor film, there are known various methods for forming a protective film on the organic semiconductor film and performing various patterning (for example, see Patent Literatures 1 to 3).

RELATED ART

Patent Documents

Patent Document 1: Japanese Patent Laid-Open Publication No. 2003-525521
Patent Document 2: Japanese Patent Laid-Open Publication No. 2006-41317
Patent Document 3: Japanese Patent Laid-Open Publication No. 2011-254091

SUMMARY OF THE INVENTION

Problems to be Solved by the Invention

However, upon formation of a protective film, a coating irregularity or strip easily occurs and it is easy for the film thickness to become irregular. This may affect the formation and patterning of any subsequent resist films. Therefore, there is a need for improved methods for reducing coating irregularity or strip and for increasing the uniformity of film thickness.

After forming a pattern on a resist film and a protective film, they are commonly masked and further processed by etching, etc. Next, when removing the pattern of the resist film and the protective film, removing the pattern by a dry etching or ashing process may cause damage to organic semiconductor films on the underlying layer. Hence, there is a need for a removal method capable of reducing the damage.

In view of the above-mentioned problems, an object of the present invention is to provide a resin composition for forming a protective film, a protective film, and a pattern forming method, which can form the protective film such that it has a uniform film thickness without being stripped or causing coating irregularity on a substrate or on a film formed on the substrate, thereby forming fine and uniform pattern by a developer containing an organic solvent.

Moreover, an object of the present invention is to provide a pattern forming method in which the formed resist and protective film pattern may be used as a mask to for a desired pattern on the organic semiconductor film, and subsequently, the resist and protective film pattern used as a mask may be removed without damaging to the organic semiconductor film of the underlying layer.

Furthermore, an object of the present invention is to provide an electronic device manufactured by the method for manufacturing an electronic device comprising the pattern forming method.

Means for Solving the Problem

The present inventors have conducted intensive studies to solve the above-mentioned problems and have thereby completed the present invention.

That is, the present invention has the following configuration.

[1] A resin composition for use in formation of a protective film to protect a substrate or a film formed on the substrate, from a developer containing an organic solvent to be used for development in pattern formation, and which contains two or more kinds of resins in which their main chain structures having a hydroxyl group are different, and contains water.

[2] The resin composition according to [1],
wherein the film formed on the substrate is an organic semiconductor film.

[3] The resin composition according to [1] or [2],
wherein the two or more kinds of resins contain polyvinyl alcohols and polysaccharides.

[4] The resin composition according to [3],
wherein the polysaccharides are pullulan or water-soluble cellulose.

[5] The resin composition according to [3] or [4],
wherein a content of the polysaccharides is more than 70% by mass based on the total mass of the two or more of resins.

[6] The resin composition according to any one of [1] to [5],
further comprising an organic solvent soluble in water.

[7] A protective film formed from the resin composition according to any one of [1] to [6], which protects a substrate or a film formed on the substrate, from a developer containing an organic solvent to be used for development in the pattern formation.

[8] A pattern forming method comprising the following steps:
(1) forming an organic semiconductor film on a substrate,
(2) forming a protective film using the resin composition according to any one of [1] to [6] on the organic semiconductor film,
(3) forming a resist film on the protective film by an actinic ray-sensitive or radiation-sensitive resin composition (I) containing a resin capable of increasing a polarity by an action of an acid to decrease the solubility in a developer containing an organic solvent,
or an actinic ray-sensitive or radiation-sensitive resin composition (II) containing a conjugated diene polymer or copolymer or a cyclized product of the polymer or the copolymer, and a crosslinking agent,
(4) exposing the resist film,
(5) developing the resist film with a developer containing an organic solvent to form a negative type resist pattern on the resist film,
(6) forming a pattern on the protective layer by using water as a developer and using the resist pattern as a mask pattern,
(7) forming a pattern on the organic semiconductor film by using dry or wet etching and using the resist and protective film pattern as a mask, and
(8) removing the resist pattern using a peeling solution containing an organic solvent and further removing the protective film pattern using water.

[9] The pattern forming method according to [8],
wherein the developer containing an organic solvent is a developer containing at least one organic solvent selected from the group consisting of an ester-based solvent, a ketone-based solvent, an alcohol-based solvent, an amide-based solvent, an ether-based solvent, and a hydrocarbon-based solvent.

[10] The pattern forming method according to [8] or [9],
wherein the peeling solution containing an organic solvent is a peeling solution containing at least one organic solvent selected from the group consisting of an alcohol-based solvent, an ether-based solvents and a hydrocarbon-based solvent.

[11] A method for manufacturing an electric device, comprising the pattern forming method according to any one of [8] to [10].

[12] An electric device manufactured by the method for manufacturing the electric device according to [11].

In accordance with preferred embodiments of the invention, layered products are formed in accordance with the foregoing aspects of the invention. The water present in the resin composition according to [1] is typically evaporated after coating of the resin composition, in the formation of the layered products, as exemplified in working Examples below.

[13] In one embodiment, a layered product comprises:
a substrate,
an organic semiconductor film on the substrate, and
a protective film comprising two or more kinds of resins in which their main chain structures having a hydroxyl group are different, on the organic semiconductor film.

[14] In another embodiment, a layered product comprises:
a substrate,
an organic semiconductor film on the substrate,
a protective film comprising two or more kinds of resins in which their main chain structures having a hydroxyl group are different, on the organic semiconductor film, and
a resist film an actinic ray-sensitive or radiation-sensitive resin composition (I) containing a resin capable of increasing a polarity by an action of an acid to decrease the solubility in a developer containing an organic solvent, on the protective film.

Advantage of Invention

According to the present invention, there are provided a resin composition or forming protective film, a protective film, and a pattern forming method which can form a protective film having a uniform film thickness without being stripped or causing coating irregularity on a substrate or on a film formed on the substrate, thereby forming a fine and uniform pattern by a developer containing an organic solvent.

Also, according to the pattern forming method of the present invention, the formed resist and protective film pattern may be used as a mask to form a desired pattern on the organic semiconductor film, and subsequently, the resist and protective film pattern used as a mask may be removed without damaging on the organic semiconductor film of the underlying layer.

In addition, there is provided an electronic device manufactured by the method for manufacturing the electronic device comprising the pattern forming method.

MODE FOR CARRYING OUT THE INVENTION

Hereinafter, the embodiments of the present invention are described in detail.

When representing a group (atomic group) in the present invention, the group not specifying a substituted or an unsubstituted includes both groups having a substituent and groups having no substituent. For example, an "alkyl group" includes not only an alkyl group having no substituent (unsubstituted alkyl group), but also an alkyl group having a substituent (substituted alkyl group).

As used in the present specification, the wording "actinic ray" or "radiation" can refer to, for example, a bright line spectrum of a mercury lamp, far ultraviolet rays typified by an excimer laser, an extreme ultraviolet rays (EUV light), X-rays, an electron beam (EB), etc. The light used in the present invention refers to an actinic ray or radiation.

As used in the present specification, "exposure" includes exposure due to a mercury lamp, a far ultraviolet ray typified by an excimer laser, an extreme ultraviolet rays, X-rays, EUV light, etc., as well as drawing or exposure due to a particle beam such as an electron beam or an ion beam, unless otherwise stated.

Further, as used in the present specification, "(meth) acrylate" denotes an acrylate and methacrylate, "(meth) acryl" denotes acryl or methacryl, and "(meth)acryloyl" denotes acryloyl and methacryloyl.

The resin composition of the present invention is used for the formation of a protective film, used to protect a substrate or a film formed on the substrate, from a developer containing an organic solvent to be used for development in the pattern formation, and which contains water and two or more kinds of resins in which their main chain structures having a hydroxyl group are different.

The present invention also relates to a protective film formed from the above-described resin composition.

Furthermore, the present invention relates to a pattern forming method.

Further, the pattern forming method of the present invention comprises:

(1) a step of forming an organic semiconductor film on a substrate, (2) a step of forming a protective film using the above-described, resin composition on the organic semiconductor film, (3) a step of forming a resist film on the protective film using:

an actinic ray-sensitive or radiation-sensitive resin composition (I) containing a resin capable of increasing the polarity by an action of an acid to decrease the solubility of a developer containing an organic solvent, or an actinic ray-sensitive or radiation-sensitive resin composition (II) containing a conjugated diene polymer or copolymer or a cyclized product of the polymer or the copolymer, and a crosslinking agent, (4) a step of exposing the resist film, (5) a step of developing the resist film with a developer containing an organic solvent to form a negative type resist pattern on the resist film, (6) a step of forming a pattern on the protective layer by using water as a developer and using the resist pattern as a mask pattern, (7) a step of forming a pattern on the organic semiconductor film by using dry or wet etching and using the resist and protective film pattern as a mask, and (8) a step of removing the resist pattern using a peeling solution containing an organic solvent and further removing the protective film pattern using water.

In the present invention, a variety of materials such as silicon, quartz, ceramics, glass polyethylene naphthalate (PEN), polyester films such as polyethylene terephthalate (PET), and polyimide film may be used as the substrate, and any substrate may be selected depending on the desired application. For example, in the case of application of a flexible element, a flexible substrate may be used. In addition, the thickness of the substrate is not particularly limited.

In the present invention, the method for forming a film such as an organic semiconductor film, a carbon nanotube film or a graphene film (preferably, an organic semiconductor film) on the substrate may be executed in any manner. However, specific examples include methods such as casting, blade coating, wire bar coating, spray coating, dipping (immersing) coating, bead coating, air knife coating, cutting coating, ink-jet method, a spin coating method, and Langmuir-Blodgett (LB) method. In the present invention, it is more preferred to use a casting method, a spin coating method or an inkjet method. In accordance with such processes, it is possible to produce a film, such an organic semiconductor film, which has a smooth surface and larger area at a low cost.

(Coating Condition)

When forming a film on a substrate, the material forming a film may be dissolved and/or dispersed in suitable organic solvents (for example, hydrocarbon solvents such as hexane, octane, decane, toluene, xylene, ethylbenzene, 1-methylnaphthalene, or 1,2-dichlorobenzene; ketone solvents such as acetone, methyl ethyl ketone, methyl isobutyl ketone, cyclohexanone; halogenated hydrocarbon solvents such as dichloromethane, chloroform, tetrachloromethane, dichloroethane, trichloroethane, tetrachloroethane, chloro benzene, dichlorobenzene, or chlorotoluene; ester solvents such as ethyl acetate, butyl acetate, or amyl acetate; for example, alcohol solvents such as methanol, propanol, butanol, pentanol, hexanol, cyclohexanol, methyl cellosolve, ethyl cellosolve, or ethylene glycol; ether solvents such as dibutyl ether, tetrahydrofuran, dioxane, or anisole; and polar solvents such as N,N-dimethylformamide, N,N-dimethylacetamide, 1-methyl-2-pyrrolidone, 1-methyl-2-imidazolidinone, or dimethyl sulfoxide) and/or water to obtain a coating solution. As such, it is possible to form a thin film by various coating methods.

The concentration of the organic semiconductors used in the present invention in the coating solution is preferably from 0.1 to 80% by mass and more preferably from 0.1 to 10% by mass. According to this, it is possible to form the film having any thickness.

It is also possible to use a resin binder during the film formation. In this case, the material for forming a film and the binder resin may be dissolved or dispersed in the above-mentioned suitable solvents to obtain a coating solution, thus forming a thin film by various coating methods. Examples of the resin binder may include insulating polymers such as polystyrene, polycarbonate, polyacrylate, polyester, polyamide, polyimide, polyurethane, polysiloxane, polysulfone, polymethylmethacrylate, polymethylacrylate, cellulose, polyethylene, or polypropylene, and copolymers thereof, photoconductive polymers such as polyvinyl carbazole or polysilane, conductive polymers such as polythiophene, polypyrrole, polyaniline, or poly-p-phenylene vinylene, and the like. The resin binder may be composed of one of the above resins or a combination of two or more. Taking into consideration the mechanical strength of the thin film, a resin binder having a high glass transition temperature is preferred. Taking into consideration the charge mobility, a resin binder whose structure does not contain a polar group, photoconductive polymer or conductive polymers is preferred.

It is preferred to not use the resin binder in view of the characteristics of the organic semiconductor, but it may also be used depending on the purpose. In this case, the amount of the resin binder is not particularly limited, but it is preferred that it be used in the amount of 0.1 to 30% by mass in the film, such as an organic semiconductor film.

Individual or combined semiconductor materials or a mixed solution containing additives may be used as a coating depending on the desired application to make a blend film composed of a plurality of material species. For example, when manufacturing a photoelectric conversion layer, it is preferred to use a mixed solution with a separate semiconductor material.

The p-type semiconductor materials which may be used herein, may be any organic semiconductor materials or inorganic semiconductor materials as long as they has a hole transport property, but is preferably p-type π-conjugated polymers (for example, substituted or unsubstituted polythiophenes (for example, poly(3-hexylthiophene) (P3HT), etc.), polyselenophene, polypyrrole, polyparaphenylene, polyparaphenylene vinylene, polythiophene vinylene, polyaniline, etc.), fused polycyclic compounds (for example, substituted or unsubstituted anthracene, tetracene, pentacene, anthradithiophene, hexabenzocoronene, etc.), triarylamine compounds (for example, m-MTDATA, 2-TNATA, NPD, TPD, mCP, CBP, etc.), 5-membered heterocyclic compounds (for example, substituted or unsubstituted oligothiophene, TTF, etc.), phthalocyanine compounds (substituted or unsubstituted various central metals of phthalocyanine, naphthalocyanine, anthracyanine, tetrapyrazinoporphyrazine), porphyrin compounds (substituted or unsubstituted various central metals of porphyrin), carbon nanotubes, carbon nanotubes modified with semiconductor polymers, or grapheme, more preferably p-type π-conjugated polymers, fused polycyclic compounds, triarylamine compounds, five-membered heterocyclic compounds, phthalocyanine compounds, or porphyrin compounds, and still more preferably p-type π-conjugated polymers.

The n-type semiconductor materials which may be used in a semiconductor material, may be any organic semiconductor materials or inorganic semiconductor materials as long as they has a hole transport property, but is preferably fullerene compounds, electron-deficient phthalocyanine compounds, naphthalene tetracarbonyl compounds, perylene tetracarbonyl compounds, TCNQ compounds, n-type π-conjugated polymers, or n-type inorganic semiconductors, more preferably fullerene compounds, electron-deficient phthalocyanine compounds, naphthalene tetracarbonyl compounds, perylene tetracarbonyl compounds, or π-conjugated polymer, and still more preferably fullerene compounds or π-conjugated polymers. In the present invention, the fullerene compound refers to a substituted or unsubstituted fullerene, and the fullerene may be any of $C_{60}$, $C_{70}$, $C_{76}$, $C_{78}$, $C_{80}$, $C_{82}$, $C_{84}$, $C_{86}$, $C_{88}$, $C_{90}$, $C_{96}$, $C_{110}$, $C_{180}$, $C_{240}$, $C_{540}$ and the like, but is preferably substituted or unsubstituted $C_{60}$, $C_{70}$, $C_{86}$, and particularly preferably PCBM ([6,6]-phenyl-$C_{61}$-butyric acid methyl ester) and analogs thereof (in which $C_{60}$ moiety is substituted with $C_{70}$, $C_{86}$, etc., in which the benzene ring of the substituent is substituted with other aromatic ring or heterocyclic ring, or in which methyl ester is substituted with n-butyl ester, i-butyl ester, etc.). The electron-deficient phthalocyanines are phthalocyanine of various central metals to which four or more electron withdrawing groups are bound ($F_{16}MPc$, FPc-S8, etc), naphthalocyanine, anthracyanine, substituted or unsubstituted tetrapyrazinoporphyrazine and the like. The naphthalene tetracarbonyl compounds may be any compounds, but is preferably naphthalene tetracarboxylic acid anhydride (NTCDA), naphthalene bisimide compounds (NTCDI), perinone pigments (Pigment Orange 43, Pigment Red 194, etc.). The perylene tetracarbonyl compounds may be any of the compounds, but is preferably perylene tetracarboxylic acid anhydride (PTCDA), perylene bisimide compound (PTCDI), benzimidazole condensed rings (PV). The TCNQ compounds include substituted or unsubstituted TCNQ, and those in which the benzene ring portion of TCNQ is replaced with another aromatic ring or heterocyclic ring, for example, TCNQ, TCAQ, TCN3T and the like, and further include grapheme. Particularly preferred examples of the n-type organic semiconductor materials are shown below.

Further, R in the formulae may be any one, but is preferably a hydrogen atom, a substituted or unsubstituted, branched or straight alkyl group (having preferably, 1 to 18 carbon atoms, more preferably 1 to 12 carbon atoms, and most preferably 1 to 8 carbon atoms), or a substituted or unsubstituted aryl group (having preferably, 6 to 30 carbon atoms, more preferably 6 to 20, and still more preferably 6 to 14 carbon atoms).

[Chem. 1]

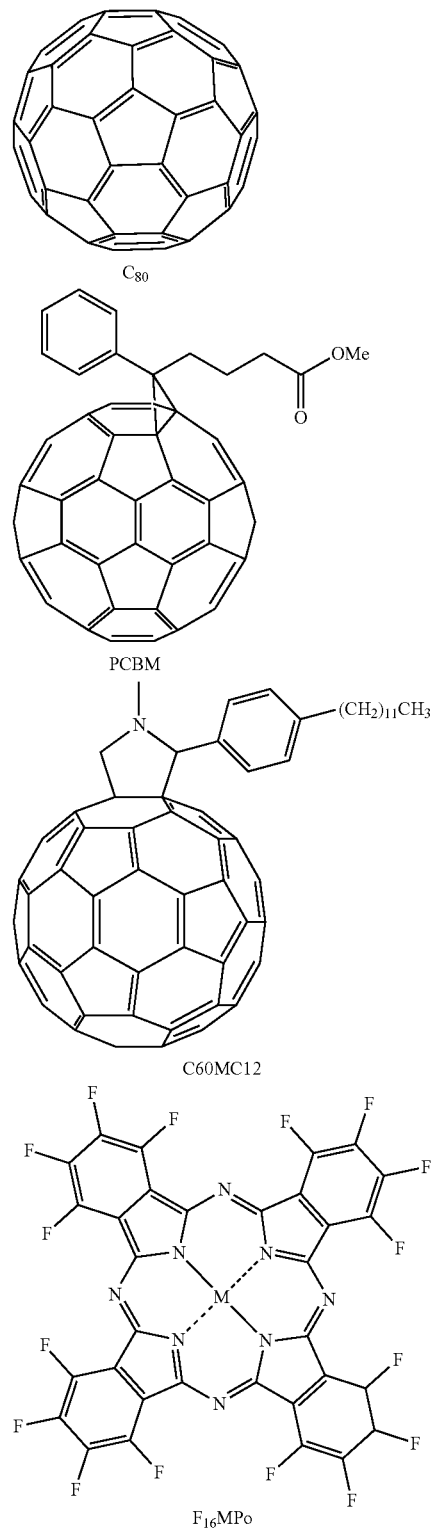

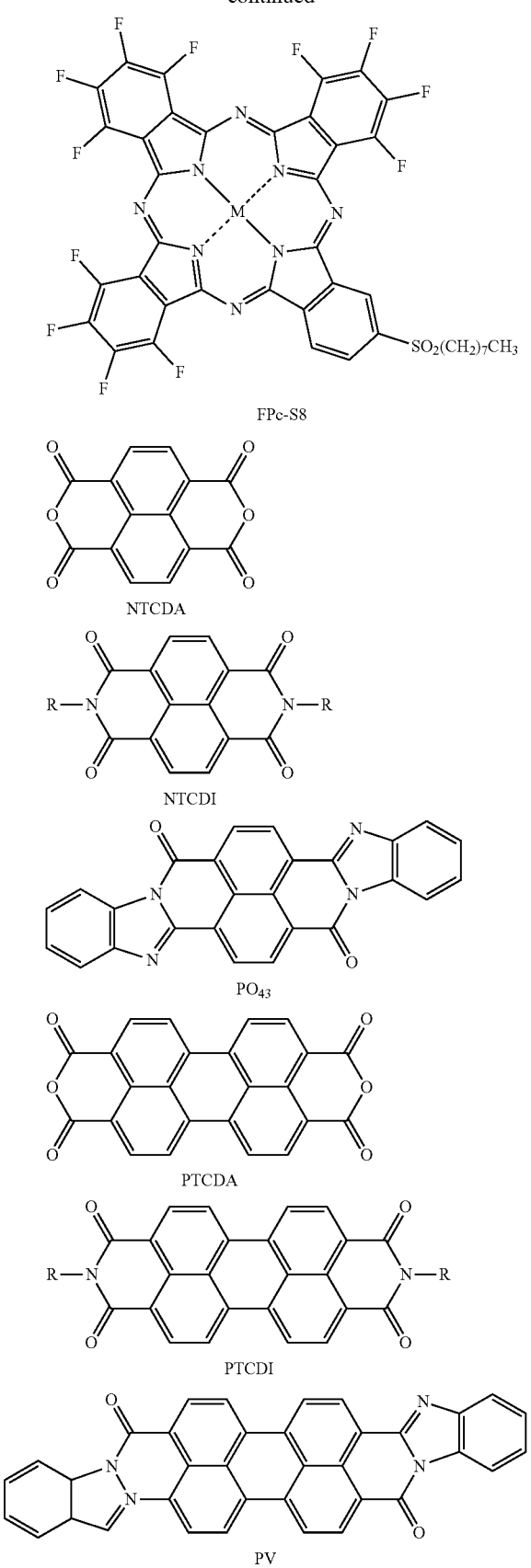

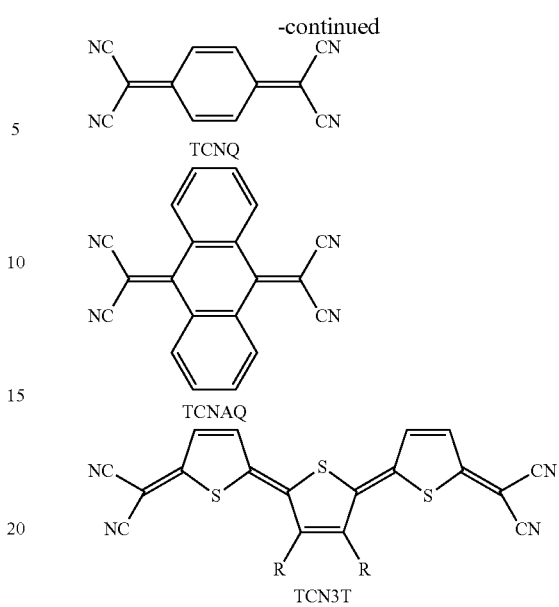

Further, during the film formation, the substrate may be heated or cooled, so that the temperature of the substrate may be changed to control the packing of molecules in the film quality and film. The temperature of the substrate is, but is not particularly limited to, preferably −200° C. to 400° C., more preferably from −100° C. to 300° C. and still more preferably 0° C. to 200° C.

(Organic Semiconductor)

The organic semiconductor according to the present invention is an organic material that exhibits the characteristics of a semiconductor. Similarly to the semiconductor made of an inorganic material, there is a p-type organic semiconductor that conducts positively-charged holes as carriers, and an n-type organic semiconductor that conducts electrons as carriers. Flowability of the carrier in the organic semiconductor is represented by the carrier mobility μ. Depending on the application, the mobility is generally better if it is high, preferably more than $10^{-7}$ cm$^2$/Vs, more preferably more than $10^{-6}$ cm$^2$/Vs and still more preferably $10^{-5}$ cm$^2$Vs. The mobility may be determined by the characteristics or time-of-flight measurement (TOF) method when preparing a field effect transistor (FET) device.

(Post-Treatment of Organic Semiconductor Film)

The formed organic semiconductor film can adjust the characteristics by post-treatment. For example, it is possible to improve the characteristics by changing the packing of molecules in morphology or film upon exposure to heat treatment or solvent vapor, and further to expose to an oxidizing or reducing gas or solvent, a material, etc., or to cause oxidation or reduction reaction by mixing them, or to adjust the carrier density in the film.

(Film Thickness)

The thickness of the organic semiconductor film differs depending on the type of an electronic device used, but it is preferably from 5 nm to 50 μm, more preferably from 10 nm to 5 μm, and still more preferably from 20 nm to 500 nm but not particularly limited thereto.

In order to protect a substrate or a film formed on the substrate, the resin composition of the present invention is used for the formation of a protective film which is formed on the substrate or the film formed on the substrate (preferably organic semiconductor). The resin composition of the present invention also contains a resin composition containing two or more resins in which their main chain structures having a hydroxyl group are different, surfactants and water.

(Two or More Resins in which their Main Chain Structures Having a Hydroxyl Group are Different)

In the present invention, the "two or more resins in which their main chain structures having a hydroxyl group are different" refers to two or more kinds of resins in which each of the resins has a main chain structures having a hydroxyl group, but their main chain structures having a hydroxyl group are different from each other.

In the present invention, for the two or more kinds of resins in which their main structures having a hydroxyl group are different, it is preferred to select and use two or more kinds of various hydrophilic polymers. Examples thereof include water-soluble polysaccharides [water-soluble cellulose (methyl cellulose, hydroxyethyl cellulose, hydroxypropyl cellulose, hydroxyethyl methyl cellulose, hydroxypropyl methyl cellulose, carboxymethyl cellulose sodium salt, carboxymethyl cellulose ammonium salt, etc), pullulan, starch, hydroxypropyl starch, carboxymethyl starch, chitosan, cyclodextrin], polyvinyl alcohol and the like. It is possible to select and use two or more kinds of resins having different main chain structures from those.

In the present invention, it is preferred that the two or more kinds of resins contain polyvinyl alcohols and polysaccharides.

The content of the polysaccharides is preferably 60% by mass or more and more preferably 70% by mass or more, based on the total mass of the two or more kinds of resins.

The polysaccharide is preferably pullulan or water-soluble cellulose.

The water-soluble cellulose is preferably water-soluble etherified cellulose (methyl cellulose, hydroxyethyl cellulose, hydroxypropyl cellulose, hydroxyethylmethyl cellulose, hydroxypropylmethyl cellulose, etc.).

In the present invention, the polyvinyl alcohols may include polyvinyl alcohols, and partial esters thereof, ethers, and acetals, or polyvinyl alcohol containing a substantial amount of unsubstituted vinyl alcohol units which are allowed for them to have essential water solubility. The polyvinyl alcohol may include, for example, those which are 71 to 100% hydrolyzed and have the polymerization degree in the range of 300 to 2,400. Specifically, the polyvinyl alcohols may include those manufactured by Kuraray, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-220, PVA-224, PVA-217EE, PVA-217E, PVA-220E, PVA-224E, PVA-405, PVA-420, PVA-613, L-8, and the like.

Moreover, 88 to 100% hydrolyzed polyvinyl acetate chloroacetate or propionate, polyvinyl formal and polyvinyl acetal and copolymers thereof, those in which polyvinyl alcohol is cation-modified by a quaternary ammonium salt, and those in which polyvinyl alcohol is anion-modified by sodium sulfonate, and the like may be illustrated.

The weight average molecular weight of each of two or more resins in which their main-chain structures having a hydroxyl group are different, is preferably from 500 to 400,000, more preferably from 2,000 to 300,000, more preferably 3,000 to 200,000, in terms of polystyrene by a gel permeation chromatography (GPC).

The polydispersity (molecular weight distribution) is in a range of usually from 1.0 to 3.0 and preferably from 1.0 to 2.6.

The resin composition of the present invention may further comprise an organic solvent capable of dissolving in water.

The organic solvent capable of dissolving in water may include alkylene glycol monoalkyl ethers, alkyl lactates, alcohols such as methanol, ethanol, 4-methyl-2-pentanols, ketones such as acetone, preferably, propylene glycol monomethyl ether (POME, also called 1-methoxy-2-propanol), dipropylene glycol monomethyl ether, and more preferably dipropylene glycol monomethyl ether.

The content of an organic solvent capable of dissolving in water in the mixed solvent is preferably 0.1 to 10% by mass, and more preferably 0.1 to 3% by mass from the viewpoint of coating uniformity.

The resin composition for forming the protective film according to the present invention preferably contains surfactants or emulsifiers to further improve the coatability.

As the surfactant, any of nonionic, anionic, amphoteric fluorine, etc., may be used as long as it lowers the surface tension.

Examples of the surfactant include nonionic surfactants, for example, polyoxyethylene alkyl ethers such as polyoxyethylene lauryl ether, polyoxyethylene cetyl ether, polyoxyethylene stearyl ether, polyoxyethylene alkyl ethers such as polyoxyethylene octyl phenyl ether, polyoxyethylene nonyl phenyl ether, polyoxyethylene alkyl esters such as polyoxyethylene stearate, sorbitan alkyl esters such as sorbitan monolaurate, sorbitan monostearate, sorbitan distearate, sorbitan monooleate, sorbitan sesquioleate, sorbitan trioleate, monoglyceride alkylesters such as glycerol monostearate, gycerolmonooleate; aninionic surfactants, for example, alkylbenzene sulfonates such as sodium dodecyl benzene sulfonate, alkyl naphthalene sulfonic acid salts such as sodium butyl naphthalene sulfonate, sodium pentyl naphthalene sulfonate, sodium hexyl naphthalene sulfonate, sodium octyl naphthalene sulfonate, alkyl sulfates such as sodium lauryl sulfate, alkyl sulfuric acid salts such as sodium dodecyl sulfate, sulfosuccinate ester salts such as sodium dilauryl sulfosuccinate; and amphoteric surfactants, for example, alkyl betaines such as lauryl betaine, stearyl betaine, amino acids and the like. Particularly preferred are anionic surfactants such as alkyl naphthalene sulfonic acid salts, alkyl betaines, and nonionic surfactants having a polyoxyalkylene ether group represented by the following Formula (1):

$$R^1-O-(R^2-O)_nH \qquad (1)$$

In Formula (1), $R^1$ represents an alkyl group having 3 to 15 carbon atoms which may have a substituent, an aromatic hydrocarbon group having 6 to 15 carbon atoms which may have a substituent, or a heteroaromatic ring group having 4 to 15 carbon atoms which may have a substituent (the substituent includes an alkyl group having 1 to 20 carbon atoms, halogen atoms such as Br, Cl, I, an aromatic hydrocarbon group having 6 to 15 carbon atoms, an aralkyl group having 7 to 17 carbon atoms, an alkoxy group having 1 to 20 carbon atoms, an alkoxy carbonyl group having 2 to 20 carbon atoms, an acyl group having 2 to 15 carbon atoms), $R^2$ represents an alkylene group having 1 to 10 carbon atoms which may have a substituent (the substituent includes an alkyl group having 1 to 20 carbon atoms, an aromatic hydrocarbon group having 6 to 15 carbon atoms), and n represents an integer of 1 to 100. Also the moiety of $(R^2-O)n$ in Formula (1) may be two or three groups if it is within the above-mentioned range. Specifically, it includes those in which combinations of ethylene oxy group and propylene oxy group, ethylene oxy group and isopropyl oxy group, ethylene oxy group and butylene oxy group, and ethylene oxy group and isobutylene group, and the like, are connected in random or block forms. Furthermore, the added amount of the surfactants is preferably from 0.2 to 8% by mass, more preferably from 0.5 to 5% by mass, and most preferably from 1 to 3% by mass with respect to the entire protective layer.

These surfactants may be used alone or in combination of two or more.

As the emulsifier, specifically, the compound represented by the following formula (2) may be preferably used.

$$C_nH_{2n+1}O\text{—}(CH_2CH_2O)_mH \quad (2)$$

In Formula (2), n represents an integer from 5 to 25, and m represents an integer from 3 to 40.

Preferred examples of the compound having a structure represented by Formula (2) may include commercially available products such as BL-9EX (n=12, m=9), MYL-10 (n=11, m=10), EMALEX 710 (n=12, m=10), BC15-TX (n=16, m=15).

Furthermore, commercially available products manufactured by Nihon Emulsion Co., Ltd. called EMALEX 100 series, EMALEX 300 series, EMALEX 600 series, and EMALEX700 series may be used.

Further, the added amount of the emulsifier is preferably from 0.2 to 8% by mass, more preferably from 0.5 to 5% by mass, and most preferably from 1 to 3% by mass with respect to the entire protective layer.

These emulsifiers may be used alone or in combination of two or more.

The solid content concentration of the resin composition according to the present invention is preferably from 0.5 to 30% by mass, more preferably from 1.0 to 20% by mass, and most preferably 2.0 to 14% by mass. When the solid content concentration is within the range, the resin composition may be uniformly coated.

The solid content concentration refers to a weight percentage of the weight of the components except the solvent, based on the total weight of the resin composition.

The protective film according to the present invention has preferably a thickness of 20 nm to 5 μm, and more preferably a thickness of 100 nm to 1 μm. The solid content concentration in the resin composition is allowed to set to an appropriate range to impart a suitable viscosity and improve a coatability and film formability, thereby leading to such a film thickness.

In the step (3) of the pattern forming method according to the present invention, the developer used is preferably a developer containing at least one organic solvent selected from the group consisting of an ester-based solvent, a ketone-based solvent, an alcohol-based solvent, an amide-based solvent, an ether-based solvent, and a hydrocarbon-based solvent.

The pattern forming method according to the present invention may further include preferably the step of washing with a rinsing solution containing an organic solvent.

The rinsing solution may be preferably a rinsing liquid containing at least one organic solvent selected from the group consisting of a hydrocarbon-based solvent, a ketone-based solvent, an ester-based solvent, an alcohol-based solvent, an amide-based solvent and an ether-based solvent.

In the step (3) of the pattern forming method according to the present invention, the resist film is a film formed by coating the actinic ray-sensitive or radiation-sensitive resin composition (I) or (II).

The actinic ray-sensitive or radiation-sensitive resin composition (I) or (II) which may be used in the step (3) of the pattern forming method according to the present invention is described below.

The actinic ray-sensitive or radiation-sensitive resin composition (I) or (II) according to the present invention is used for negative type development (development in which solubility of the developer is decreased upon exposure, the exposed portion is remained as a pattern, and the unexposed portion is removed). That is, the actinic ray-sensitive or radiation-sensitive resin composition (I) or (II) according to the present invention may be the actinic ray-sensitive or radiation-sensitive resin composition for an organic solvent used in the development by a developer containing an organic solvent. Here, the organic solvent for development means at least, that applied to a step of developing by using a developer containing an organic solvent.

The actinic ray-sensitive or radiation-sensitive resin composition (I) or (II) according to the present invention is typically a resist composition, the negative type resist composition (i.e., a resist composition for development of organic solvent) is preferred because it can obtain a particularly high effect. The actinic ray-sensitive or radiation-sensitive resin composition (I) or (II) according to the present invention is typically a chemical amplification resist composition.

[1] Resin Capable of Increasing a Polarity by an Action of an Acid to Decrease the Solubility to the Developer Containing an Organic Solvent The actinic ray-sensitive or radiation-sensitive resin composition (I) according to the present invention contains a resin capable of increasing the polarity by the action of an acid to decrease the solubility to the developer containing an organic solvent.

The resin (hereinafter, called "acid-decomposable resin" or "resin (A)") capable of increasing the polarity by the action of an acid to decrease the solubility of the developer containing an organic solvent, which is used for the actinic ray-sensitive or radiation-sensitive resin composition (I) according to the present invention, is a resin having structures in which a polar group is protected with a leaving group capable of decomposing and leaving by the action of an acid.

The resin (A) may include, for example, a resin having an acid-decomposable group to the main chain or side chain of the resin, or both the main chain and side chain of the resin.

[Acid-decomposable Group]

The acid-decomposable group has preferably a structure in which a polar group is protected by a group capable of decomposing and leaving by the action of an acid.

The polar group is not particularly limited as long as it is hardly soluble or insoluble radicals in a developer containing an organic solvent, but it may include a carboxyl group, an acidic group such as a sulfonic acid group (a group capable of leaving in 2.38% by mass of tetramethylammonium hydroxide aqueous solution, used as the developer for a conventional resist), a hydroxyl group (alcoholic hydroxyl group, phenolic hydroxyl group, etc.).

Furthermore, the alcoholic hydroxyl group is a hydroxyl group bonded to a hydrocarbon group and refers to a hydroxyl group other than the hydroxyl group bonded directly to an aromatic ring (phenolic hydroxyl group). Preferably, aliphatic alcohols substituted by an electron attracting group (e.g., a fluorinated alcohol group (such as hexafluoroisopropanol group) at a position as an acid group shall be excluded. The alcoholic hydroxyl group is preferably a hydroxyl group having pKa of 12 or more and 20 or less.

Preferred groups as the acid-decomposable group are a group wherein hydrogen atoms of these groups are substituted with an acid-leaving group.

Examples of the acid-leaving group may include —C($R_{36}$)($R_{37}$)($R_{38}$), —C($R_{36}$)($R_{37}$)($OR_{39}$), —C($R_{01}$)($R_{02}$)($OR_{39}$) and the like.

In the above general Formula, each of $R_{36}$ to $R_{39}$ independently represents an alkyl group, a cycloalkyl group, an aryl group, an aralkyl group or an alkenyl group. $R_{36}$ and $R_{37}$ may be bonded together to form a ring.

Each of $R_{01}$ and $R_{02}$ independently represents a hydrogen atom, an alkyl group, a cycloalkyl group, an aryl group, an aralkyl group or an alkenyl group.

The alkyl group of $R_{36}$ to $R_{39}$, $R_{01}$ and $R_{02}$ is preferably an alkyl group having 1 to 8 carbon atoms. Examples thereof may include a methyl group, an ethyl group, a propyl group, a n-butyl group, a sec-butyl group, a hexyl group, an octyl group or the like.

The cycloalkyl group of $R_{36}$ to $R_{39}$, $R_{01}$ and $R_{02}$ may be a monocyclic type or a polycyclic type. The monocyclic type is preferably a cycloalkyl group having 3 to 8 carbon atoms. Examples thereof may include a cyclopropyl group, a cyclobutyl group, a cyclopentyl group, a cyclohexyl group, a cyclooctyl group and the like. The polycyclic type is preferably a cycloalkyl group having 6 to 20 carbon atoms. Examples thereof include an adamantyl group, a norbornyl group, an isobornyl group, a camphanyl group, a dicyclopentyl group, an α-pinel group, a tricyclodecanyl group, a tetracyclododecyl groups, an androstanyl group and the like. In addition, at least one carbon atom in the cycloalkyl group may be substituted with a heteroatom such as an oxygen atom.

The aryl group of $R_{36}$ to $R_{39}$, $R_{01}$ and $R_{02}$ is preferably an aryl group having 6 to 10 carbon atoms. Examples thereof may include a phenyl group, a naphthyl group, an anthryl group and the like.

The aralkyl group of $R_{36}$ to $R_{39}$, $R_{01}$ and $R_{02}$ is preferably an aralkyl group having 7 to 12 carbon atoms. Examples thereof may include a benzyl group, a phenethyl group, a naphthylmethyl group and the like.

The alkenyl group of $R_{36}$ to $R_{39}$, $R_{01}$ and $R_{02}$ is preferably an alkenyl group having 2 to 8 carbon atoms. Examples thereof may include a vinyl group, an allyl group, a butenyl group, a cyclohexenyl group and the like.

The ring which is formed by a bonding of $R_{36}$ and $R_{37}$ is preferably a cycloalkyl group (monocyclic or polycyclic). The cycloalkyl group is preferably a cyclopentyl group, a monocycle cycloalkyl group such as a cyclohexyl group, a norbornyl group, a tetracyclodecanyl group, a tetracyclododecanyl group, and a polycyclic cycloalkyl group such as an adamantyl group, more preferably a monocycle cycloalkyl group having 5 to 6 carbon atoms, and particularly preferably a monocyclic cycloalkyl group having 5 carbon atoms.

[Repeating Unit Having an Acid-decomposable Group]

The repeating unit having an acid-decomposable group in the resin (A) is preferably a repeating unit represented by the following Formula (III).

[Chem. 2]

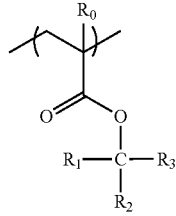

(III)

In the Formula (III), $R_0$ represents a hydrogen atom or a straight or branched alkyl group.

Each of $R_1$ to $R_3$ independently represents a straight or branched alkyl group, or a monocycle or polycyclic cycloalkyl group.

Two of $R_1$ to $R_3$ may be bonded to form a monocycle or polycyclic cycloalkyl group.

The straight or branched alkyl group for $R_0$ may have a substituent and is preferably a straight or branched alkyl group having 1 to 4 carbon atoms. Examples thereof may include a methyl group, an ethyl group, a n-propyl group, an isopropyl group, a n-butyl group, an isobutyl group, a t-butyl group and the like. The substituent group may include a hydroxyl group, a halogen atom (e.g., a fluorine atom), and the like.

$R_0$ is preferably a hydrogen atom, a methyl group, a trifluoromethyl group or a hydroxymethyl group.

The alkyl group represented by $R_1$ to $R_3$ is preferably those having 1 to 4 carbon atoms, such as a methyl group, an ethyl group, a n-propyl group, an isopropyl group, a n-butyl group, an isobutyl group or a t-butyl group.

The cycloalkyl group represented by $R_1$ to $R_3$ is preferably monocyclic cycloalkyl groups such as a cyclopentyl group or a cyclohexyl group, polycyclic cycloalkyl groups such as a norbornyl group, a tetracyclodecanyl group, a tetracyclododecanyl group or an adamantyl group.

The cycloalkyl group formed by bonding of two of $R_1$ to $R_3$ is preferably monocyclic cycloalkyl groups such as a cyclopentyl group, polycyclic cycloalkyl groups such as a norbornyl group, a tetracyclodecanyl group, a tetracyclododecanyl group, or an adamantyl group. Particularly preferred are monocyclic cycloalkyl groups having 5 or 6 carbon atoms.

In one preferred embodiment, $R_1$ is a methyl group or an ethyl group, and $R_2$ and $R_3$ are bonded to form the cycloalkyl group as described above.

Each group above may have a substituent, and examples of the substituent may include a hydroxyl group, a halogen atom (e.g., fluorine atom), an alkyl group (having 1 to 4 carbon atoms), a cycloalkyl group (having 3 to 8 carbon atoms), an alkoxy group (having 1 to 4 carbon atoms), a carboxyl group, an alkoxycarbonyl group (having 2 to 6 carbon atoms) and the like. Preferred are those having 8 or less carbon atoms.

In a particularly preferred embodiment of the repeating unit represented by Formula (III), each of $R_1$, $R_2$ and $R_3$ independently represents a straight or branched alkyl group.

In this embodiment, straight or branched alkyl groups for $R_1$, $R_2$ and $R_3$ are preferably an alkyl group having 1 to 4 carbon atoms, and examples thereof may include a methyl group, an ethyl group, a n-propyl group, an isopropyl group, a n-butyl group, an isobutyl group, and a tort-butyl group.

$R_1$ is preferably a methyl group, an ethyl group, a n-propyl group, and a n-butyl group, more preferably an methyl group or an ethyl group, and particularly preferably a methyl group.

$R_2$ is preferably a methyl group, an ethyl group, a n-propyl group, an isopropyl group, or a n-butyl group, more preferably a methyl group or an ethyl group, and particularly preferably a methyl group.

$R_3$ is preferably a methyl group, an ethyl group, a n-propyl group, an isopropyl group, a n-butyl group, an isobutyl group, or a tert-butyl group, more preferably a methyl group, an ethyl group, an isopropyl group or an isopropyl group and particularly preferably a methyl group, an ethyl group or an isopropyl group.

Preferred specific embodiments of the repeating unit having the acid-decomposable group are set forth below, but the present invention is not limited thereto.

In the specific embodiments, Rx represents a hydrogen atom, $CH_3$, $CF_3$, or $CH_2OH$. Rxa and Rxb represent an alkyl group having 1 to 4 carbon atoms, respectively. Z represents a substituent; if two or more substituents are present, each Z may be the same as or different from every other Z. p represents 0 or a positive integer. Specific examples and preferred examples of Z are the same as specific examples and preferred examples of the substituent which each group such as $R_1$ to $R_3$ may have.

[Chem. 3]

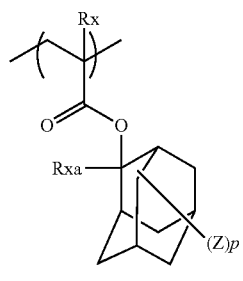
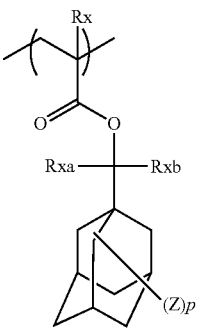
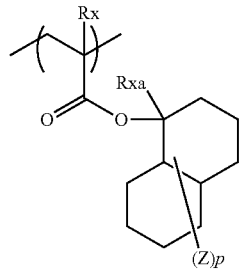
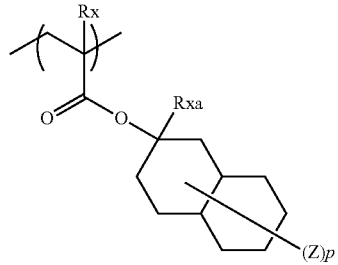
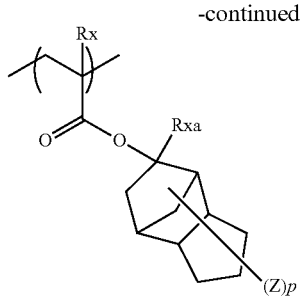
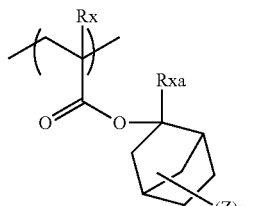
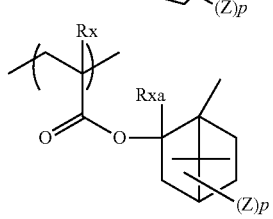
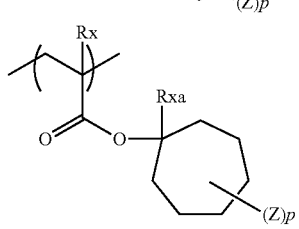
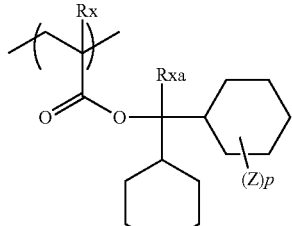
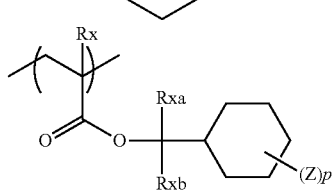
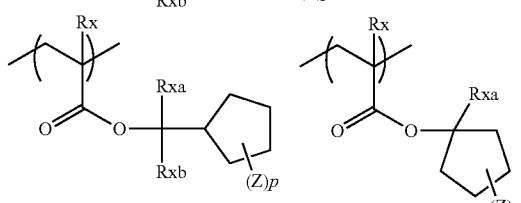
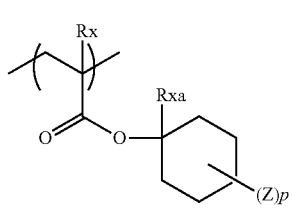

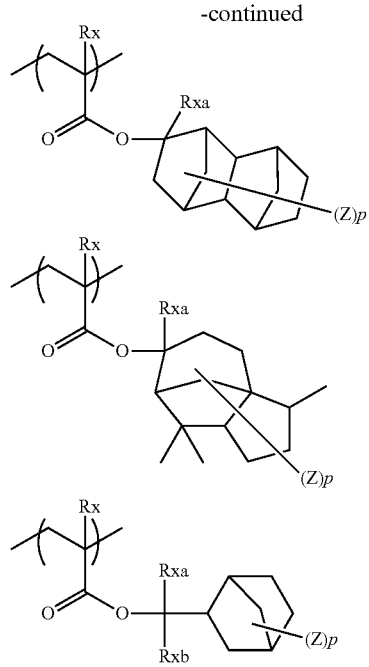
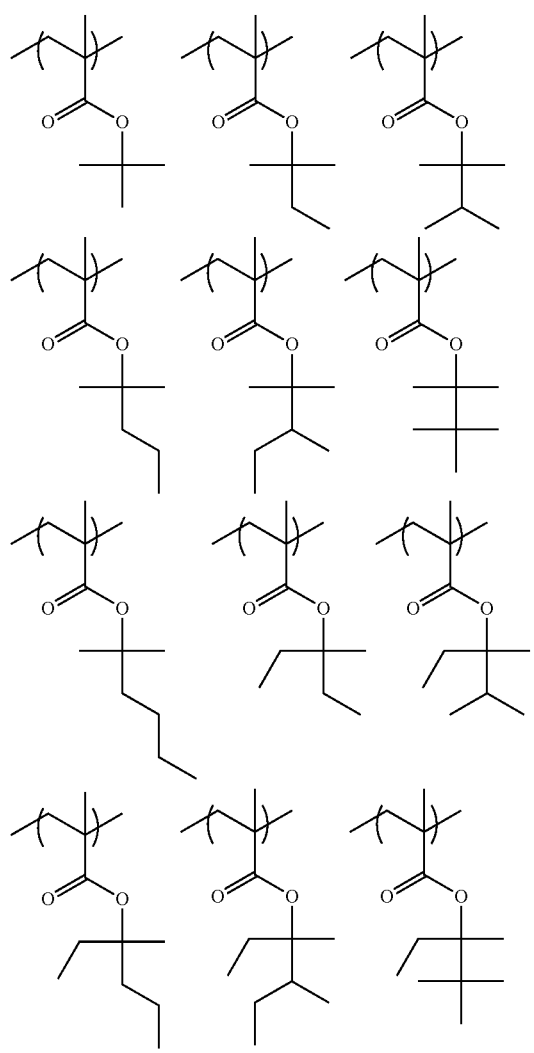
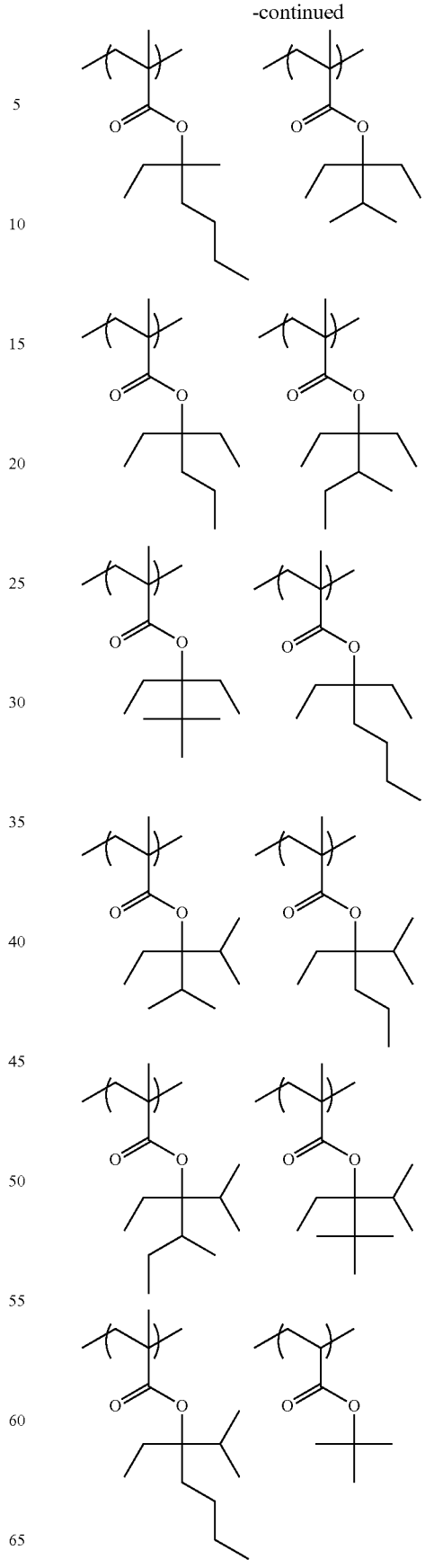

-continued

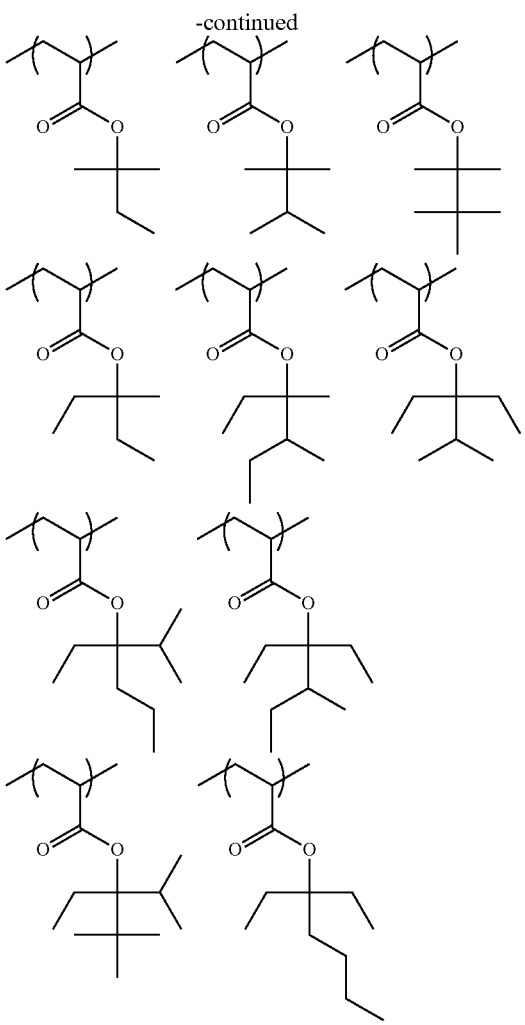

The repeating unit having an acid-decomposable group is preferably a repeating unit having a residue in which a carboxyl group is protected by acetal, or a residue in which a carboxyl group is protected by ketal. Furthermore, the acid-decomposable group is preferably the residue where the carboxy group is protected by acetal or ketal represented by the following Formula (a1-1). In addition, in the case of a residue in which the carboxyl group is protected by acetal or ketal represented by the following Formula (a1-1), the overall residue has a structure of —(C=O)—O—$CR^1R^2$ ($OR^3$).

[Chem. 5]

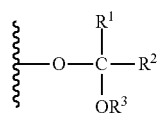

(a1-1)

In Formula (a1-1), each of $R^1$ and $R^2$ independently represents a hydrogen atom or an alkyl group, provided that a case where both $R^1$ and $R^2$ are a hydrogen atom is excluded. $R^3$ represents an alkyl group. $R^1$ or $R^2$ and $R^3$ may be linked to form a cyclic ether.

In Formula (a1-1), each of $R^1$ to $R^3$ independently represents a hydrogen atom or an alkyl group, wherein the alkyl group may be any of straight, branched or cyclic. Here, both $R^1$ and $R^2$ do not represent a hydrogen atom, and at least one of $R^1$ and $R^2$ represents an alkyl group.

In the Formula (a1-1), when $R^1$, $R^2$ and $R^3$ represent an alkyl group, the alkyl group may be any one of straight, branched or cyclic. Examples of the straight or branched alkyl group has preferably 1-12 carbon atoms, more preferably 1 to 6 carbon atoms, and still more preferably 1 to 4 carbon atoms. Specific examples thereof include a methyl group, an ethyl group, a n-propyl group, an i-propyl group, a n-butyl group, an i-butyl group, a sec-butyl group, a t-butyl group, a n-pentyl group, a neopentyl group, a n-hexyl group, a thexyl group (2,3-dimethyl-2-butyl group), a n-heptyl, a n-octyl group, a 2-ethylhexyl group, a n-nonyl group, a n-decyl group and the like.

The cyclic alkyl group has preferably 3 to 12 carbon atoms, more preferably 4 to 8 carbon atoms, and most preferably 4 to 6 carbon atoms. Examples of the cyclic alkyl group may include a cyclopropyl group, a cyclobutyl group, a cyclopentyl group, a cyclohexyl group, a cycloheptyl group, a cyclooctyl group, a norbornyl group, an isobornyl group and the like.

The alkyl group may have a substituent, and examples of the substituent may include a halogen atom, an aryl group, and an alkoxy group. In the case of having a halogen atom as the substituent, $R^1$, $R^2$ and $R^3$ are haloalkyl group. In the case of having an aryl group as the substituent, $R^1$, $R^2$ and $R^3$ are an aralkyl group.

As the halogen atom, a fluorine atom, a chlorine atom, a bromine atom or an iodine atom are exemplified. Among them, fluorine atom or chlorine atom is preferred.

Also, the aryl group is preferably an aryl group having 6 to 20 carbon atoms and more preferably 6 to 12 carbon atoms, and specific examples thereof may include a phenyl group, an α-methylphenyl group, a naphthyl group and the like. Examples of the entire alkyl group substituted with an aryl group, that is, the aralkyl group, may include a benzyl group, an α-methylbenzyl group, a phenethyl group, and a naphthylmethyl group.

The above-described alkoxy group is preferably an alkoxy group having 1 to 6 carbon atoms and more preferably 1 to 4 carbon atoms. More preferred is a methoxy group or an ethoxy group.

Furthermore, when the alkyl group is a cycloalkyl group, the cycloalkyl group may have a straight or branched alkyl group having 1 to 10 carbon atoms as a substituent. When the alkyl group is a straight or branched alkyl group, it may have a cycloalkyl group having 3 to 12 carbon atoms as a substituent.

These substituents may be further substituted with the above-described substituents.

In Formula (a1-1), when $R^1$, $R^2$ and $R^3$ represent an aryl group, the aryl group has preferably 6 to 12 carbon atoms and more preferably 6 to 10 carbon atoms. The aryl group may have a substituent. Examples of the substituent may include an alkyl group having 1 to 6 carbon atoms. Examples of the aryl groups may include a phenyl group, a tolyl group, a silyl group, a cumenyl group, a 1-naphthyl group and the like.

Further, $R^1$, $R^2$ and $R^3$ are bonded to each other to form a ring together with the carbon atom to which they are bonded. Examples of the ring structure in which $R^1$ and $R^2$, $R^1$ and $R^3$, or $R^2$ and $R^3$ are bonded, may include a cyclobutyl group, a cyclopentyl group, a cyclohexyl group, a cycloheptyl group, a tetrahydrofuranyl group, an adamantyl group and a tetrahydropyranyl group.

Further, in the Formula (a1-1), any one of $R^1$ and $R^2$ is preferably a hydrogen atom or a methyl group.

Preferred specific examples of the monomer units (a1-1) having a residue in which the carboxyl group is protected by an acid-decomposable group, may include the following monomer units. Further, R represents a hydrogen atom or a methyl group.

[Chem. 6]

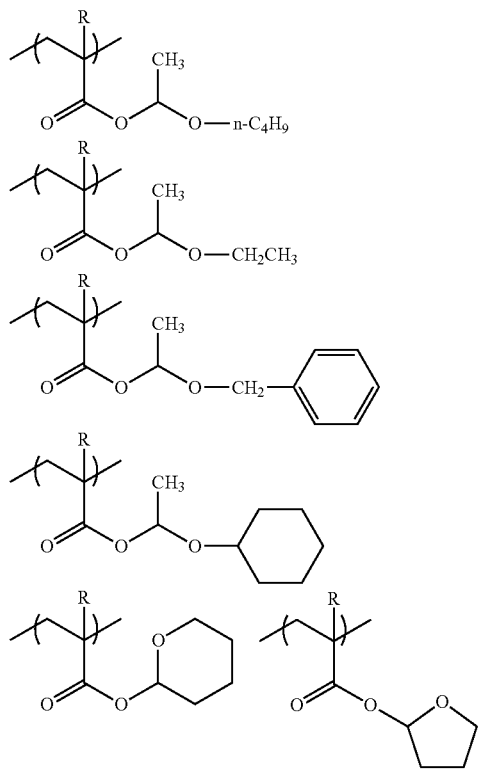

The repeating unit having an acid-decomposable group of the resin (A) may be used either alone or in combination of two or more thereof.

In the resin (A) according to the present invention, the content of the repeating unit having an acid-decomposable group (preferably a repeating unit represented by Formula (III)) (in the case of containing two or more, the sum thereof) is preferably 20 to 90 mol % or more, more preferably 30 to 80 mol %, particularly preferably 40 to 70 mol % and most preferably 40 to 60 mol % with respect to the entire repeating unit in the resin (A), from the viewpoint of sufficiently lowering the solubility to an organic-based developer of the exposed part, while sufficiently maintaining the solubility of the unexposed part and improving the dissolution contrast.

[Repeating Unit Represented by Formula (I)]

In the present invention, a repeating unit represented by the following Formula (I) may be contained with respect to the entire repeating unit in the resin (A).

[Chem. 7]

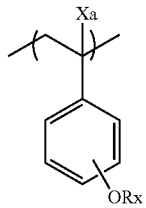

(I)

In Formula (I),

Xa represents a hydrogen atom or a straight or branched alkyl group.

Rx represents a hydrogen atom or a group capable of decomposing and leaving by an action of an acid.

Specific examples and preferred examples of the straight or branched alkyl group for Xa is the same as those described above as specific examples and preferred examples of the straight or branched alkyl groups for $R_0$ in Formula (III).

Specific examples and preferred examples of the group capable of decomposing or leaving by the action of an acid for Rx are the same as those described above as specific examples and preferred examples of the group capable of decomposing and leaving by the action of an acid which protects a polar group constituting the acid-decomposable group in the resin (A).

In the resin (A) according to the present invention, the content of a repeating unit represented by Formula (I) (in the case of containing two or more, the sum thereof) is preferably 30 mol % or less, more preferably not more than 10 mol % or less, particularly preferably 5 mol % or less and ideally 0 mol % with respect to the entire repeating unit in the resin (A), from the viewpoint of sufficiently lowering the solubility to an organic-based developer of the exposed part, while sufficiently keeping the solubility of the unexposed part and improving the dissolution contrast. That is, it is particularly preferred to not contain the repeating unit. If the repeating unit represented by Formula (I) is present in amount of more than 30 mot % with respect to the entire repeating unit in the resin (A), it is over-dissolved in the organic solvent, and resolution and rectangularity of the pattern may not be obtained.

[Repeating Unit Having a Non-phenolic Aromatic Groups Other than the Repeating Unit Represented by Formula (I)]

In the present invention, the resin (A) preferably has a repeating unit having a non-phenolic aromatic group other than the repeating unit represented by Formula (I).

Here, "the repeating unit having a non-phenolic aromatic groups other than the repeating unit represented by Formula (I)" refers to a repeating unit represented by Formula (I), for example, a repeating unit having an aromatic group having a phenolic hydroxyl group, or a repeating unit having an aromatic group having no phenolic hydroxyl group other than a repeating unit having an aromatic group having a group derived from a phenolic hydroxyl group (for example, a group protected with groups capable of decomposing and leaving by an action of a phenolic hydroxyl acid, etc.).

The above-described non-phenolic aromatic group may have a substituent. An aryl group having 6 to 10 carbon atoms is preferred. Examples thereof may include a phenyl group, and a naphthyl group.

The above-described substituent is not particularly limited as long as it is not a phenolic hydroxyl group. Examples thereof may include a straight or branched alkyl group having 1 to 4 carbon atoms, a cycloalkyl group having 3 to 10 carbon atoms, an aryl group having 6 to 10 carbon atoms, a halogen atom such as fluorine atom, a cyano group, an amino group, a nitro group, a carboxyl group and the like. As the above-described substituent, a straight or branched alkyl group having 1 to 4 carbon atoms, a cycloalkyl group having 3 to 10 carbon atoms, an aryl group having 6 to 10 carbon atoms may have a further substituent. Such further substituent may include a halogen atom such as a fluorine atom.

When the non-phenolic aromatic group is a phenyl group and the phenyl group has a substituent, the substituent is preferably substituted at the 4-position of the phenyl group.

The non-phenolic aromatic group is preferably a phenyl group which may have a substituent, from the viewpoint of etching resistance.

In the present invention, the repeating unit having a non-phenolic aromatic group other than the repeating unit represented by Formula (I) is preferably a repeating unit represented by the following Formula (II).

[Chem. 8]

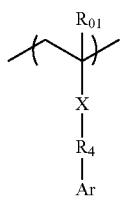

(II)

In Formula (II), $R_{01}$ represents a hydrogen atom or a straight or branched alkyl group.

X represents a single bond or a divalent linking group.

Ar represents a non-phenolic aromatic group.

$R_4$ represents a single bond or an alkylene group.

Specific examples and preferred examples of the straight or branched alkyl groups for $R_{01}$ are the same as those described above as the specific examples and preferred examples of the straight or branched alkyl groups for $R_0$ in Formula (III).

X is preferably a divalent linking group. As this divalent linking group, preferably —COO—, —CONH—, and the like may be exemplified.

Specific examples and preferred examples of the non-phenolic aromatic groups Ar are the same as those described above as the specific examples and preferred examples of the non-phenolic aromatic groups.

The alkylene group for $R_4$ may have a substituent, is preferably an alkylene group having 1 to 4 carbon atoms, and examples thereof may include a methylene group, an ethylene group, a propylene group and the like. Examples of the substituent which may be possessed by the alkylene group for $R_4$ may include an alkyl group having 1 to 4 carbon atoms, a halogen atom such as a fluorine atom, and the like.

A substituent which may be possessed by the alkylene group for $R_4$ and a substituent which may be possessed by the non-phenolic aromatic group Ar may be bonded to form a ring. Example of the group forming a ring may include an alkylene group (for example, an ethylene group, a propylene group).

$R_4$ is preferably a single bond, or a methylene group which may be substituted with a substituent, in terms of appropriate glass transition temperature (Tg) of the resin in the pattern formation.

In the resin (A) according to the present invention, the content of the repeating unit having the non-phenolic aromatic group (preferably, the repeating unit represent by Formula (II)) (in the case of containing two or more, the sum thereof) is preferably more than 10 to 70 mol %, more preferably 20 to 60 mol %, and particularly preferably 30 to 50 mol % with respect to the entire repeating unit in the resin (A), from the viewpoint of sufficiently lowering the solubility to an organic-based developer of the exposed part, while sufficiently maintaining the solubility of the unexposed part and improving the dissolution contrast.

[Other Repeating Units]

The resin (A) may further have a repeating unit having a lactone structure. The repeating unit having a lactone structure is more preferably a repeating unit represented by the following Formula (AII).

[Chem. 9]

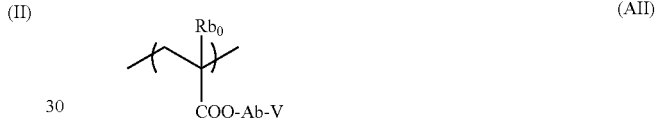

(AII)

In Formula (AII), $Rb_0$ represents a hydrogen atom, a halogen atom or an alkyl group which may have a substituent (preferably 1 to 4 carbon atoms).

The preferred substituent which the alkyl group for $Rb_0$ may have includes a hydroxyl group and a halogen atom. The halogen atom of $Rb_0$ may include a fluorine atom, a chlorine atom, a bromine atom, and an iodine atom. $Rb_0$ is preferably a hydrogen atom, a methyl group, a hydroxymethyl group or a trifluoromethyl group, and particularly preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group of a combination thereof. Ab is preferably a single bond, or a divalent linking group represented by -$Ab_1$-$CO_2$—.

$Ab_1$ is a straight or branched alkylene group, a cycloalkylene group of monocyclic or polycyclic, preferably a methylene group, an ethylene group, a cyclohexylene group, an adamantylene group, or a norbornylene group.

V represents a group having a lactone structure.

The group having a lactone structure may be any type may be used as long as it has a lactone structure, but is preferably a 5- to 7-membered ring lactone structure. In the 5- to 7-membered ring lactone structure, other ring structure is preferably condensed in the form of a bicyclo structure or a spiro structure. Those having a repeating unit having a lactone structure represented by any one of the following Formulae (LC1-1) to (LC1-17) are more preferred. Further, the lactone structure may be bonded directly to the main chain. Preferred lactone structures are (LC1-1), (LC1-4), (LC1-5), (LC1-6), (LC1-8), (LC1-13) and (LC1-14).

[Chem. 10]
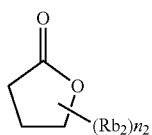 LC1-1
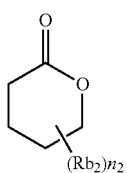 LC1-2
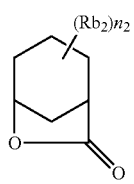 LC1-3
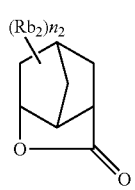 LC1-4
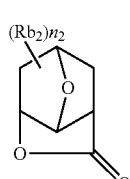 LC1-5
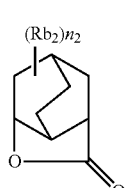 LC1-6
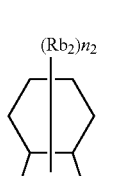 LC1-7
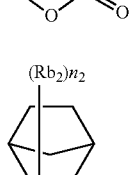 LC1-8
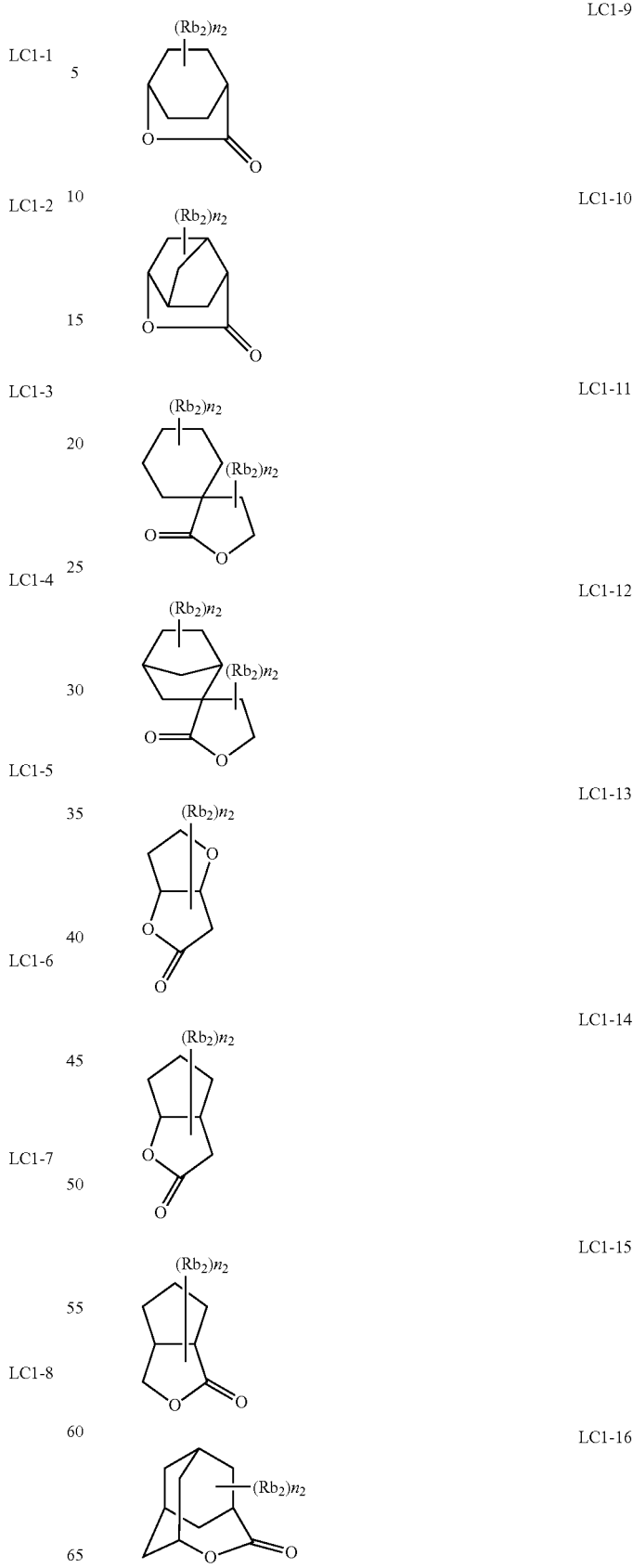

LC1-17

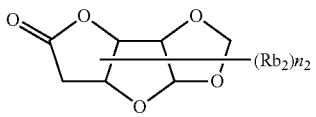

The lactone structure moiety may or may not have a substituent (Rb$_2$). Preferred substituent (Rb$_2$) includes an alkyl group having 1 to 8 carbon atoms, a monovalent cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, an acid-decomposable group and the like. More preferred is an alkyl group having 1 to 4 carbon atoms, a cyano group, or an acid-decomposable group. n$_2$ represents an integer of 0 to 4. When n$_2$ is more than 2, each substituent (Rb$_2$) may be the same as or different from every other substituent (Rb$_2$), and the plurality of substituent (Rb$_2$) may be bonded to each other to form a ring.

The repeating unit having a lactone group is generally present as an optical isomer, but any optical isomers may be used. Further, one optical isomer may be used alone or in combination of a plurality of optical isomers. When one optical isomer is primarily used, its optical purity (cc) is preferably 90% or more, more preferably 95% or more.

The resin (A) may or may not contain a repeating unit having a Intone structure. However, when the resin (A) contains a repeating unit having a lactone structure, the content of the repeating units in the resin (A) is preferably in a range of 0.5 to 50 mol %, more preferably in a range of 1 to 40 mol %, and still more preferably in a range of 3 to 30 mol %. The repeating units may be used either alone or in combination of two or more thereof. Using a specific lactone structure increases the resolution of the pattern and makes the rectangular profile better.

Hereinafter, specific examples of the repeating unit having a lactone structure in the resin (A) are shown, but the present invention is not limited thereto. In the Formula, Rx represents H, CH$_3$, CH$_2$OH, or CF$_3$.

[Chem. 11]

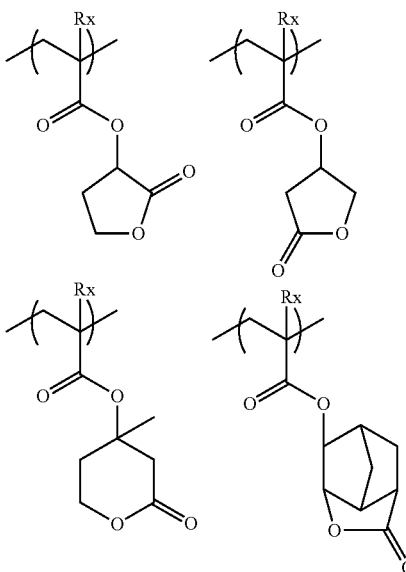

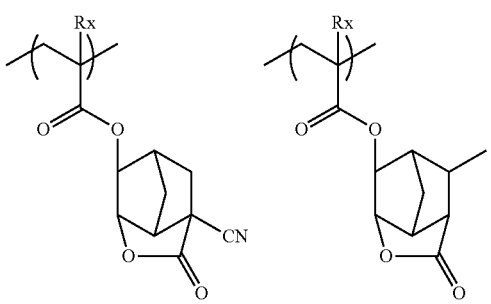

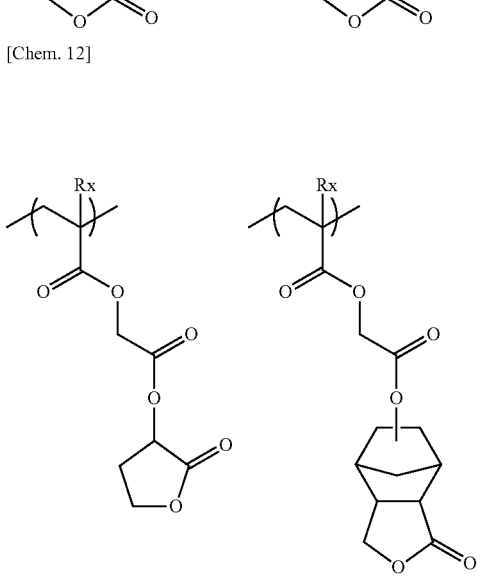

[Chem. 12]

[Chem. 13]

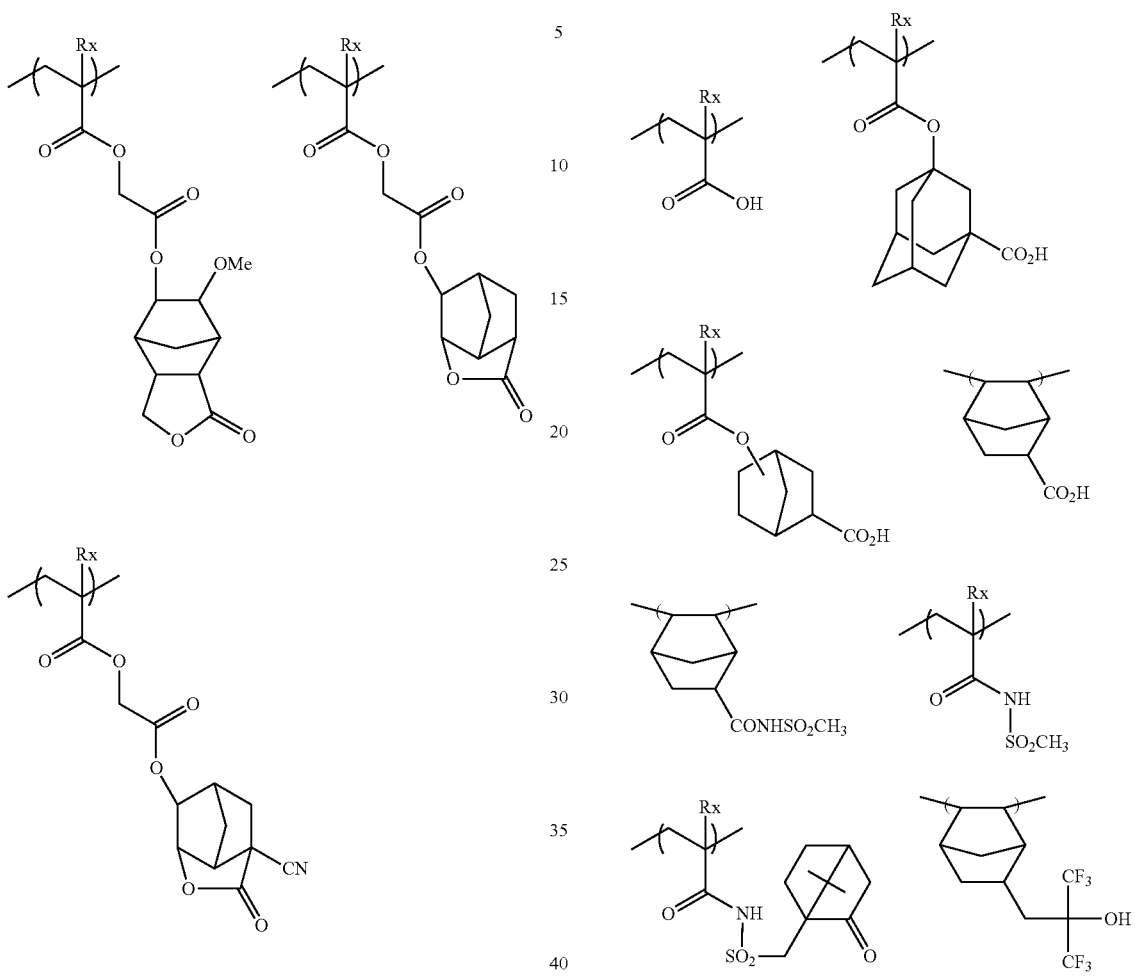

The resin (A) may have a repeating unit having an acid group. Examples of the acid group may include a carboxyl group, a sulfonamide group, a sulfonylimide group, a bis-sulfonyl imide groups, an aliphatic alcohol substituted with an electron withdrawing group at α-position (e.g., hexafluoroisopropanol group). It is more preferred to have a repeating unit having a carboxyl group. The resolution in a contact hole application increases by containing a repeating unit having an acid group. The repeating unit having an acid group is preferably a repeating unit in which an acid group is bonded directly to the main chain of the resin such as a repeating unit by an acrylic acid or a methacrylic acid, or a repeating unit in which an acid group is bonded to the main chain of the resin via a linking group, or those wherein a polymerization initiator or chain transfer agent having an acid group are used upon polymerization and introduced in the terminal of the polymer chain. The linking group may have a monocyclic or polycyclic hydrocarbon structure. Particularly preferred is a repeating unit by an acrylic acid or a methacrylic acid.

Specific examples of the repeating unit having an acid group are shown below, but the present invention is not limited thereto.

In the specific examples, Rx represents H, $CH_3$, $CH_2OH$, or $CF_3$.

-continued

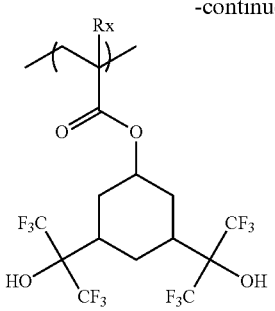

The resin (A) may or may not contain a repeating unit having an acid group. However, when the resin (A) contains a repeating unit having an acid group, the content of the repeating unit is preferably from 1 to 25 mol %, more preferably from 1 to 20 mol %, and still more preferably form 3 to 15 mol %, with respect to the entire repeating unit of the resin (A).

The resin (A) may further have a repeating unit having a hydroxyl group or a cyano group as a repeating unit other than the repeating units described above. This can improve a substrate adhesion or a developer affinity. The repeating unit having a hydroxyl group or a cyano group is preferably a repeating unit having an alicyclic hydrocarbon structure substituted with a hydroxyl group or a cyano group. It is preferred to have no acid-decomposable group. In the alicyclic hydrocarbon structure substituted with a hydroxyl group or a cyano group, the alicyclic hydrocarbon structure is preferably an adamantyl group, a diamantyl group, a norbornane group, and more preferably an adamantyl group. Also, those substituted with a hydroxyl group are preferred. It is more preferred to contain a repeating unit having an adamantyl group substituted with at least one hydroxyl group.

In particular, the resin (A) most preferably contains a repeating unit having a hydroxyl adamantyl group or a dihydroxy adamantyl group, from the viewpoint of suppressing the diffusion of the generated acid. The alicyclic hydrocarbon structure substituted with a hydroxyl group or a cyano group is preferably a partial structure represented by the following Formulae (VIIa) to (VIId), and more preferably a partial structure represented by the following Formula (VIIa).

[Chem. 14]

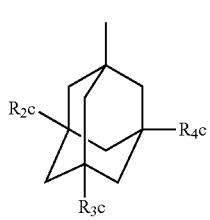

(VIIa)

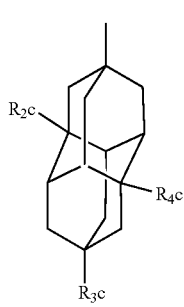

(VIIb)

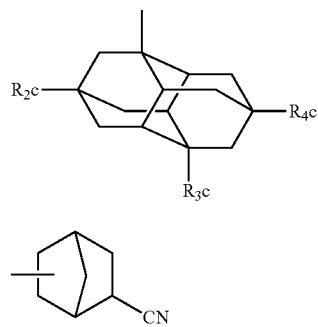

(VIIc)

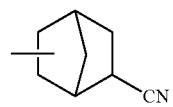

(VIId)

In the Formulae (VIIa) to (VIIc),

Each of $R_{2C}$ to $R_{4C}$ independently represents a hydrogen atom, a hydroxyl group or a cyano group. However, at least one of $R_{2C}$ to $R_{4C}$ represents a hydroxyl group or a cyano group. Preferably, one or two of $R_{2C}$ to $R_{4C}$ is a hydroxyl group and the remainder is a hydrogen atom. In Formula (VIIa), more preferably, two of $R_{2C}$ to $R_{4C}$ is a hydroxyl group and the remainder is a hydrogen atom.

The repeating unit having a partial structure represented by the Formulae (VIIa) to (VIId) may include the repeating units represented by the following Formulae (AIIa) to (AIId).

[Chem. 15]

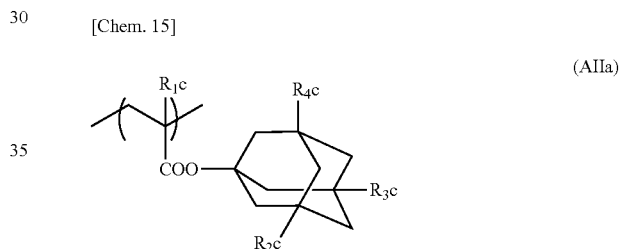

(AIIa)

(AIIb)

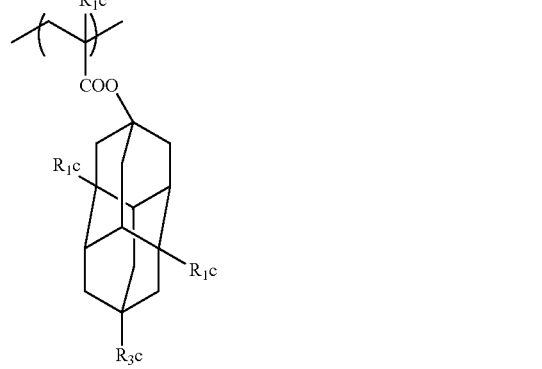

(AIIc)

(AIIc)

-continued (AIId)

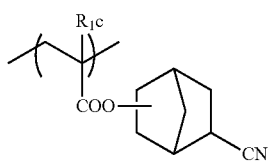

In Formulae (AIIa) to (AIId), $R_{1c}$ represents a hydrogen atom, a methyl group, a trifluoromethyl group or a hydroxymethyl group.

$R_{2C}$ to $R_{4C}$ have the same meaning as $R_{2C}$ to $R_{4C}$ in Formulae (VIIa) to (VIIc).

Specific examples of the repeating unit having a hydroxyl group or a cyano group will be shown below, but the present invention is not limited thereto.

[Chem. 16]

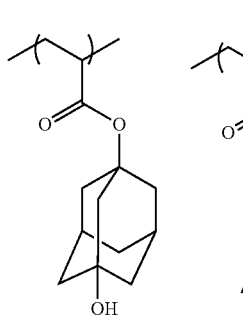
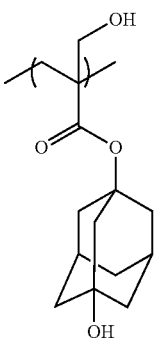
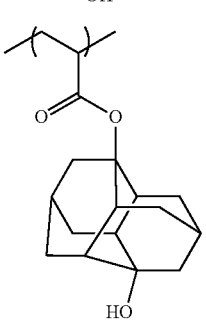
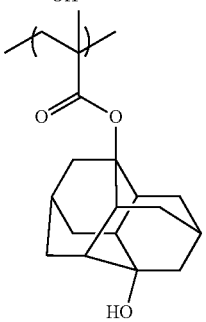

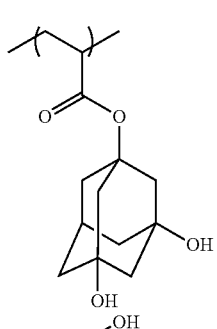
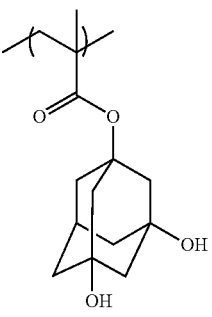

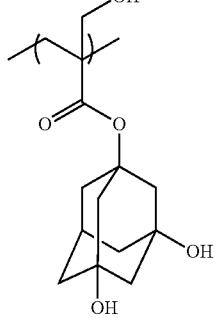
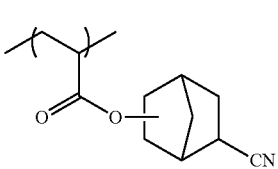

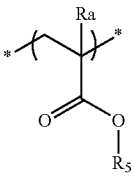

-continued

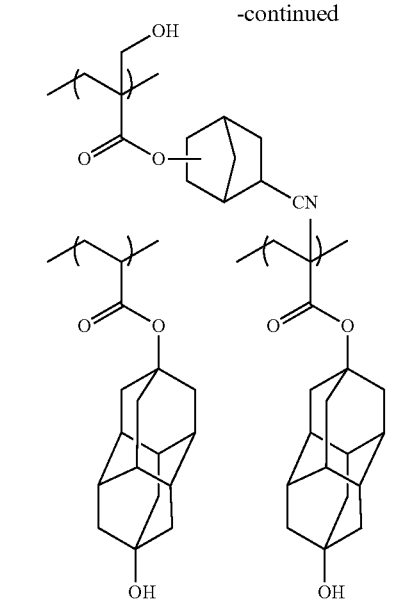

The resin (A) may or may not contain a repeating unit having a hydroxyl group or a cyano group. However, when the resin (A) contains a repeating unit having a hydroxyl group or a cyano group, the content of the repeating unit is preferably from 1 to 40 mol %, more preferably from 1 to 30 mol %, and still more preferably from 3 to 20 mol % with respect to the entire repeating units in the resin (A).

The resin (A) according to the present invention may further have an alicyclic hydrocarbon structure having no polar group (for example, the acid group, a hydroxyl group, a cyano group), and it is possible to have a repeating unit which does not exhibit an acid decomposability. This makes it possible to properly adjust the solubility of the resin during development using a developing solution containing an organic solvent. Examples of such repeating unit include a repeating unit represented by Formula (IV).

[Chem. 17]

(IV)

$$\ast\!\!-\!\!\left(\!\!\begin{array}{c}R_a\\|\\ \\ \end{array}\!\!\right)\!\!-\!\!\ast$$

In Formula (IV), $R_5$ represents a hydrocarbon group which has at least one cyclic structure, and does not have a polar group.

Ra represents a hydrogen atom, an alkyl group or —CH$_2$—O—Ra$_2$ group. In the Formula, Ra$_2$ represents a hydrogen atom, an alkyl group or an acyl group. Ra is preferably a hydrogen atom, a methyl group, a hydroxymethyl group or a trifluoromethyl group, and particularly preferably, a hydrogen atom or a methyl group.

The cyclic structure that R$_5$ has includes a monocyclic hydrocarbon group and a polycyclic hydrocarbon group. Examples of the monocyclic hydrocarbon group may include a cycloalkyl group having 3 to 12 carbon atoms, such as a cyclopentyl group, a cyclohexyl group, a cycloheptyl group, a cyclooctyl group, a cycloalkenyl group having 3 to 12 carbon atoms, such as a cyclohexenyl group, and the like. The monocyclic hydrocarbon group is preferably a monocyclic hydrocarbon group having 3 to 7 carbon atoms, and more preferably a cyclopentyl group or a cyclohexyl group.

The polycyclic hydrocarbon group includes a ring assembly hydrocarbon group, or a bridged cyclic hydrocarbon group. Examples of the ring assembly hydrocarbon group include a bicyclohexyl group, a perhydronaphthalenyl group and the like. Examples of the bridged cyclic hydrocarbon ring may include a bicycle hydrocarbon ring such as pinane, bornane, norpinane, and norbornane, a bicyclooctane ring (a bicyclo[2.2.2]octane ring, a bicyclo[3.2.1]octane ring, etc.), and a tricyclic hydrocarbon ring such as homobledane, and adamantane, a tricyclo[5.2.1.0$^{2,6}$]decane, tricyclo[4.3.1.1$^{2,5}$] undecane ring, a tetracyclic hydrocarbon ring such as tetracyclo[4.4.0.1$^{2,5}$.1$^{7,10}$]dodecane, and a perhydro-1,4-methano-5,8-methanonaphthalene ring. In addition, the crosslinked cyclic hydrocarbon ring includes a condensed cyclic hydrocarbon ring, for example, a condensed ring in which a plurality of 5- to 8-membered cycloalkane rings, such as perhydronaphthalene (decalin), perhydroanthracene, perhydro phenanthrene, perhydro acenaphthene, perhydrofluorene, perhydroindene, perhydro phenalene ring and the like are condensed.

Preferred crosslinked cyclic hydrocarbon rings may include a norbornyl group, an adamantyl group, a bicyclooctanyl group, a tricyclo[5,2,1,0$^{2,6}$]decanyl group, and the like. More preferred crosslinked cyclic hydrocarbon rings may include a norbornyl group and an adamantyl group.

These alicyclic hydrocarbon groups may have a substituent, and the substituent may preferably include a halogen atom, an alkyl group, a hydroxyl group wherein a hydrogen atom is substituted with, or an amino group wherein a hydrogen atom is substituted with. The halogen atom is preferably a bromine, chlorine, or fluorine atom, and the alkyl group is preferably a methyl group, an ethyl group, a butyl group, or a t-butyl group. The above-described alkyl group may have a further substituent, and the further substituent includes a halogen atom, an alkyl group, a hydroxyl group wherein a hydrogen atom is substituted with, or an amino group wherein a hydrogen atom is substituted with.

Example of the substituent for the hydrogen atom may include an alkyl group, a cycloalkyl group, an aralkyl group, a substituted methyl group, a substituted ethyl group, an alkoxycarbonyl group, or an aralkyloxycarbonyl group. Preferred alkyl group may include an alkyl group having 1 to 4 carbon atoms. Preferred substituted methyl group may include methoxymethyl, methoxythiomethyl, benzyloxymethyl, t-butoxymethyl, or 2-methoxyethoxymethyl group. Preferred substituted ethyl group may include 1-ethoxyethyl, 1-methyl-1-methoxyethyl. Preferred acyl groups include an aliphatic acyl group having 1 to 6 carbon atoms, such as formyl, acetyl, propionyl, butyryl, isobutyryl, val-eryl, or pivaloyl group. The alkoxycarbonyl group may include an alkoxycarbonyl group having 1 to 4 carbon atoms and the like.

The resin (A) may or may not contain a repeating unit which has an alicyclic hydrocarbon structure having no polar group and which does not exhibit acid-decomposability. However, when the resin (A) has a cyclic hydrocarbon structure having no polar group and contains a repeating unit which does not exhibit acid-decomposability, the content of the repeating unit is preferably from 1 to 40 mol % and more preferably from 1 to 20 mol % with respect to the entire repeating units in the resin (A).

Specific examples of the repeating unit which has an alicyclic hydrocarbon structure having no polar group and which does not exhibit an acid-decomposability may be mentioned below, but the present invention is not limited thereto. In the formulas, Ra represents H, CH$_3$, CH$_2$OH, or CF$_3$.

[Chem. 18]

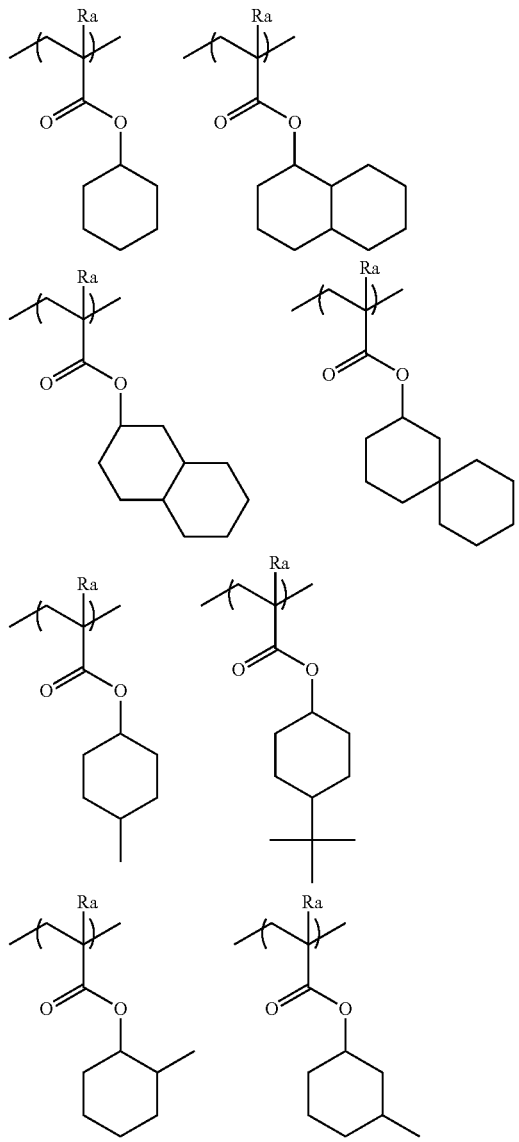

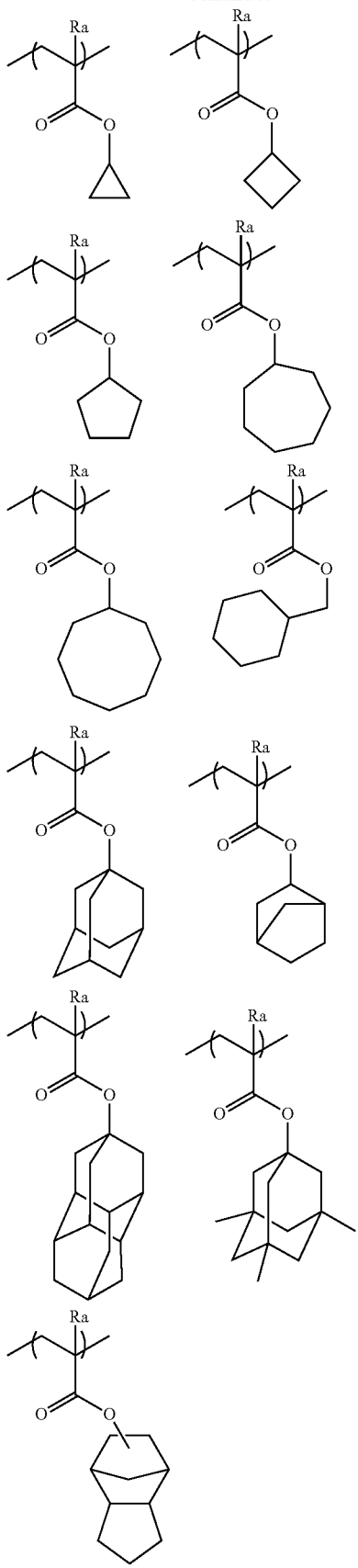

The resin (A) used in the composition of the present invention may have, in addition to the repeating units, various repeating units for the purpose of adjusting a dry etching resistance or a standard developer suitability, an adhesion to substrate, a resist profile, and further a resolution, a heat resistance, a sensitivity and the like, which are necessary properties of the resin composition (I).

These repeating structural units may include, but not limited to, repeating structural units corresponding to the monomers described below.

Thus, it is possible to finely adjust the performance required for the resin used in the composition (I) of the present invention, in particular, (1) solubility in a coating solvent,
(2) film-forming property (glass transition temperature),
(3) alkal-developability,
(4) film loss (selection of hydrophilic, hydrophobic or alkali-soluble group),
(5) adhesion of unexposed part to a substrate,
(6) dry etching resistance, and the like.

Examples of the monomers may include a compound having one addition polymerizable unsaturated bond which is selected from acrylate esters, methacrylate esters, acrylamides, methacrylamides, allyl compounds, vinyl ethers, vinyl esters, styrenes, crotonate esters and the like.

In addition, the addition polymerizable unsaturated compound may be copolymerized if it may be copolymerized with the monomer corresponding to the various repeating structural units as described above.

In the resin (A) used in the composition (I) of the present invention, the molar ratio of respective repeating structural units may be properly set in order to adjust a dry etching resistance or a standard developer suitability of the resin composition (I), an adhesion to substrate, a resist profile, and further a resolution, a heat resistance, a sensitivity and the like which have properties necessary for the resist.

The form of the resin (A) according to the present invention may be any of random type, block type, comb type and star type. The resin (A) may be synthesized, for example, by radical, cationic or anionic polymerization of an unsaturated monomer corresponding to respective structure. Also, after performing the polymerization using an unsaturated monomer corresponding to the precursor of respective structure, the resin of interest may be obtained by performing a polymer reaction.

The resin (A) according to the present invention may be synthesized by an ordinary method (e.g., radical polymerization). For example, the ordinary synthesis method may include a collective polymerization method which performs the polymerization by dissolving a monomer and an initiator in a solvent and heating them, and a dropping polymerization method which performs the polymerization by adding dropwise a solution of one monomer and an initiator to the heated solvent for 1 to 10 hours. The dropping polymerization is preferred. Examples of the reaction solvent may include tetrahydrofuran, 1,4-dioxane, ethers such as diisopropyl ether, ketones such as methyl ethyl ketone, methyl isobutyl ketone, ester solvents such as ethyl acetate, amide solvents such as dimethylformamide, dimethylacetamide, and further, solvents capable of dissolving the composition of the present invention such as propylene glycol monomethyl ether acetate, propylene glycol monomethyl ether, cyclohexanone as described below. It is more preferred to perform the polymerization using the same solvent as the solvent used in the resin composition (I) of the present invention. This can suppress generation of particles during storage.

The polymerization reaction may be preferably performed in an inert gas atmosphere such as nitrogen or argon. The polymerization is initiated by using a commercially available radical initiator (e.g., azo-based initiator, peroxide, etc.) as a polymerization initiator. The radical initiator is preferably an azo-based initiator, and more preferably an azo-based initiator having an ester group, a cyano group or a carboxyl group. Preferred examples of the initiator include azobisisobutyronitrile, azobisdimethylvaleronitrile, dimethyl 2,2'-azobis(2-methyl propionate). The initiator is added additionally or in parts, if desired, and after completion of the reaction, it is introduced into a solvent, and a desired polymer is recovered by a method such as powder or solid recovery. The reaction concentration is from 5 to 50% by mass and preferably from 10 to 30% by mass. The reaction temperature is usually from 10° C. to 150° C., preferably from 30° C. to 120° C. and more preferably from 60° C. to 100° C.

After the completion of reaction, the reaction solution is allowed to cool to room temperature and purified. The purification may be performed by a typical method, such as a liquid-liquid extraction method of applying water-washing or combining water-washing with an appropriate solvent to remove residual monomers or oligomer components, a purification method in a solution state, such as ultrafiltration of removing only those having a molecular weight not more than a specific molecular weight by virtue of extraction, a reprecipitation method of adding dropwise a resin solution in a poor solvent to solidify the resin in the poor solvent to remove residual monomers and the like, and a purification method in a solid state, such as washing of the resin slurry separated by filtration with a poor solvent. For example, the resin is precipitated as a solid by contacting the reaction solution with a solvent (poor solvent) in which the resin is sparingly soluble or insoluble and which is in a volumetric amount of 10 times or less and preferably from 10 to 5 times the reaction solution.

As a solvent (solvent for precipitation or re-precipitation) used upon precipitation or re-precipitation of the polymer product from the polymer solution, poor solvents for the polymer may be used. An appropriate solvent may be selected from among hydrocarbons, halogenated hydrocarbons, nitro compounds, ethers, ketones, esters, carbonates, alcohols, carboxylic acids, water, and a mixed solvent containing these solvents according to the kind of the polymer.

The amount of the solvents for precipitation or re-precipitation to be used may be appropriately selected in consideration of the efficiency or yield, but, in general, from 100 to 10,000 parts by mass, preferably from 200 to 2,000 parts by mass and still more preferably from 300 to 1,000 parts by mass, per 100 parts by mass of the polymer solution.

The temperature to be used upon precipitation or re-precipitation may be appropriately selected in consideration of efficiency or operability, but, usually, from about 0° C. to about 50° C., preferably around room temperature (for example, from about 20° C. to about 35° C.). The precipitation or re-precipitation procedure may be conducted in a known manner such as a batchwise manner or a continuous manner using a conventional mixing vessel such as a stirring tank.

The precipitated or re-precipitated polymer is usually subjected to conventional solid-liquid separation such as filtration or centrifugation, and then dried to use. Filtration is conducted by using a solvent-resistant filter medium preferably under pressure. Drying is conducted under ordinary pressure or reduced pressure (preferably under reduced pressure) at a temperature of from about 30° C. to about 100° C., preferably from about 30° C. to about 50° C.

Additionally, it is also possible to once precipitate and separate the resin, and then again dissolve in a solvent and bring the solution into contact with a solvent in which the resin is sparingly soluble or insoluble. That is, the reaction solution may be subjected, after completion of the radical polymerization reaction, to a method including a step (Step a) of bringing the reaction solution into contact with a solvent in which the resin is sparingly soluble or insoluble to thereby the resin, a step (Step b) of separating the resin from the solution, a step (Step c) of again dissolving the separated resin to prepare a resin solution A, a step (Step D) of bringing the resin solution A into contact with a solvent in which the resin is sparingly soluble or insoluble to thereby precipitate the resin in an amount by volume less than 10 times the amount by volume of the resin solution A (preferably in an amount by volume less than 5 times) to thereby precipitate the resin solid, and a step (Step e) of separating the precipitated resin.

Also, in order to suppress aggregation of the resin after preparation of the composition, the process may comprise dissolving the synthesized resin in a solvent to make a solution and heating the solution at a temperature of from about 30° C. to about 90° C. for about 30 minutes to about 4 hours, for example, as described in JP-A-2009-037108.

The weight average molecular weight of the resin (A) used in the composition of the present invention is preferably 1,000 to 200,000, more preferably 2,000 to 100,000, still more preferably 3,000 to 70,000, particularly preferably 5,000 to 50,000, which is a polystyrene-basis weight average molecular weight measured by gel permeation chromatography (GPC). By setting the weight average molecular weight to 1,000 to 200,000, it is possible to prevent deterioration of the heat resistance and dry etching resistance, and also to prevent deterioration of the developability or an increase in the viscosity, thus deteriorating the film-forming property.

Polydispersity (molecular weight distribution) ranges usually from 1.0 to 3.0, preferably from 1.0 to 2.6, still more preferably from 1.2 to 2.4 and particularly preferably from 1.4 to 2.2. When the molecular weight distribution falls within the above range, the resolution and resist profile are excellent, the side wall of the resist pattern is smooth and the roughness property is excellent.

In the actinic ray-sensitive or radiation-sensitive resin composition of the present invention, the blending ratio of the resin (A) in the entire composition is preferably 30 to 99% by mass and more preferably 60 to 95%, based on the total solids.

Further, in the present invention, the resin (A) may be used alone or in combination of two or more.

[2] Compound (B) Capable of Generating an Acid Upon Irradiation of Actinic Ray or Radiation The composition (I) of the present invention may also contain preferably a compound (B) capable of generating an acid upon irradiation of actinic rays or radiation (hereinafter, also called an "acid generator").

The compound (B) capable of generating an acid upon irradiation of actinic ray or radiation is preferably a compound capable of generating an organic acid upon irradiation of actinic ray or radiation.

The acid generator may be appropriately selected from a photo-initiator for cationic photopolymerization, a photo-initiator for radical photopolymerization, a photodecoloring agent for dyes, a photodiscoloring agent, or a publicly known compound capable of generating an acid upon irradiation with an actinic ray or radiation, which is used for microresist or the like, and a mixture thereof, and be used.

Examples thereof include a diazonium salt, a phosphonium salt, a sulfonium salt, an iodonium salt, imidosulfonate, oxime sulfonate, diazodisulfone, disulfone, and o-nitrobenzyl sulfonate.

In the present invention, a compound (B) capable of generating an acid upon irradiation with an actinic ray or radiation is preferably an oxime sulfonate compound represented by the following Formula (b1).

[Chem. 19]

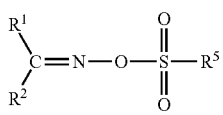

(b1)

(In Formula (b1), $R^5$ represents an alkyl group, a cycloalkyl group or an aryl group, each of $R^1$ and $R^2$ represents a substituent and may be bonded to each other to form a ring.)

The alkyl group represented by $R^5$ is preferably a straight or branched alkyl group having 1 to 10 carbon atoms. The alkyl group represented by $R^5$ may be substituted with an aryl group having 6 to 11 carbon atoms, an alkoxy group having 1 to 10 carbon atoms, or a cycloalkyl group (including a bridged alicyclic group such as 7,7-dimethyl-2-oxonorbornyl group, preferably a bicycloalkyl group).

The aryl group represented by $R^5$ is preferably an aryl group having 6 to 11 carbon atoms, and more preferably a phenyl group or a naphthyl group. The aryl group represented by $R^5$ may be substituted with a lower alkyl group, an alkoxy group or a halogen atom.

The oxime sulfonate compound represented by the Formula (b1) is preferably an oxime sulfonate compounds represented by the Formula (OS-3), Formula (OS-4) or Formula (OS-5).

[Chem. 20]

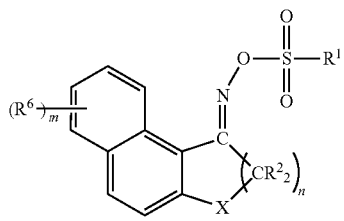

(OS-3)

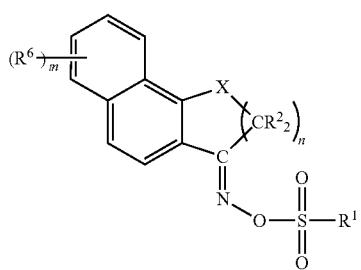

(OS-4)

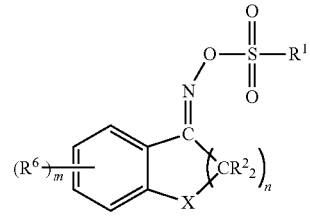

(OS-5)

(In Formula (OS-3) to Formula (OS-5), $R^1$ represents an alkyl group, an aryl group or a heteroaryl group, $R^2$ are each independently a hydrogen atom, an alkyl group, an aryl group or a halogen atom, $R^6$ are each independently a halogen atom, an alkyl group, an alkyloxy group, a sulfonic acid group, an aminosulfonyl group or an alkoxy sulfonyl group, X represents O or S, n represents 1 or 2, and in represents an integer of 0 to 6).

In Formulae (OS-3) to (OS-5), the alkyl group, an aryl group or heteroaryl group represented by $R^1$ may have a substituent.

In Formulae (OS-3) to (OS-5), the alkyl group represented by $R^1$ is preferably an alkyl group having 1 to 30 carbon atoms in total which may have a substituent.

Examples of the substituent which may be possessed by the alkyl group represented by $R^1$ may include a halogen atom, an alkyloxyl group, an aryloxy group, an alkylthio group, an arylthio group, an alkyloxycarbonyl group, an aryloxycarbonyl group, and an amino carbonyl group.

Examples of the alkyl group represented by $R^1$ may include a methyl group, an ethyl group, a n-propyl group, an i-propyl group, a n-butyl group, a s-butyl group, a t-butyl group, a n-pentyl group, a n-hexyl group, a n-octyl group, a n-decyl group, a n-dodecyl group, a trifluoromethyl group, a perfluoropropyl group, a perfluorobutyl group, a benzyl group, a phenoxyethyl group, a methylthioethyl group, a phenylthioethyl group, an ethoxycarbonyl ethyl group, a phenoxy carbonyl ethyl group, a dimethyl amino carbonyl ethyl group.

Among them, a methyl group, an ethyl group, a n-propyl, group, an i-propyl, group, a n-butyl group, a s-butyl group, a t-butyl group, a n-pentyl group, a n-hexyl group, a n-octyl group, a n-decyl group, a n-dodecyl group, a trifluoromethyl group, a perfluoropropyl group, a perfluorobutyl group, or a benzyl group is preferred.

Further, in the Formulae (OS-3) to (OS-5), an aryl group represented by $R^1$ is preferably an aryl group having 6 to 30 carbon atoms in total which may have a substituent.

Examples of the substituent which may be possessed by the aryl group represented by $R^1$ may include a halogen atom, an alkyl group, an alkyloxy group, an aryloxy group, an alkylthio group, an arylthio group, an alkyloxy carbonyl group, an aryloxy carbonyl group, an amino carbonyl group, a sulfonic acid group, an aminosulfonyl group, or an alkoxy sulfonyl group.

Examples of the aryl group represented by $R^1$ may include a phenyl group, a p-methylphenyl group, a p-chlorophenyl group, a pentachlorophenyl group, a pentafluorophenyl group, an o-methoxyphenyl group, a p-phenoxyphenyl group, a p-methylthiophenyl group, a p-phenylthiophenyl group, a p-ethoxycarbonylphenyl group, a p-phenoxycarbonylphenyl group, or a p-dimethylaminocarbonyl phenyl group.

Among them, a phenyl group, a p-methylphenyl group, a p-chlorophenyl group, a pentachlorophenyl group, a pentafluorophenyl group, an o-methoxyphenyl group, or a p-phenoxyphenyl group is preferred.

Also, in the Formulae (OS-3) to (OS-5), the heteroaryl group in $R^1$ is preferably a heteroaryl group having a total carbon number of 4 to 30 which may have a substituent.

Examples of the substituent which the heteroaryl group represented by $R^1$ may have include a halogen atom, an alkyl group, an alkyloxy group, an aryloxy group, an alkylthio group, an arylthio group, an alkyloxy carbonyl group, an aryloxy carbonyl group, an amino carbonyl group a sulfonic acid group, an aminosulfonyl group, or an alkoxy sulfonyl group.

In the Formulae (OS-3) to (OS-5), the heteroaryl group represented by $R^1$ may be at least one heteroaromatic ring, and, for example, the heteroaromatic ring and the benzene ring may be condensed.

Examples of the heteroaryl group represented by $R^1$ may include a group formed by excluding one hydrogen atom from a ring selected from the group consisting of a thiophene ring, a pyrrole ring, a thiazole ring, an imidazole ring, a furan ring, a benzothiophene ring, a benzothiazole ring, and a benzimidazole ring, which may have a substituent.

In the Formulae (OS-3) to (OS-5), $R^2$ is preferably a hydrogen atom, an alkyl group or an aryl group, more preferably a hydrogen atom or an alkyl group.

In the Formulae (OS-3) to (OS-5), among two or more $R^2$ present in the compound, it is preferred that one or two are an alkyl group, an aryl group or a halogen atom, it is more preferred that one is an alkyl group, an aryl group or a halogen atom, and it is particularly preferred that one is an alkyl group and the remainders are a hydrogen atom.

In the Formulae (OS-3) to (OS-5), an alkyl group or an aryl group represented by $R^2$ may have a substituent.

As the substituent which the alkyl group or an aryl group represented by $R^2$ may have, the groups same as the substituent which the alkyl group or the aryl group represented by $R^1$ may have can be exemplified.

The alkyl group represented by $R^2$ is preferably an alkyl group having 1 to 12 carbon atoms in total which may have a substituent, and more preferably an alkyl group having 1 to 6 carbon atoms in total which may have a substituent.

Specific examples of the alkyl group represented by $R^2$ include a methyl group, an ethyl group, a n-propyl group, an i-propyl group, a n-butyl group, an i-butyl group, a s-butyl group, a t-butyl group, an allyl group, a n-pentyl group, a n-hexyl group, a n-octyl group, a n-decyl group, a n-dodecyl group, a perfluorohexyl group, a chloromethyl group, a bromomethyl group, a methoxymethyl group, a benzyl group, a phenoxyethyl group, a methylthioethyl group, a phenylthioethyl group, an ethoxycarbonyl ethyl group, a phenoxycarbonyl ethyl group, or a dimethylaminocarbonyl ethyl group.

Among them, a methyl group, an ethyl group, a n-propyl group, an i-propyl group, a n-butyl group, an i-butyl group, a s-butyl group, a n-hexyl group, an allyl group, a chloromethyl group, a bromomethyl group, a methoxymethyl group, or a benzyl group is preferred. A methyl group, an ethyl group, a n-propyl group, an i-propyl group, a n-butyl group, an i-butyl group, a s-butyl group or a n-hexyl group is more preferred. A methyl group, an ethyl group, a n-propyl group, a n-butyl group or a n-hexyl group is further preferred, and a methyl group is particularly preferred.

The aryl group represented by $R^2$ is preferably an aryl group having 6 to 30 carbon atoms in total which may have a substituent.

Specific examples of the aryl group represented by $R^2$ include a phenyl group, a p-methylphenyl group, an o-chlorophenyl group, a p-chlorophenyl group, an o-methoxyphenyl group, a p-phenoxyphenyl group, a p-methylthiophenyl group, a p-phenyl thiophenyl, group, a p-ethoxycarbonylphenyl group, a p-phenoxy carbonyl phenyl group, or p-dimethylaminocarbonyl phenyl group.

Among them, a phenyl group, a p-methylphenyl group, an o-chlorophenyl group, a p-chlorophenyl group, an o-methoxyphenyl group, or a p phenoxyphenyl group is preferred.

Examples of the halogen atom represented by $R^2$ may include a fluorine atom, a chlorine atom, a bromine atom, or an iodine atom.

Among them, a chlorine atom or a bromine atom is preferred.

In Formulae (OS-3) to (OS-5), X represents O or S, preferably O.

In Formulae (OS-3) to (OS-5), the ring containing X as a ring member is a 5- or 6-membered ring.

In Formulae (OS-3) to (OS-5), n represents 1 or 2. When X is O, n is preferably 1, and when X is 5, n is preferably 2.

In Formulae (OS-3) to (OS-5), the alkyl group and the alkyloxy group represented by $R^6$ may have a substituent.

In Formulae (OS-3) to (OS-5), the alkyl group represented by $R^6$ is preferably an alkyl group having 1 to 30 carbon atoms in total which may have a substituent.

Examples of the substituent which the alkyl group represented by $R^6$ may have include a halogen atom, an alkyloxy group, an aryloxy group, an alkylthio group, an arylthio group, an alkyloxycarbonyl group, an aryloxycarbonyl group, or an aminocarbonyl group.

Examples of the alkyl group represented by $R^6$ may include a methyl group, an ethyl group, a n-propyl group, an i-propyl group, a n-butyl group, a s-butyl group, a t-butyl group, a n-pentyl group, a n-hexyl group, a n-octyl group, a n-decyl group, a n-dodecyl group, a trifluoromethyl group, a perfluoropropyl group, a perfluorohexyl group, a benzyl group, a phenoxyethyl group, a methylthioethyl group, a phenylthioethyl group, an ethoxycarbonyl ethyl group, a phenoxy carbonyl ethyl group, or a dimethyl amino carbonyl ethyl group.

Among them, a methyl group, an ethyl group, a n-propyl group, an i-propyl group, a n-butyl group, a s-butyl group, a t-butyl group, a n-pentyl group, a n-hexyl group, a n-octyl group, a n-decyl group, a n-dodecyl group, a trifluoromethyl group, a perfluoropropyl group, a perfluorohexyl group, or a benzyl group is preferred.

In Formulae (OS-3) to (OS-5), the alkyloxy group represented by $R^6$ is preferably an alkyl group having 1 to 30 carbon atoms in total which may have a substituent.

Examples of the substituent which the alkyloxy group represented by $R^6$ may have include a halogen atom, an alkyloxy group, an aryloxy group, an alkylthio group, an arylthio group, an alkyloxy carbonyl group, an aryloxy carbonyl group, or an amino carbonyl group.

Examples of the alkyloxy group represented by $R^6$ include a methyloxy group, an ethyloxy group, a butyloxy group, a hexyloxy group, a phenoxyethyloxy group, a trichloromethyloxy group, an ethoxyethyloxy group, a methylthioethyloxy group, a phenylthioethyloxy group, an ethoxycarbonyl ethyloxy group, a phenoxycarbonyl ethyloxy group, or a dimethylaminocarbonyl ethyloxy group.

Among them, a methyloxy group, an ethyloxy group, a butyloxy group, a hexyloxy group, a phenoxyethyloxy group, a trichloromethyloxy group or an ethoxyethyloxy group is preferred.

In Formulae (OS-3) to (OS-5), the aminosulfonyl group represented by $R^6$ includes a methylaminosulfonyl group, a dimethylaminosulfonyl group, a phenyl amino sulfonyl group, a methyl phenyl amino sulfonyl group, or an amino sulfonyl group.

In Formula (OS-3) to (OS-5), the alkoxy sulfonyl group represented by $R^6$ includes a methoxysulfonyl group, an ethoxysulfonyl group, a propyloxy sulfonyl group or a butyloxy sulfonyl group.

Also, in the Formulas (OS-3) to (OS-5), m represents an integer of 0 to 6, preferably an integer of 0 to 2, more preferably 0 or 1, and particularly preferably 0.

The compound containing an oxime sulfonate compound represented by the Formula (b1) is particularly preferably an oxime sultanate compound represented by any one of the following Formulae (OS-6) to (OS-11).

[Chem. 21]

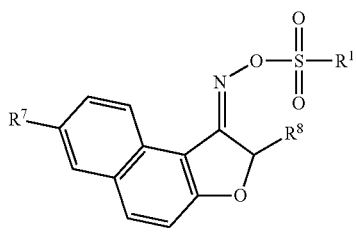
(OS-6)

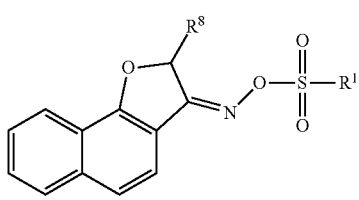
(OS-7)

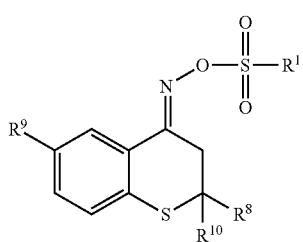
(OS-8)

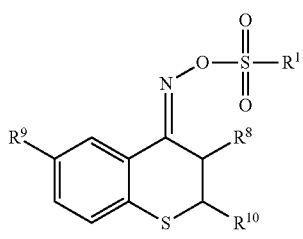
(OS-9)

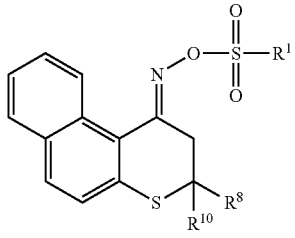
(OS-10)

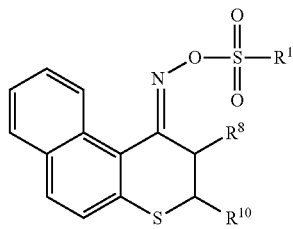
(OS-11)

(In Formulae (OS-6) to (OS-11), $R^1$ represents an alkyl group, an aryl group or a heteroaryl group, $R^7$ represents a hydrogen atom or a bromine atom, $R^8$ represents a hydrogen atom, a alkyl group having 1 to 8 carbon atoms, a halogen atom, a chloromethyl group, a bromomethyl group, a bromoethyl group, a methoxymethyl group, a phenyl group or a chlorophenyl group, $R^9$ represents a hydrogen atom, a halogen atom, a methyl group or a methoxy group, and $R^{10}$ represents a hydrogen atom or a methyl group.)

$R^1$ in Formulae (OS-6) to (OS-11) has the same meaning as $R^1$ in the Formulae (OS-3) to (OS-5) above, and the preferred embodiment is also the same.

$R^7$ in Formula (OS-6) represents a hydrogen atom or a bromine atom, and preferably a hydrogen atom.

$R^8$ in Formulae (OS-6) to (OS-11) represents a hydrogen atom, n alkyl group having 1 to 8 carbon atoms, a halogen atom, a chloromethyl group, a bromomethyl group, a bromoethyl group, a methoxymethyl group, a phenyl group or a chlorophenyl group, preferably an alkyl group having 1 to 8 carbon atoms, a halogen atom or a phenyl group, more preferably an alkyl group having 1 to 8 carbon atoms, still more preferably an alkyl group having 1 to 6 carbon atoms, and particularly preferably a methyl group.

$R^9$ in Formulae (OS-8) and (OS-9) represents a hydrogen atom, a halogen atom, a methyl group or a methoxy group, and preferably a hydrogen atom.

$R^{10}$ in Formulae (OS-8) to (OS-11) represents a hydrogen atom or a methyl group, and preferably a hydrogen atom.

Furthermore, with respect to the oxime sulfonate compound, the oxime may have any single conformation (E, Z), or may be a mixture thereof.

Specific examples of the oxime sulfonate compound represented by Formulae (OS-3) to (OS-5) above may include compounds illustrated below, but the present invention is not limited thereto.

[Chem. 22]

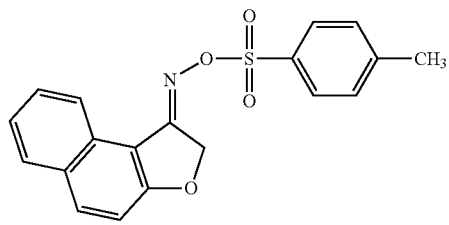

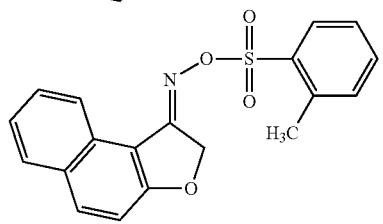

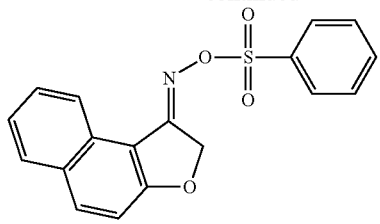
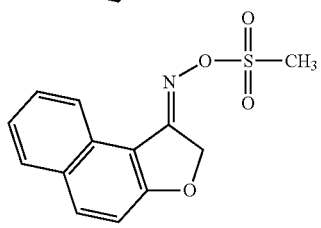
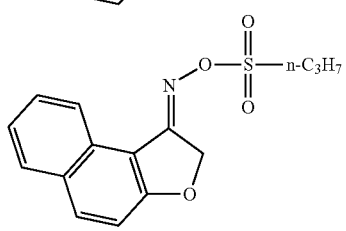
[Chem. 23]
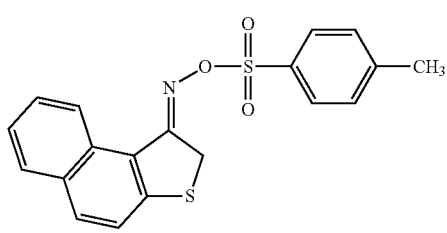
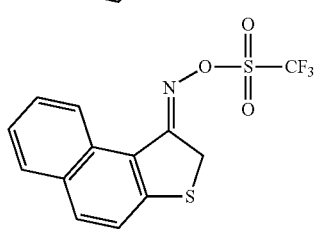
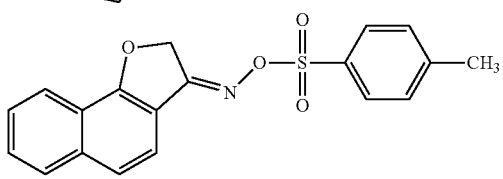
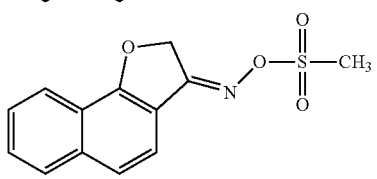
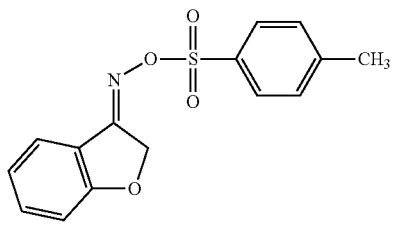
[Chem. 24]
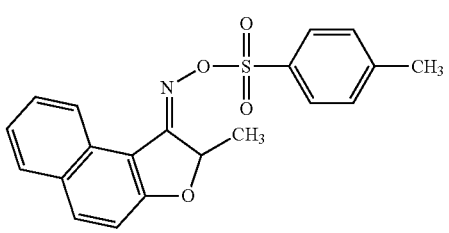
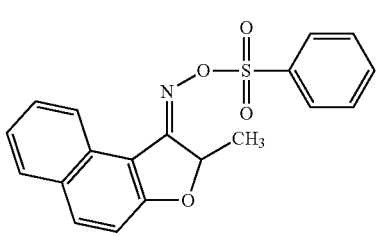
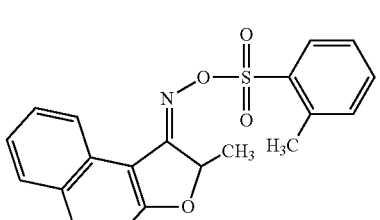
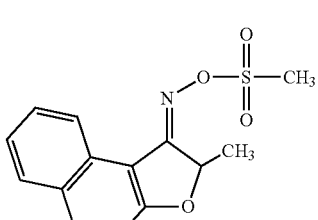
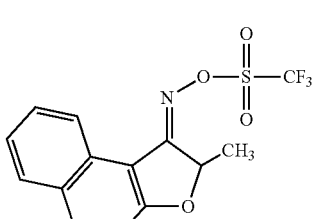
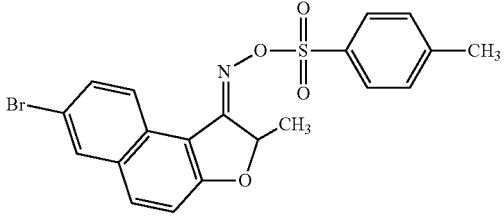
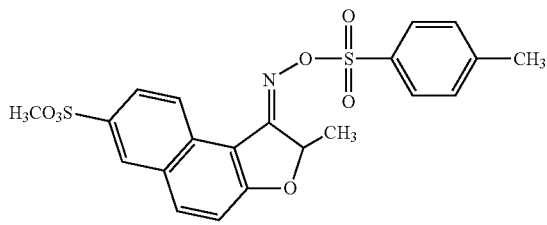

-continued
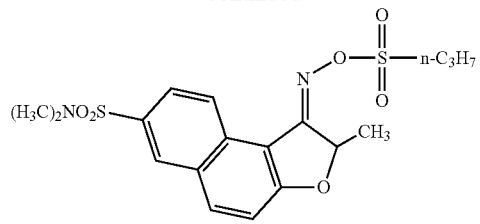
[Chem. 25]
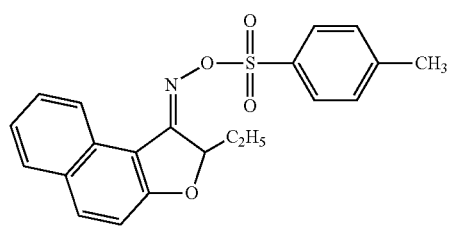
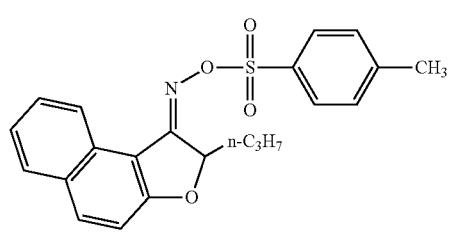
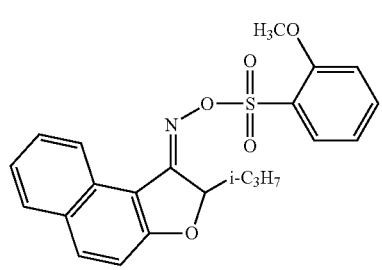
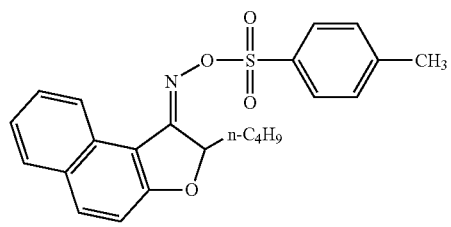
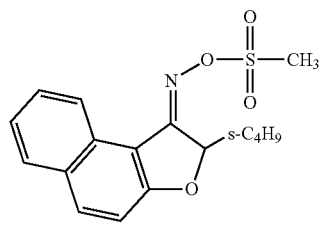
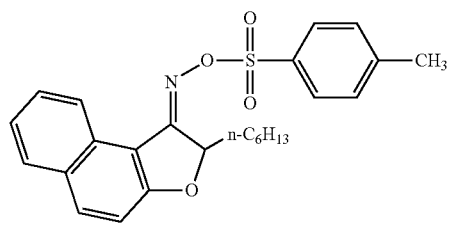
-continued
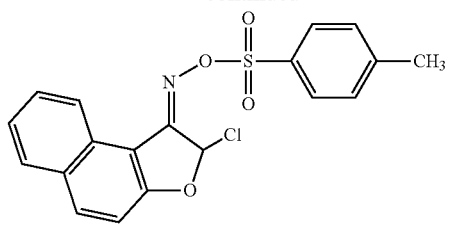
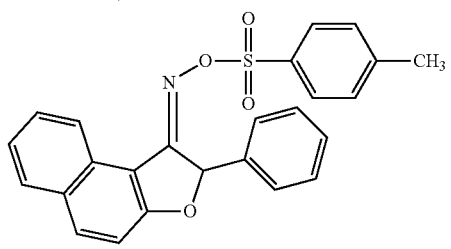
[Chem. 26]
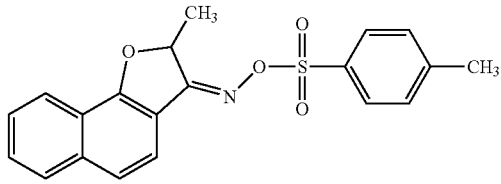
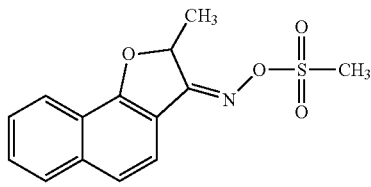
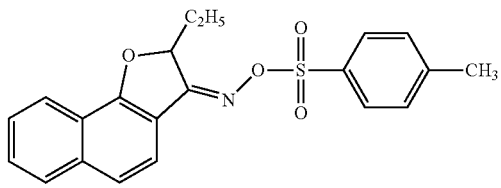
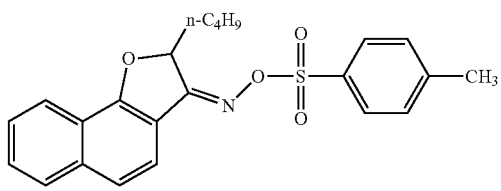
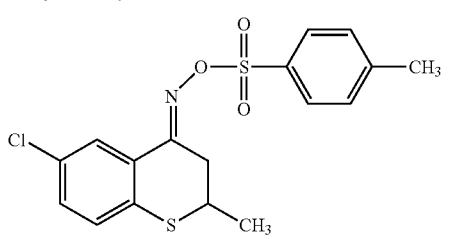
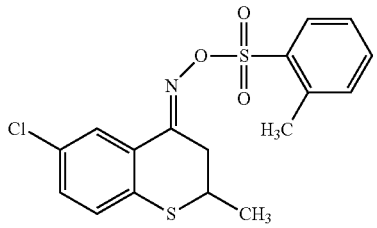

-continued
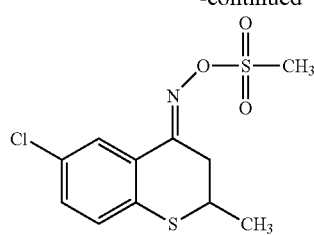
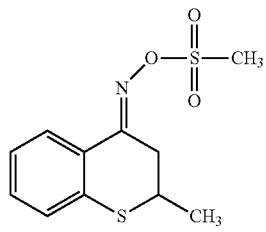
[Chem. 27]
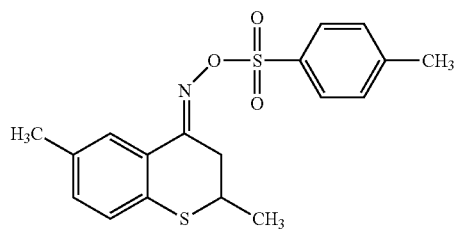
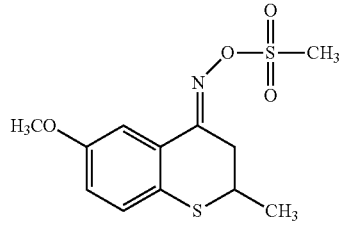
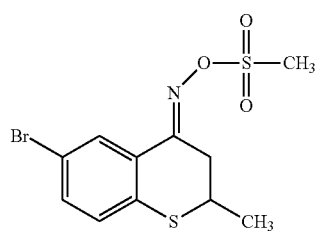
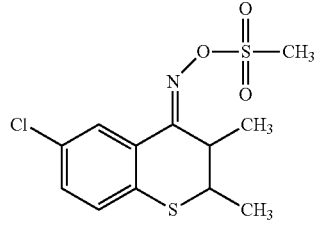
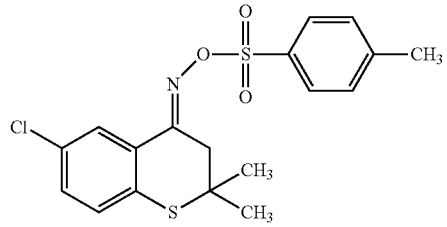
-continued
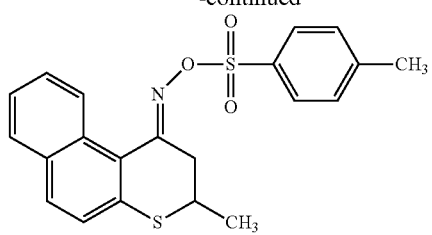
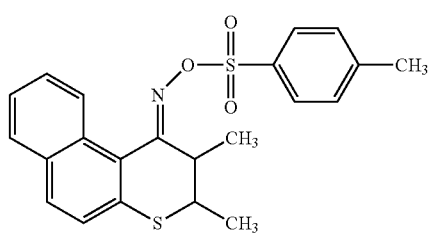
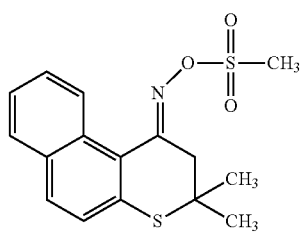
[Chem. 28]
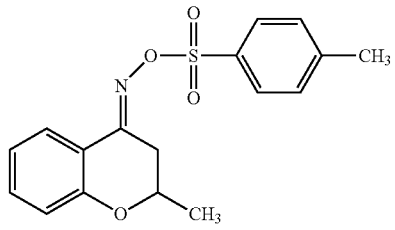
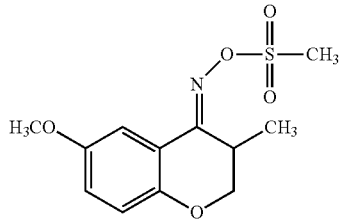
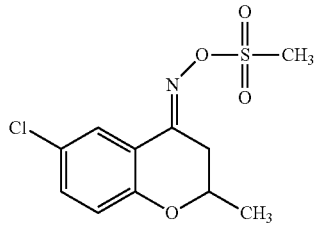
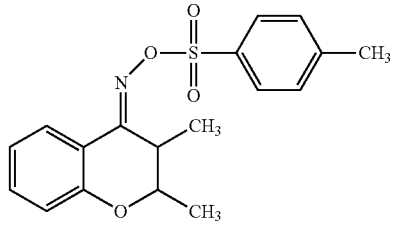

-continued

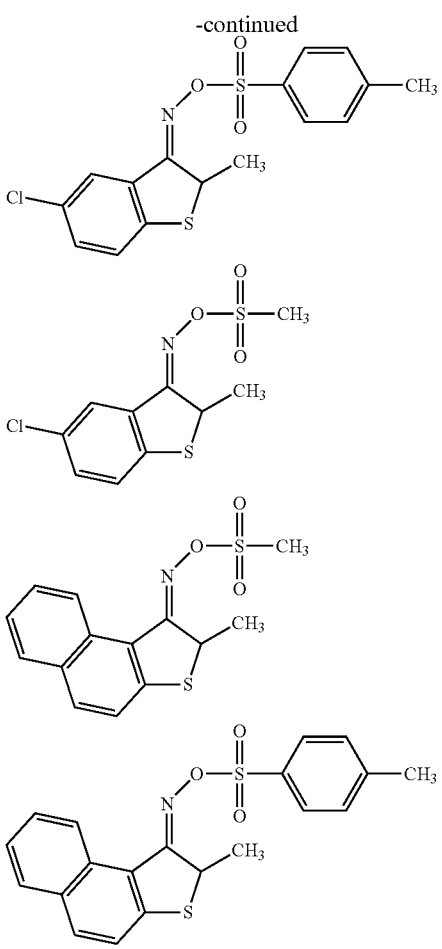

The above-described compounds containing an oxime sultanate compound represented by Formula (b1) is also preferably a compound represented by the Formula (OS-1) below.

[Chem. 29]

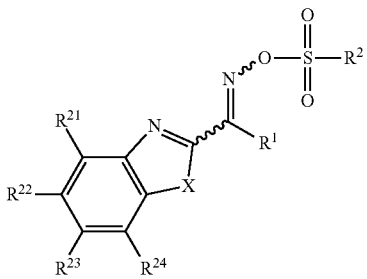

(OS-1)

(In Formula (OS-1), $R^1$ represents a hydrogen atom, an alkyl group, an alkenyl group, an alkoxy group, an alkoxycarbonyl group, an acyl group, a carbamoyl group, a sulfamoyl group, a sulfo group, a cyano group, an aryl group, or a heteroaryl group. $R^2$ represents an alkyl group or an aryl group.)

X represents —O—, —S—, —NH—, —$NR^5$—, —$CH_2$—, —$CR^6H$—, or —$CR^6R^7$—, and $R^5$ to $R^7$ represent an alkyl group, or an aryl group.

Each of $R^{21}$ to $R^{24}$ independently represents a hydrogen atom, a halogen atom, an alkyl group, an alkenyl group, an alkoxy group, an amino group, an alkoxycarbonyl group, an alkylcarbonyl group, an arylcarbonyl group, an amide group, a sulfo group, a cyano group, or an aryl group. Two of $R^{21}$ to $R^{24}$ may be bonded to each other to form a ring.

$R^{21}$ to $R^{24}$ are preferably a hydrogen atom, a halogen atom and an alkyl group. Also, an aspect in which at least two of $R^{21}$ to $R^{24}$ are bonded to each other to form an aryl group is also preferred. Among them, an aspect in which all of $R^{21}$ to $R^{24}$ are a hydrogen atom is preferred from the viewpoint of sensitivity.

Any of the above-mentioned functional groups may further have a substituent.

The compound represented by the Formula (OS-1) is preferably a compound represented by Formula (OS-2) below.

[Chem. 30]

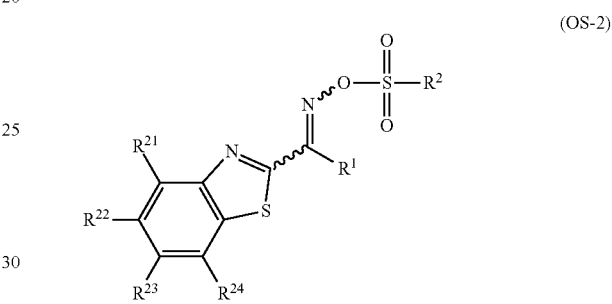

(OS-2)

In Formula (OS-2), each of $R^1$, $R^2$, $R^{21}$ to $R^{24}$ has the same meaning as that in Formula (OS-1), and preferred examples thereof are also the same.

Among them, $R^1$ in Formula (OS-1) and Formula (OS-2) is more preferably a cyano group or an aryl group, and $R^1$ in Formula (OS-2) is most preferably a cyano group, a phenyl or a naphthyl group.

Furthermore, in the above-described oxime sulfonate compound, the oxime or benzothiazole ring may have any single conformation (E, Z, etc.) or may be a mixture thereof.

Specific examples of the compound represented by Formula (OS-1) which may be suitably used in the present invention may include the compounds (b-1 to b-34) illustrated below, but the present invention is no limited thereto. Further, Me represents a methyl group, Et represents an ethyl group, Bn represents a benzyl group, and Ph represents a phenyl group.

[Chem. 31]

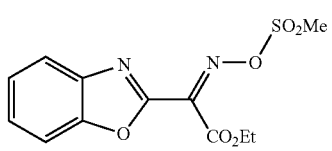

b-1

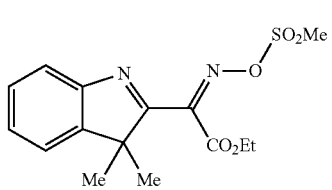

b-2

-continued
b-3 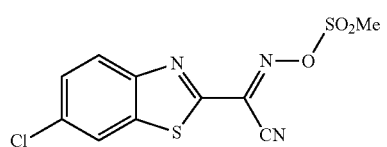
b-4 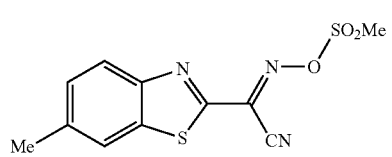
b-5 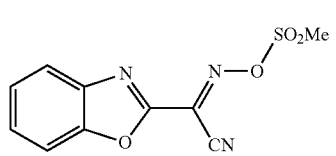
b-6 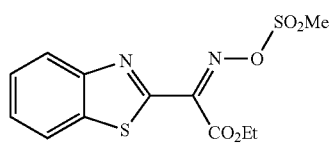
b-7 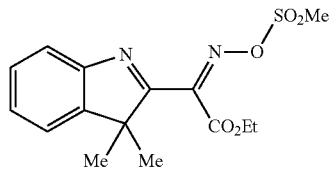
b-8 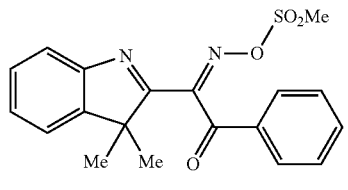
b-9 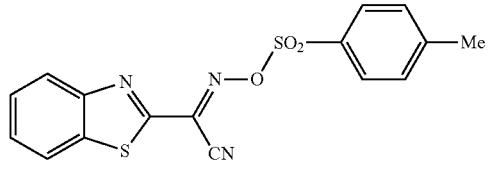
b-10 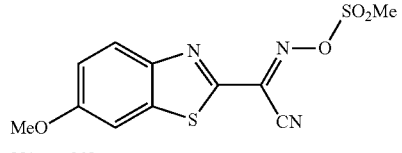
[Chem. 32]
b-11 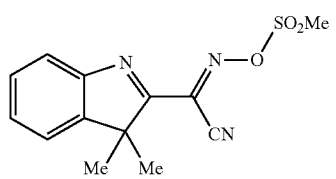
-continued
b-12 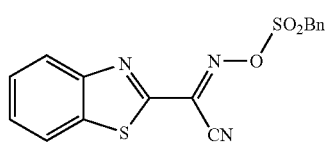
b-13 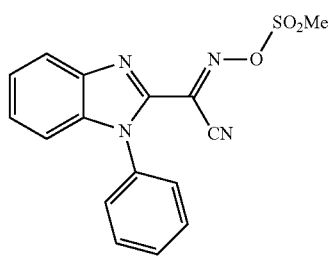
b-14 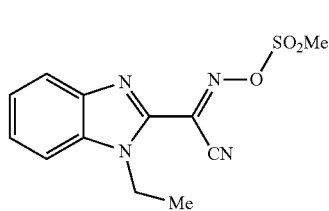
b-15 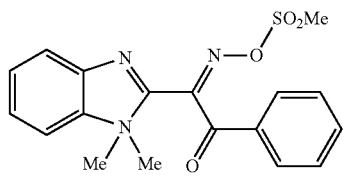
b-16 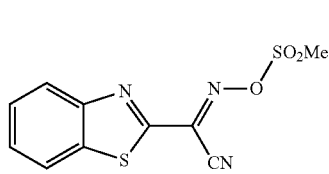
b-17 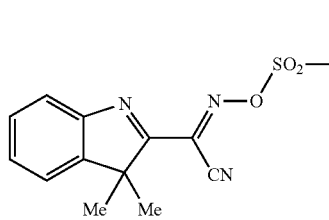
b-18 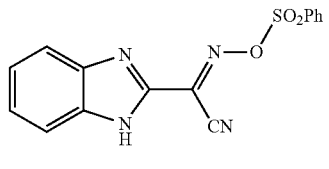
b-19 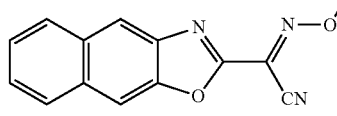

-continued
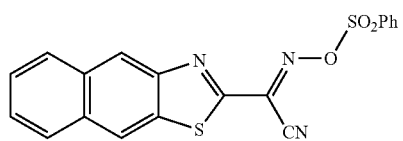
b-20
[Chem. 33]
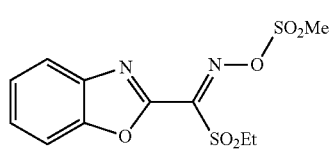
b-21
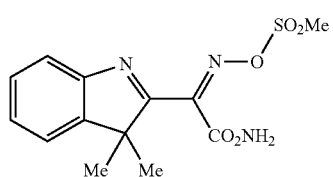
b-22
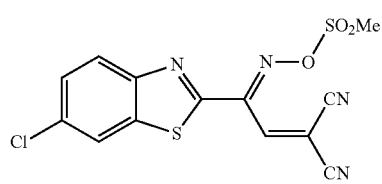
b-23
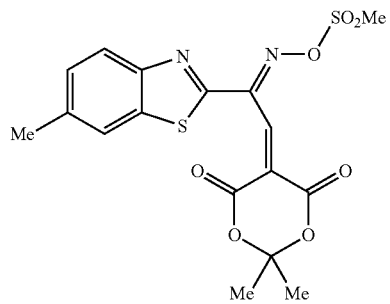
b-24
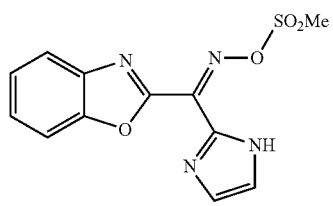
b-25
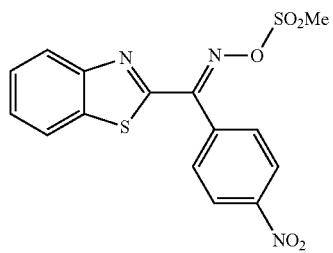
b-26
-continued
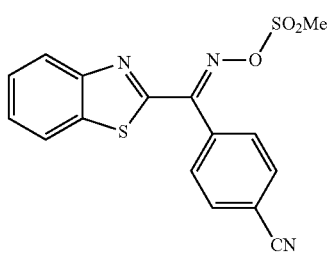
b-27
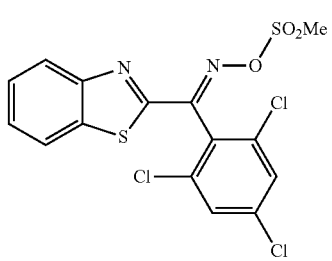
b-28
[Chem. 34]
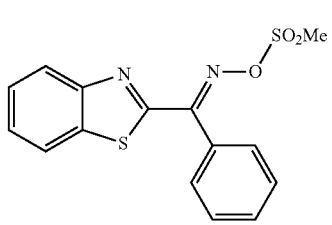
b-29
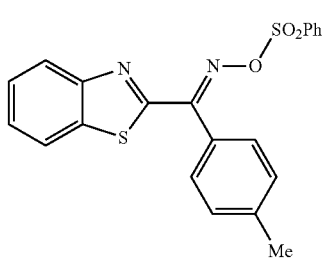
b-30
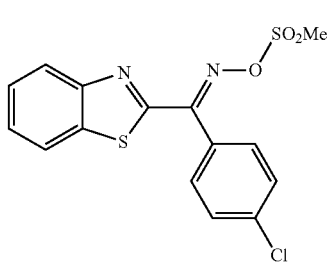
b-31
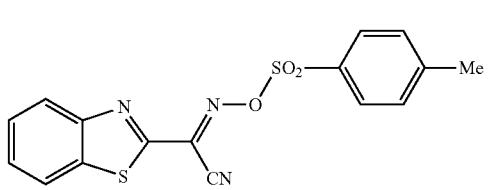
b-32

-continued

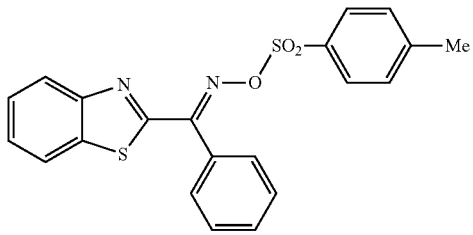
b-33

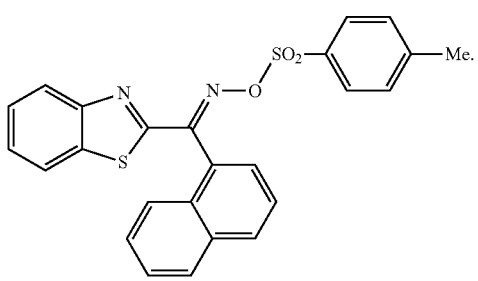
b-34

Among the above-described compounds, Compounds b-9, b-16, b-31 and, b-33 are preferred from the viewpoint of the compatibility between the sensitivity and stability.

The above-described compound containing an oxime sultanate compound represented by Formula (b1) is also preferably an oxime sultanate compound represented by the following Formula (b2).

[Chem. 35]

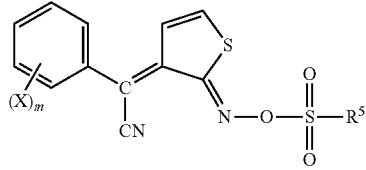
(b2)

(In Formula (b2), $R^5$ represents an alkyl group or an aryl group, X represents an alkyl group, an alkoxy group, or a halogen atom, m represents an integer of 0 to 3, m may be 2 or 3, and each X may be the same as or different from every other X.)

The alkyl group represented by X is preferably a straight or branched alkyl group having 1 to 4 carbon atoms.

The alkoxy group represented by X is preferably a straight or branched alkoxy group having 1 to 4 carbon atoms.

Halogen atom represented by X is preferably a chlorine atom or a fluorine atom.

m is preferably 0 or 1.

In Formula (b2), the compounds wherein m is 1, X is a methyl group, the substitution position of X is ortho-position, and $R^5$ is a straight alkyl group having 1 to 10 carbon atoms, 7,7-dimethyl-2-oxonorbornylmethyl group, or a p-tolyl group is preferred.

The compound containing an oxime sulfonate compound represented by Formula (b1) is also preferably an oxime sulfonate compound represented by Formula (b3).

[Chem. 36]

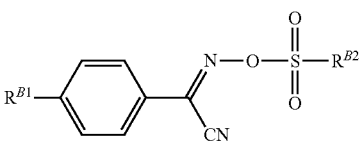
(b3)

(In Formula, $R^{B1}$ represents an alkyl group, an alkoxy group, or a halogen atom, and $R^{B2}$ represents an alkyl group or an aryl group.)

$R^{B1}$ is preferably an alkoxy group, preferably an alkoxy group having 1 to 5 carbon atoms, and more preferably a methoxy group.

$R^{B2}$ is preferably an alkyl group, more preferably a methyl group, an ethyl group, a n-propyl group, a n-butyl group, a n-octyl group, a trifluoromethyl group, a pentafluoroethyl group, a perfluoro-n-propyl group, a perfluoro-n-butyl group, a p-tolyl group, a 4-chlorophenyl group or a pentafluorophenyl group.

Specific examples of preferred oxime sulfonate compound may include the following compounds (i) to (viii), etc., which may be used either alone or in combination of two or more thereof. The compounds (i) to (viii) are commercially available.

[Chem. 37]

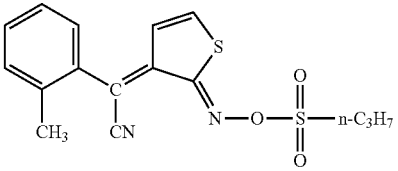
(i)

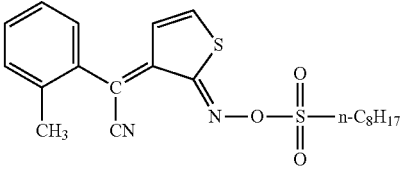
(ii)

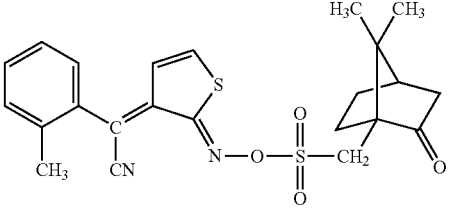
(iii)

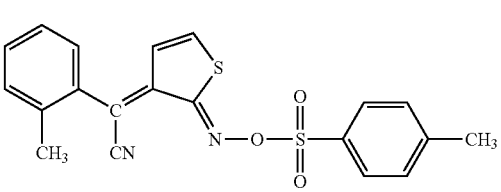
(iv)

[Structures (v), (vi), (vii), (viii) shown — oxime sulfonate compounds]

These may also be used in combination with other kinds of acid generators (B).

The acid generator (B) other than the oxime sulfonate compounds may include a sulfonium salt as described above.

Sulfonium salts as the acid generator (B) are exemplified below, but the present invention is not limited thereto.

[Chem. 38]

[Sulfonium salt structures with counter anions $CF_3SO_3^-$, $C_4F_9SO_3^-$, $C_3F_7SO_3^-$, $CH_3SO_3^-$, $C_4H_9SO_3^-$, $C_3H_7SO_3^-$ shown]

[Additional sulfonium salt structures shown with triisopropylphenyl sulfonate, camphorsulfonate, and $CF_3SO_3^-$ counter anions]

The acid generator may be synthesized by a known method, for example, it may be synthesized according to the method described in Japanese Patent Laid-Open Publication No. 2007-161707.

The acid generators may be used either alone or in combination of two or more thereof.

The content of a compound capable of generating an acid upon irradiation with an actinic ray or radiation in the composition (I) is preferably from 0.1 to 30% by mass, more preferably from 0.5 to 25% by mass, more preferably from 1 to 20% by mass and particularly preferably from 2 to 15% by mass, based on the total solid content of the resin composition.

[3] Compound Represented by Formula (c1)

In the present invention, a compound represented by Formula (c1) may be used. The compound represented by Formula (c1) may be used in combination with the acid generator (B) to achieve a high adhesion to the underlying layer (e.g., an organic semiconductor film).

Formula (c1)

[Chem. 39]

[Structure: $R^1-A-NH-C(=R^3)-NH-R^2$]

(In Formula (c1), each of $R^1$ and $R^2$ independently represents an alkyl group having 1 to 10 carbon atoms which may be branched, an aryl group which may have a substituent, a cycloalkyl group which may have a substituent, or a morpholino group. $R^3$ represents an oxygen atom or a sulfur atom, and A represents a divalent linking group.)

$R^1$ is preferably an aryl group which may have a substituent, a cycloalkyl group which may have a substituent, or a morpholino group, and more preferably a morpholine group.

When $R^1$ is an aryl group, a phenyl group and a naphthyl group may be exemplified, and a phenyl group is more preferred. The aryl group may have a substituent, but an aryl group which does not have a substituent is preferred.

When $R^1$ is a cycloalkyl group, it is preferably a 5- or 6-membered cycloalkyl group, and more preferably a 6-membered cycloalkyl group. The cycloalkyl group may have a substituent, but a cycloalkyl group having no substituent is preferred.

$R^2$ is preferably an optionally branched alkyl groups having 1 to 10 carbon atoms, an optionally substituted aryl group or an optionally substituted cycloalkyl group.

When $R^2$ is an alkyl group, it is preferably an alkyl group having 1 to 8 carbon atoms.

When $R^2$ is an aryl group, it includes a phenyl group and a naphthyl group, and more preferably a phenyl group. The aryl group may have a substituent, but not having a substituent is preferred.

When $R^2$ is a cycloalkyl group, it is preferably a 5- or 6-membered cycloalkyl group, and more preferably a 6-membered cycloalkyl group. The cycloalkyl group may have a substituent, but a cycloalkyl group having no substituent is preferred.

A represents a divalent linking group, and is preferably an alkylene group (e.g., a methylene group, an ethylene group, a propylene group, etc.), a cycloalkylene group (e.g., a cyclohexylene group, a cyclopentylene group, etc.), an arylene group (e.g., a 1,2-phenylene group, a 1,3-phenylene group, a 1,4-phenylene group, a naphthylene group, etc.), an ether group, a carbonyl group, an ester group, an amide group, and combinations thereof, and more preferably an alkylene group, an ether group and combinations thereof.

The compound represented by Formula (c1) is preferably a compound represented by Formula (c2).
Formula (c2)

[Chem. 40]

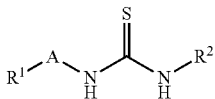

(In Formula (c2), each of $R^1$ and $R^2$ independently represents an alkyl group having 1 to 10 carbon atoms which may be branched, an aryl group which may have a substituent, a cycloalkyl group which may have a substituent, or a morpholino group. A represents a divalent linking group.)

Each of $R^1$, $R^2$ and A has the same meaning as $R^1$, $R^2$ and A in Formula (c1) above, and the preferred range is also the same.

A compound represented by Formula (c1) is more preferably a compound represented by Formula (c3).
Formula (c3)

[Chem. 40]

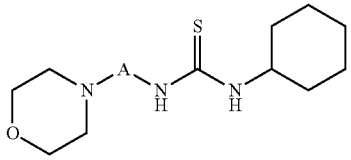

(In Formula (c3), A represents a divalent linking group.)
A has the same meaning as A in F formula (c1) above, and the preferred range is also the same.

The compound represented by Formula (c1) preferably contains in an amount of 0.01 to 2.50% by mass, and more preferably in an amount of 0.03 to of 2.00% by mass, based on the total solid content of the actinic ray-sensitive or radiation-sensitive resin composition. When the content is within this range, it is possible to achieve a high adhesion to the substrate (e.g., an organic semiconductor film) when developed.

[4] Basic Compound

The actinic my-sensitive or radiation-sensitive resin composition (I) of the present invention may contain a basic compound in order to reduce the change of performance by a passage of time from exposure to heating.

The basic compound may preferably include compounds having a structure represented by the following Formulae (A) to (E).

[Chem. 42]

(A)

(B)

(C)

(D)

(E)

In Formulae (A) and (E),
$R^{200}$, $R^{201}$ and $R^{202}$ may be the same as or different from each other, and represent a hydrogen atom, an alkyl group (preferably having 1 to 20 carbon atoms), a cycloalkyl group (preferably having 3 to 20 carbon atoms) or an aryl group (having 6 to 20 carbon atoms). Here, $R^{201}$ and $R^{202}$ may be bonded to each other to form a ring. $R^{203}$, $R^{204}$, $R^{205}$ and $R^{206}$ are the same as or different from each other, and represent an alkyl group having 1 to 20 carbon atoms.

With respect to the alkyl group, the alkyl group having a substituent is preferably an aminoalkyl group having 1 to 20 carbon atoms, a hydroxyalkyl group having 1 to 20 carbon atoms or a cyanoalkyl group having 1 to 20 carbon atoms.

The alkyl group in these Formulae (A) and (E) is more preferably unsubstituted.

Preferred compounds may include guanidine, aminopyrrolidine, pyrazole, pyrazoline, piperazine, aminomorpholine, aminoalkylmorpholine, piperidine and the like. More preferred compounds may include compounds having an imidazole structure, a diazabicyclo structure, an onium hydroxide structure, an onium carboxylate structure, a trialkylamine structure, an aniline structure or a pyridine structure, alkylamine derivatives having a hydroxyl group and/or an ether bond, aniline derivatives having a hydroxyl group and/or an ester group, and the like.

Examples of the compound having an imidazole structure may include imidazole, 2,4,5-triphenyl imidazole, benzimidazole and the like (for example, 2-phenyl-1H-benzimidazole, etc). Examples of the compound having a diazabicyclo structure may include 1,4-diazabicyclo[2,2,2]octane, 1,5-diazabicyclo[4,3,0]nona-5-ene, 1,8-diazabicyclo[5,4,0]undec-7-ene, and the like. Examples of the compound having an onium hydroxide structure may include triaryl sulfonium hydroxide, phenacylsulfonium hydroxide, sulfonium hydroxide having 2-oxoalkyl group, specifically, triphenyl sulfonium hydroxide, tris(t-butylphenyl)sulfonium hydroxide, bis(t-butylphenyl) iodonium hydroxide, phenacyl thiophenium hydroxide, 2-oxopropyl thiophenium hydroxide, and the like. The compound having an onium carboxylate structure is a compound in which an anion moiety in the compound having an onium hydroxide structure is substituted with a carboxylate, and examples thereof may include acetate, adamantane-1-carboxylate, perfluoroalkyl carboxylate and the like. Examples of the compound having a trialkylamine structure may include tri(n-butyl)amine, tri(n-octyl) amine and the like. Examples of the compound having an aniline structure may include 2,6-diisopropylaniline, N,N-dimethylaniline, N,N-dibutyl aniline, N,N-dihexyl aniline and the like. Examples of the alkylamine derivative having a hydroxyl group and/or an ether bond may include ethanolamine, diethanolamine, triethanolamine, tris(methoxyethoxyethyl)amine and the like. Examples of the aniline derivative having a hydroxyl group and/or an ether bond may include N,N-bis(hydroxyethyl)aniline and the like.

Preferred basic compounds may further include an amine compound having a phenoxy group, an ammonium salt compound having a phenoxy group, an amine compound having a sulfonic ester group and an ammonium salt compound having a sulfonic acid ester group.

The amine compound having a phenoxy group, the ammonium salt compound having a phenoxy group, the amine compound having a sulfonate ester group and the ammonium salt compound having a sulfonate ester group, are preferably compounds in which at least one alkyl group is bonded to the nitrogen atom. Also, it is preferred that an oxygen atom is present and an oxyalkylene group is formed in the alkyl chain. The number of oxyalkylene groups is 1 or more, preferably 3 to 9, and more preferably 4 to 6 in the molecule. Among the oxyalkylene group, the structures of —CH$_2$CH$_2$O—, —CH(CH$_3$)CH$_2$O— or —CH$_2$CH$_2$CH$_2$O— is preferred.

Specific examples of the amine compound having a phenoxy group, the ammonium salt compound having a phenoxy group, the amine compound having a sulfonate ester group and the ammonium salt compound having a sulfonate ester group include the compounds (C1-1) to (C3-3) illustrated in [0066] of U.S. Patent Application Publication 200710224539, but the present invention is not limited thereto.

The molecular weight of the basic compound is preferably 250 to 2,000 and more preferably 400 to 1,000. The molecular weight of the basic compound is preferably 400 or more, more preferably 500 or more, and still more preferably 600 or more, from the viewpoint of the further reduction of pattern collapse and the rectangularity of pattern.

The basic compound is either used alone or in combination of two or more thereof.

The amount of the basic compound in the present invention is preferably from 0.001 to 20% by mass and more preferably from 0.01 to 10% by mass, based on the solid content of the actinic ray-sensitive or radiation-sensitive resin composition (I).

The ratio of the acid generator and the basic compound in the composition is preferably an acid generator/basic compound (molar ratio)=2.5 to 300. In other words, the molar ratio is preferably 2.5 or more from the viewpoint of the sensitivity and resolution, and it is preferably 300 or less from the viewpoint of minimizing a reduction in resolution due to thickening of the resist pattern with passage of time until heat treatment after exposure. The acid generator/basic compound (molar ratio) is more preferably from 5.0 to 200, and more preferably from 7.0 to 150.

[5] Solvent

A solvent may be used in preparing the actinic ray-sensitive or radiation-sensitive resin composition of the present invention. Examples of the solvent include organic solvents such as alkylene glycol monoalkyl ether carboxylate, alkylene glycol monoalkyl ether, alkyl lactate ester, alkoxy propionate acid alkyl, cyclic lactone (preferably having 4 to 10 carbon atoms), a monoketone compound optionally having a ring (preferably having 4 to 10 carbon atoms), alkylene carbonate, alkyl alkoxy acetate, and an alkyl pyruvate.

Specific examples of these solvents may include those described in specification [0441] to [0455] of U.S. Patent Application Publication No. 2008/0187860.

In the present invention, a solvent containing a hydroxyl group in the structure, and a mixed solvent mixed with a solvent containing no hydroxyl group may be used as the organic solvent.

The solvent containing a hydroxyl group and the solvent containing no hydroxyl group may be selected from the above exemplified compounds, but the solvent containing a hydroxyl group is preferably an alkylene glycol monoalkyl ether, an alkyl lactate and the like, and more preferably a propylene glycol monomethyl ether (PGME, also called "1-methoxy-2-propanol") and an ethyl lactate. Furthermore, the solvent containing no hydroxyl group is preferably an alkylene glycol monoalkyl ether acetate, an alkyl alkoxy propionate, a monoketone compound which may contain a ring, a cyclic lactone, an alkyl acetate and the like. Among them, a propylene glycol monomethyl ether acetate (PGMEA, also called "1-methoxy-2-acetoxypropane"), an ethyl ethoxy propionate, a 2-heptanone, a γ-butyrolactone, or a cyclohexanone and a butyl acetate are particularly preferred, and a propylene glycol monomethyl ether acetate, an ethyl ethoxypropionate, or a 2-heptanone is most preferred.

The mixing ratio (by mass) of the solvent containing a hydroxyl group and the solvent not containing a hydroxyl group is from 1/99 to 99/1, preferably from 10/90 to 90/10, more preferably from 20/80 to 60/40. A mixed solvent in which a solvent not containing a hydroxyl group is contained in an amount of 50% by mass or more is particularly preferred in view of coating uniformity.

As the solvents, the solvent containing propylene glycol monomethyl ether acetate is preferred, and a single propylene glycol monomethyl other acetate solvent or a mixed solvent consisting of two or more solvents containing propylene glycol monomethyl ether acetate is preferred.

[6] Surfactant

The actinic ray-sensitive or radiation-sensitive resin composition (I) of the present invention may or may not further contain a surfactant. In the case of containing the surfactant, it is more preferred to contain any one of a fluorine- and/or silicon-containing surfactant (a fluorine-containing surfactant, a silicon-containing surfactant, a surfactant containing both a fluorine atom and a silicon atom) or two or more kinds thereof.

When the actinic ray-sensitive or radiation-sensitive resin composition (I) of the present invention contains the surfactant, a resist pattern with good sensitivity, resolution, and adhesion as well as less development defects may be obtained upon use of an exposure light source of 250 nm or less, particularly 220 nm or less.

Examples of the fluorine-containing and/or silicon-containing surfactant include surfactants disclosed in [0276] of U.S. Patent Application Publication No. 200810248425, for example, EFtop EF301 and EF303 (manufactured by Shin-Akita Kasei K.K.); Florad FC430, 431, and 4430 (manufactured by Sumitomo 3M Inc.); Megafac F171, F173, F176, F189, F113, F110, F177, F120 and R08 (manufactured by Dainippon Ink & Chemicals, Inc.), Surflon S-382, SC101, 102, 103, 104, 105, 106, KH-20 (manufactured by Asahi Glass Co., Ltd); Troysol S-366 (manufactured by Troy Chemical); GF-300 and GF-150 (manufactured by Toagosci Chemical Industry Co., Ltd.); Surilon 5-393 (manufactured by Seimi Chemical Co., Ltd.); EFtop EF121, EF122A, EF122B, RF122C, EF125M, EF135M, EF351, EF352, EF801, EF802 and EF601 (manufactured by JEMCO Inc.); PF636, PF656, PF6320 and PF6520 (manufactured by OMNOVA); and FTX-204G, 208G, 218G, 230G, 204D, 208D, 212D, 218D and 222D (manufactured by NEOS Co., Ltd.). In addition, polysiloxane polymer KP-341 (manufactured by Shin-Etsu Chemical Co., Ltd.) may be used as the silicon-containing surfactant.

Other than those known surfactants as described above, a surfactant using a polymer having a fluoro-aliphatic group derived from a fluoro-aliphatic compound which is produced by a telomerization process (also called a telomere process) or an oligomerization process (also called an oligomer process), may be used. The fluoro-aliphatic compound may be synthesized by the method described in Japanese Patent Laid-Open Publication No. 2002-90991.

Examples of the surfactant corresponding to the above may include Megafac F178, F-470, F-473, F-475, F-476, and F-472 (manufactured by Dainippon Ink & Chemicals, Inc.), a copolymer of an acrylate (or methacrylate) having a $C_6F_{13}$ group with a (poly(oxyalkylene)) acrylate (or methacrylate), and a copolymer of an acrylate (or methacrylate) having a $C_3F_7$ group with a d (poly(oxyethylene)) acrylate (or methacrylate) and a (poly(oxypropylene)) acrylate (or methacrylate).

In the present invention, a surfactant other than the fluorine-containing and/or silicon-containing surfactant as described in [0280] of U.S. Patent Application Publication No. 2008/0248425 may also be used.

These surfactants may be used either alone or in combination of two or more thereof.

The actinic ray-sensitive or radiation-sensitive resin composition (I) of the present invention may, or may not, contain a surfactant, but when the actinic ray-sensitive or radiation-sensitive resin composition (I) contains the surfactant, the amount of the surfactant to be used is preferably from 0.0001 to 2% by mass, more preferably from 0.0005 to 1% by mass, based on the total amount of the actinic ray-sensitive or radiation-sensitive resin composition (excluding the solvent).

[7] Other Additives

The actinic ray-sensitive or radiation-sensitive resin composition (I) of the present invention may, or may not, contain a carboxylic acid onium salt. Such carboxylic acid onium salts may include those described in [0605] to [0606] of U.S. Patent Application Publication No. 2008/0187860.

These carboxylic acid onium salts may be synthesized by reacting a sulfonium hydroxide, an iodonium hydroxide, an ammonium hydroxide and a carboxylic acid with a silver oxide in an appropriate solvent.

When the actinic ray-sensitive or radiation-sensitive resin composition (I) contains a carboxylic acid onium salt, the content thereof is generally from 0.1 to 20% by mass, preferably 0.5 to 10% by mass, more preferably from 1 to 7% by mass, based on the total solid content of the actinic ray-sensitive or radiation-sensitive resin composition.

The actinic ray-sensitive or radiation-sensitive resin composition may further contain, as necessary, a dye, a plasticizer, a photosensitizer, a light absorbent, an alkali-soluble resin, a dissolution inhibitor, and a compound (for example, a phenol compound having a molecular weight of 1,000 or less, or an alicyclic or aliphatic compound having a carboxyl group) which accelerates dissolution in a developer.

The phenol compound having a molecular weight of 1,000 or less may be easily synthesized by those skilled in the art with reference to the process described, for example, in Japanese Patent Laid-Open Publication No. H4-122938, Japanese Patent Laid-Open Publication No. H2-28531, U.S. Pat. No. 4,916,210, and European Patent No. 219,294.

Specific examples of the carboxyl group-containing alicyclic or aliphatic compound include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexane carboxylic acid, and cyclohexane dicarboxylic acid.

[Actinic Ray-Sensitive or Radiation-Sensitive Resin Composition (II)]

In the step of the pattern forming method (3) of the present invention, it is preferred to use the above-described actinic ray-sensitive or radiation-sensitive resin composition (I). In the step of the pattern, forming method (3) of the present invention, a resist film may be formed on the protective film, even using the actinic ray-sensitive or radiation-sensitive resin composition (II) containing a conjugated diene polymer or copolymer or a cyclized product thereof, and a crosslinking agent, instead of the actinic ray-sensitive or radiation-sensitive resin composition (I).

By performing pattern exposure of a resist film formed from the actinic ray-sensitive or radiation-sensitive resin composition (II), crosslinking reaction of the conjugated diene polymer or copolymer or a cyclized product thereof and a crosslinking agent is performed in the exposed area.

<1> A Conjugated Diene Polymer or Copolymer (Hereinafter, Called Simply "Conjugated Diene Polymer") or a Cyclized Product Thereof The actinic ray-sensitive or radiation-sensitive resin composition (II) contains a conjugated diene polymer or a cyclized product thereof.

The conjugated diene polymer or a cyclized product thereof is preferably a cyclized product of a conjugated diene polymer.

A cyclized product of the conjugated diene polymer used in the present invention is preferably a cyclized product of a polymer or copolymer having a repeating unit represented by the following Formula in the polymer chain.

[Chem. 43]

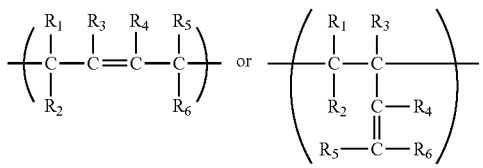

In the formulae,

Each of $R_1$, $R_2$, $R_3$, $R_4$, $R_5$ and $R_6$ independently represents a hydrogen atom, an alkyl group (e.g., an alkyl group having 1 to 5 carbon atoms such as a methyl group, an ethyl group and a propyl group), or an aryl group (e.g., a phenyl group, a naphthyl group, etc.).

Specific examples thereof may include a polymer having a cis-1,4-butadiene unit, a trans-1,4-butadiene unit, a cis-1,4-isoprene unit, a trans-1,4-isoprene unit, a cis-1,4-pentadiene unit, a trans-1,4-pentadiene unit, a 1,4-diphenyl butadiene unit, a 1,2-butadiene unit, a 3,4-isoprene unit, a 1,2-pentadiene unit, a 3,4-diphenyl butadiene unit, etc., or a cyclized product of a copolymer having a conjugated diene unit and an unsaturated compound unit thereof, for example, a vinyl aromatic compound unit such a styrene unit, a α-methyl styrene unit or a p-methyl styrene unit, an olefin compound unit such as an ethylene unit, a propylene unit or an isobutylene unit. Of course, a cyclized product of natural rubber may also be used.

The process for producing a cyclized product of the conjugated diene polymer used in the present invention may be obtained, for example, but is not particularly limited to, by contacting and oxidizing a conjugated diene polymer with a fluorine-containing substituted sulfonic acid compound represented by the following formula:

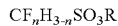

(wherein, R is a hydrogen atom, an alkyl group or $CF_nH_3$-$nSO_2$, and n is 1, 2 or 3), in an inert solvent as disclosed in Japanese Patent Laid-Open Publication No. S60-57584 and Japanese Patent Laid-Open Publication No. S57-44682.

Examples of the fluorine-containing substituted sulfonic acid compound is preferably trifluoromethanesulfonic acid, or an acid anhydride thereof, methyl ester, ethyl ester or acid chloride, etc. and particularly preferably trifluoromethanesulfonic acid.

The conjugated diene-based polymer is first dissolved in an inert solvent, and then cyclized in contact with the fluorine-containing substituted sulfonic acid compound, but the solvent used in the course of preparing a cyclized product may include preferably an inert hydrocarbon (e.g., pentane, hexane, heptanone, benzene, toluene, xylene, etc.), an inert halogenated hydrocarbon (e.g., methylene dichloride, chlorobenzene, etc.).

These solvents are preferably the form of a mixture of two or more from the viewpoint of coatability.

The amount of the fluorine-containing substituted sulfonic acid compound used to prepare a cyclized product, is preferably molar ratio of 1/6000 to 1/10 and more preferably 1/5000 to 1/20, per repeating unit of the conjugated diene based polymer.

The cyclization reaction is usually carried out at a temperature in the range of 40° C. to boiling point under atmospheric pressure, but it may be carried out under pressure. For example, when the solvent is xylene, the reaction is usually carried out at a temperature of 60 to 120° C. under normal pressure. Further, this cyclization reaction is a very fast reaction, and it is considered that the reaction is almost completed immediately after addition of the catalyst. Usually, the cyclization rate thereof is not substantially changed either after 10 minutes or after 1 hour.

The cyclization ratio of the cyclized product of conjugated diene based polymer used in the present invention is, but is not particularly limited to, preferably 50% or more, more preferably from 50 to 95%, still more preferably from 60 to 75%.

In addition, the cyclization rate is a value (%) which measures the peak areas of protons derived from double bonds before and after the cyclization reaction of the conjugated diene-based polymer used as a raw material using $^1$H-NMR spectrum analysis, finds the ratio of the amount of protons derived from double bonds remaining in the cyclized product after the cyclization reaction in the case of deeming the amount of protons derived from double bonds before the cyclization reaction as 100, and then represents in accordance with the calculation formula (100–"ratio of the amount of protons derived from double bonds remaining during cyclization reaction").

The weight average molecular weight (Mw) of the conjugated diene-based polymer or a cyclized product thereof is, but is not particularly limited to, preferably from 10,000 to 280,000, more preferably from 10,000 to 100,000, in terms of polystyrene by GPC method.

The polydispersity (weight average molecular weight/number average molecular weight) is not particularly limited, but it is preferably 1.9 or less.

The GPC method is based on the method which uses HLC-8020GPC (manufactured by Tosoh Corporation), TSKgel SuperHZM-H, TSKgel SuperHZ4000, TSKgel SuperHZ2000 (manufactured by Tosoh Corporation, 4.6 mmID×15 cm) as a column, and THF (tetrahydrofuran) as an eluent.

The conjugated diene-based polymer or a cyclized product thereof may be used either alone or as a mixture of two or more thereof.

The content of the conjugated diene-based polymer or a cyclized product thereof is preferably from 30 to 99% by mass, more preferably from 60 to 95% by mass, and still more preferably from 70 to 90% by mass, based on the total solid content of the active ray-sensitive or radiation-sensitive resin composition (II).

<2> Crosslinking Agent

The crosslinking agent is a compound capable of crosslinking the aforementioned conjugated diene polymer or a cyclized product thereof, and includes a compound capable of crosslinking the aforementioned conjugated diene-based polymer or a cyclized product thereof upon radiation of with an actinic ray or radiation or by an action of a radical or acid. The crosslinking agent capable of crosslinking the aforementioned conjugated diene polymer or a cyclized product thereof upon radiation with an actinic ray or radiation is preferred.

The crosslinking agent is preferably an azide compound, and more preferably a diazide compound (a bisazide compound).

Specific examples of the aromatic azide compound may include a azide benzene, a 4,4'-diazide diphenyl (also called a p-phenylene-bisazide), an azide anisole, an azide nitrobenzene, an azide dimethylaniline, a diazideobenzophenone (for example, a 4,4'-diazide benzophenone), a diazide diphenyl methane (for example, a 4,4'-diazide diphenylmethane), a diazide diphenyl ether, a diazide diphenyl sulfone, a diazide diphenyl sulfide, a di diazide stilbene (for example, a 4,4'-diazide stilbene), an azide chalcone, a diazide chalcone (for example, a 4,4'-diazide chalcone), a diazide benzalacetone, a 2,6-diazide benzal)cyclohexanone, a 2,6-di(azide benzal)-4-methyl cyclohexanone, a 3-(4-(p-1-azide phenyl)-1,3-butadienyl)-5,5-dimethyl-2-cyclohexane-1-one and the like.

The crosslinking agent may also include the compound as described in U.S. Pat. No. 2,940,853.

The content of the crosslinking agent is preferably from 0.01 to 15% by mass, more preferably from 0.1 to 10% by mass, still more preferably from 0.5 to 5% by mass, based on the total solid content of the active ray-sensitive or radiation-sensitive resin composition (II).

The crosslinking agent used in the present invention may be used in combination of two or more thereof, as necessary.

<3> Polymerization Initiator

The actinic ray-sensitive or radiation-sensitive resin composition (II) may also contain a polymerization initiator. This makes it possible to accelerate the crosslinking reaction of the photosensitive crosslinking agent.

The polymerization initiator may use, for example, a thermal polymerization initiator, but it is preferred to use a photopolymerization initiator. As the photopolymerization initiator, for example, a compound that generates a radical or an acid by ultraviolet or visible light may be used. Examples of the photopolymerization initiator may include benzoin, benzyl methyl ketal, benzophenone, biacetyl, acetophenone, Michler ketone, benzyl, benzyl isobutyl ether, tetramethyl thiuram mono(di)sulfide, 2,2-azobisisobutyronitrile, 2,2-azobis-2,4-dimethylvaleronitrile, benzoyl peroxide, di-tert-butyl peroxide, 1-hydroxy cyclohexyl phenyl ketone, 2-hydroxy-2-methyl-1-phenyl-propan-1-one, 1-(4-isopropylphenyl)-2-hydroxy-2-methylpropan-1-one, thioxanthone, 2-chlorothioxanthone, 2-methylthioxanthone, 2,4-diethylthioxanthone, methyl benzoylformate, 2,2-diethoxyacetophenone, β-aionon, β-bromostyrene, diazoaminobenzene, α-amylcinnacmic aldehyde, p-dimethylaminoacetophenone, p-dimethylaminopropiophenone, 2-chlorobenzophenone, p,p'-dichlorobenzophenone, p,p'-bisdiethylaminobenzophenone, benzoin ethylether, benzoin isopropyl ether, benzoin n-propylether, benzoin n-butyl ether, diphenyl sulfide, bis(2,6-methoxybenzoyl)-2,4,4-trimethyl-pentyl phosphine oxide, 2,4,6-trimethyl benzoyl diphenyl-phosphine oxide, bis(2,4,6-trimethylbenzoyl)-phenyl phosphine oxide, 2-methyl-1 [4-(methylthio)phenyl]-2-morpholino propan-1-one, 2-benzyl-2-dimethylamino-1-(4-morpholinophenyl)-butane-1-one, anthracene benzophenone, α-chloroanthraquinone, diphenyl disulfide, hexachloroethane butadiene, pentachloro butadiene, octachlorobutene, 1-chloromethyl naphthalene, 1,2-octanedione, carbazole oxime compounds such as 1-[4-(phenylthio)-2-(o-benzoyloxime)] or 1-[9-ethyl-6-(2-methylbenzoyl)-9H-carbazol-3-yl]ethanone 1-(o-acetyloxime), (4-methylphenyl)[4-(2-methylpropyl)phenyl]iodonium hexafluorophosphate, 3-methyl-2-butynyl tetramethyl sulfonium hexafluoroantimonate, diphenyl-(p-phenylthiophenyl)sulfonium hexafluoroantimonate and the like.

The polymerization initiator used in the present invention may be added in combination of two or more of the above compounds, as necessary.

The actinic ray-sensitive or radiation-sensitive resin composition (II) may or may not contain a polymerization initiator, but, in the case of containing the initiator, the total content of the polymerization initiator (in the case of containing two or more, the sum thereof), the content of the polymerization initiator (in the case of containing two or more, the sum thereof) is preferably from 0.01 to 50% by mass, more preferably from 0.1 to 20% by mass, and most preferably from 0.5 to 10% by mass, based on the total solid content of the actinic ray-sensitive or radiation-sensitive resin composition (II).

<4> Solvent

The actinic ray-sensitive or radiation-sensitive resin composition (II) preferably contains a solvent (usually, an organic solvent). The solvent is not particularly limited basically if the solubility or coatability of each component is satisfied.

The organic solvent may preferably include an inert hydrocarbon (for example, pentane, hexane, heptanone, benzene, toluene, xylene, etc.), an inert halogenated hydrocarbon (for example, methylene dichloride, chlorobenzene, etc.).

The solvent is also preferably used in a form of a mixture of two or more, from the viewpoint of coatability.

The content of the solvent in the actinic ray-sensitive or radiation-sensitive resin composition (II) is the amount wherein the total solid concentration of the actinic ray-sensitive or radiation-sensitive resin composition (II) is preferably from 3 to 60% by mass, more preferably from 5 to 50% by mass and particularly preferably from 8 to 40% by mass, from the viewpoint of coatability.

<5> Colorant

The actinic ray-sensitive or radiation-sensitive resin composition (II) may contain a colorant. The colorant includes a dye or a pigment. The dye is preferred from the viewpoint of effect.

The colorant such as a dye or a pigment acts as a sensitizing dye. The sensitizing dye can increase the crosslinking reaction of the photosensitive crosslinking agent.

As a colorant such as a dye or a pigment, Naphthalazine (1,2-bis(1-naphthylmethylene)hydrazine), p-hydroxy-p-dimethylamino azobenzene, Paris Fast Yellow (manufactured by Orient Chemical Co., Ltd.), Sumiplast Yellow (manufactured by Sumitomo Chemical Co., Ltd.), macro lettuce yellow (manufactured by Bayer), Seres Blue GN01 (manufactured by Bayer), "hosta looks KCB" (trade name, manufactured by Clariant Japan), "OB-1" (trade name, manufactured by Eastman Company), "OB" (trade name, manufactured by Ciba Specialty Chemicals Inc.), "TBO" (trade name, manufactured by Sumitomo Seika. Chemicals Company), "Keycall" (trade name, manufactured by Nippon Soda Co., Ltd.), "Kayalight", "Kayaset yellow" and "Kaya Kuril rhodamine FB" (trade name, manufactured by Nippon Kayaku. Co., Ltd.), "Lumogen F Ywllow083", "Lumogen F Ywllow170", "Lumogen F Orange240", "Lumogen F Pink285", "Lumogen F Red305", "Lumogen F Violet570", "Lumogen F Blue650" and "Lumogen F Green850" (trade name, manufactured by BASF), "FZ-2801", "FZ-2802", "FZ-2803", "FZ-2817", "FZ-2808", "FZ-SB", "FZ-5009", "FX-301", "FX-303", "FX-307" and "FX-327" (trade name, by manufactured by Sinloihi Co., Ltd.), "LQ-19", "ZQ-18", "ZQ-19", "IPO-13", "IPO-18", "IPO-19", "NX-13", "GPL-11", "GPL-13", "Z-11" and "Z-13" (trade name, manufactured by Deiguro company), and "Rhodamine B lake" (trade name, manufactured by Inagawa. Pigment, Inc) are commercially available.

As the oil colorant, for example, Oil Red SST extra, Oil Red 5B, Color Mate Blue, Blue SS, Oil Yellow, Yellow SS (all of the above, manufactured by Shirado Chemistry) may be used, but it is not limited thereto. In addition, an azo-based dye compound, an azo metal-based dye compound, a compound such as fluorescent whitening agent for general fibers may be used.

The colorant may be used either alone or in combination of two or more thereof.

The actinic ray-sensitive or radiation-sensitive resin composition (II) may, or may not, contain a colorant. However, in the case of containing the colorant, the content of the colorant is preferably from 0.01 to 10% by mass, more preferably from 0.05 to 5% by mass, and most preferably from 0.1 to 1% by mass, based on the total solid content of the actinic ray-sensitive or radiation-sensitive resin composition (II).

<6> Antioxidant

The actinic ray-sensitive or radiation sensitive resin composition (II) may contain an antioxidant in order to prevent oxidation of a crosslinking resin and the like.

For example, the antioxidant may include a phenol-based antioxidant, a phosphorus-based antioxidant, a sulfur-based antioxidant and the like.

Specific examples of the phenol-based antioxidant may include 2,6-di-t-butyl-4-methylphenol, n-octadecyl-3-(3',5'-di-t-butyl-4'-hydroxyphenyl) propionate, tetrakis[methylene-3-(3,5-di-t-butyl-4-hydroxyphenyl)propionate]methane, tris(3,5-di-t-butyl-4-hydroxybenzyl) isocyanurate, 4,4'-butylidenebis-(3-methyl-6-t-butylphenol), triethylene glycol-bis[3-(3-t-butyl-4-hydroxy-5-methylphenyl)propionate], 3,9-bis{2-[3-(3-t-butyl-4-hydroxy-5-methylphenyl)propionyloxy]-1,1-dimethylethyl}-2,4,8,10-tetraoxaspiro[5,5]undecane, and the like.

Examples of commercially available phenol-based antioxidants may include Irganox 1010, Irganox 1035, Irganox 1076, Irganox 1135, Irganox 245, Irganox 259, Irganox 295 and Irganox 3114 (all of the above, manufactured by BASF), ADEKA STAB AO-20, ADEKA STAB AO-30, ADEKA STAB AO-40, ADEKA STAB AO-50, ADEKA STAB AO-60, ADEKA STAB AO-70, ADEKA STAB AO-80, ADEKA STAB AO-90, and ADEKA STAB AO-330 (all of the above, manufactured by ADEKA Corporation), Sumilizer BHT, Sumilizer BP-101, Sumilizer GA-80, Sumilizer MDP-S, Sumilizer BBM-S, Sumilizer GM, Sumilizer GS (F) and Sumilizer GP (all of the above, manufactured by Sumitomo Chemical Company), HOSTANOX O10, HOSTANOX O16, HOSTANOX O14, and HOSTANOX O3 (all of the above, manufactured by Clariant Japan), Antage BHT, Antage W-300, Antage W-400, and Antage W500 (all, manufactured by Kawaguchi Chemical Industry Co., Ltd.), and SEENOX 224M, and SEENOX 326M (all of the above, manufactured by Cipro Kasei Co., Ltd.), Yoshinox BHT, Yoshinox BB, Tominox TT, Tominox 917 (all of the above, manufactured by Yoshitomi also Ltd.), TTHP (manufactured by Toray Industries Inc.), and the like.

Specific examples of the phosphorus-based antioxidant may include tris nonylphenyl phosphite, tris(2,4-di-t-butylphenyl)phosphite, distearyl pentaerythritol diphosphite, bis (2,4-di-t-butylphenyl)pentaerythritol phosphite, bis(2,6-di-t-butyl-4-methylphenyl)pentaerythritol phosphite, 2,2-methylenebis(4,6-di-t-butylphenyl)octyl phosphite, tetrakis (2,4-di-t-butylphenyl)-4,4-biphenylene-di-phosphonite and the like. Examples of commercially available phosphorus-based antioxidant include ADEKA STAB 1178 (manufactured by Asahi Denka Co., Ltd.), Sumilizer TNP (manufactured by Sumitomo Chemical Company), JP-135 (manufactured by Johoku Chemical Co., Ltd.), ADEKA STAB 2112 (manufactured by Asahi Denka Co., Ltd.), JPP-2000 (manufactured by Johoku Chemical Co., Ltd.), Weston 618 (manufactured by GE Co., Ltd.), ADEKA STAB PEP-24G (manufactured by Asahi Denka Co., Ltd.), ADEKA STAB PEP-36 (manufactured by Asahi Denka Co., Ltd.), ADEKA STAB HP-10 (manufactured by Asahi Denka Co., Ltd.), SandstabP-EPQ (manufactured by Sand Co., Ltd.), Phosphite 168 (manufactured by Ciba Specialty Chemicals Co., Ltd.), and the like.

Specific examples of the sulfur-based antioxidant may include dilauryl-3,3'-thiodipropionate, dimyristyl-3,3'-thiodipropionate, distearyl-3,3'-thiodipropionate, pentaerythritol tetrakis(3-laurylthiopropionate) and the like. Examples of commercially available sulfur-based antioxidant include Sumilizer TPL (manufactured by Sumitomo Chemical Co., Ltd.), Yoshinox DLTP (manufactured by Yoshitomi Pharmaceutical Co., Ltd.), Antiox L (manufactured by NOF Corporation), Sumilizer TPM (manufactured by Sumitomo Chemical Co., Ltd.), Yoshinox DMTP (manufactured by Yoshitomi Pharmaceutical Co., Ltd.), Antiox. M (manufactured by NOF Corporation), Sumilizer TPS (manufactured by Sumitomo Chemical Co., Ltd.), Yoshinox DSTP (manufactured by Yoshitomi Pharmaceutical Co., Ltd.), Antiox S (manufactured by NOF Corporation), ADEKA STAB AO-412S (manufactured by Asahi Denka Co., Ltd.), SEENOX 412S (manufactured by Shipro Kasei Sumilizer TDP (manufactured by Sumitomo Chemical Co.), and the like.

The content of the antioxidant is preferably from about 0.01 to about 5% by mass, based on the total solid content of the actinic ray-sensitive or radiation-sensitive resin composition (II).

The antioxidant used in the present invention may be used in combination of two or more thereof, as necessary.

<7> Surfactant

The actinic ray-sensitive or radiation-sensitive resin composition (II) may contain various kinds of surfactants from the viewpoint of improving the coatability. Specific examples, preferred examples and the amount of the surfactant are the same as specific examples, preferred examples and the amount of the surfactant described above with regard to the actinic ray-sensitive or radiation-sensitive resin composition (I).

As the actinic ray-sensitive or radiation-sensitive resin composition (II), for example, commercially available products such as OMR-83 (trade name, manufactured by Tokyo Ohka Kogyo Co.), Way Coat (trade name, manufactured by Hunt Chemical Company), and KMR (trade name, manufactured by Kodak Company).

[Resist Film]

The actinic ray-sensitive or radiation-sensitive resin compositions (I) or (II) of the present invention is preferably used in a film thickness of 30 to 2000 nm, more preferably in a film thickness of 30 to 1500 nm, still more preferably in a film thickness of 100 to 1000 nm and particularly preferably in a film thickness of 100 to 500 nm, from the viewpoint of enhancement of the resolving power. The solid content concentration in the composition (I) or (II) is set within an appropriate range to impart a proper viscosity and improve a coatability and a film forming property, thereby leading to such film thickness.

The solid content concentration of the actinic ray-sensitive or radiation-sensitive resin compositions (I) or (II) of the present invention is usually form 1.0 to 15% by mass, preferably from 1.5 to 13% by mass, and still more preferably from 2.0 to 12% by mass. When the solid content concentration is within the above range, the resist solution may be uniformly coated on the protective film, further a high resolution and rectangular profile may be obtained, and a resist pattern with an excellent etching resistance may be formed.

The solid content concentration refers to a weight percentage of the weight of the other resist components except solvent based on the total weight of the resin composition.

The actinic ray-sensitive or radiation-sensitive resin composition (I) or (II) of the present invention is used by dissolving the above-described components in a predetermined organic solvent, preferably a mixed solvent described hereinbefore, after filtering through a filter, coating the obtained solution on the above-described protective film. The filter to be used for the filtration is made of polytetrafluoroethylene, polyethylene or nylon, having a pore size of 0.1 μm or less, more preferably 0.05 μm or less, more preferably 0.03 μm or less. The filtration may be carried out either by way of a circular filtration or by connecting a plurality of types of filters in series or in parallel, for example, as described in Japanese Patent Laid-Open Publication No. 2002-62667. Also, the composition may be filtered several times. Furthermore, before and after filtration through filter, deaeration of the composition may be performed.

In the pattern forming method of the present invention, the exposure step (4) may be included multiple times.

Exposure in the step (4) may be an immersion exposure.

In the pattern forming method of the present invention, the step (3) of forming the resist film with the actinic ray-sensitive or radiation-sensitive resin composition (I) or (II) on the protective film, the step (4) of exposing the resist film, and the development steps (5) and (6) may be carried out by methods which are generally known.

In the pattern forming method of the present invention, the heating process may be included multiple times.

After the film-forming, prior to the exposure step (4), it is also preferred to include the pre-baking step (PB).

Also, after the exposure step (4) and before the development step (5), it is also preferred to include a post-exposure baking step (PEB).

Both PB and PEB is preferably carried out at the baking temperature of 70 to 150° C., and more preferably at the temperature of 80 to 140° C.

Baking time is preferably 30 to 300 seconds, more preferably 30 to 180 seconds, and still more preferably 30 to 90 seconds.

Baking may be performed by means that are provided in the normal exposure and development apparatus, and may be performed using a hot plate or the like.

The reaction of the exposed portion is promoted by the baking, and the sensitivity or pattern profile is also improved.

Although there is no limitation to the light source wavelength which is used for the exposure apparatus according to the present invention, examples thereof include an infrared light (IR), a visible light, an ultraviolet light (UV), a far ultraviolet light, an extreme ultraviolet light, a X-ray, an electron beam, etc., preferably 500 nm or less, more preferably 400 nm or less, specifically, i-ray (365 nm), g-ray (436 nm), KrF excimer laser (248 nm), ArF excimer laser (193 nm), $F_2$ excimer laser (157 nm), X-ray, EUV (13 nm), an electron beam or the like, and more preferably i-ray (365 nm).

As the developer in the step (5) for forming a resist pattern of the negative type in developing the resist film by using a developer containing an organic solvent (hereinafter, also called an organic developer), ketone-based solvents, ester-based solvents, alcohol-based solvents, amide-based solvents, polar solvents such as ether-based solvents and hydrocarbon-based solvents may be used.

Examples of the ketone-based solvents may include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methyl cyclohexanone, phenyl acetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate and the like.

Examples of the ester-based solvents may include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate and the like.

Examples of the alcohol-based solvent may include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, n-decanol, or glycol-based solvents such as ethylene glycol, diethylene glycol, triethylene glycol, or glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, methoxymethyl butanol and the like.

Examples of the ether solvents may include, in addition to the glycol ether-based solvents, dioxane, tetrahydrofuran and the like.

As the amide-based solvent, for example, N-methyl-2-pyrrolidone, N, N-dimethylacetamide, N,N-dimethylformamide, hexamethylphosphoric triamide, 1,3-dimethyl-2-imidazolidinone and the like may be used.

Examples of the hydrocarbon-based solvents may include aromatic hydrocarbon-based solvents such as toluene or xylene, aliphatic hydrocarbon-based solvents such as pentane, hexane, octane and decane.

The above-described solvents may be used by mixing a plurality of solvents, and may be used by mixing a solvent or water other than those described above. However, in order to sufficiently show the effect of the present invention, the moisture content of the whole developer is preferably less than 10% by mass, and more preferably contains substantially no moisture.

That is, the amount of the organic solvent for the organic developer is preferably 90% by mass or more and 100% by mass or less, and more preferably 95% by mass or more and 100% by mass or less, based on the total amount of the developer.

In particular, the organic developer is preferably a developer containing at least one organic solvent selected from the group consisting of a ketone-based solvent, an ester-based solvent, an alcohol-based solvent, an amide-based solvent and an ether-based solvent.

The vapor pressure of the organic developer at 20° C. is preferably 5 kPa or less, more preferably 3 kPa or less, and particularly preferably 2 kPa or less. By setting the vapor pressure of the organic developer to 5 kPa or less, it is possible to suppress evaporation on the substrate of the developer or on the developing cup and improve a temperature uniformity in the wafer plane, thereby improving a dimensional uniformity in the wafer plane.

Specific examples of the organic developer having the vapor pressure of 5 kPa or less may include ketone-based solvents such as 1-octanone, 2-octanone, 1-nonanone, 2-nonanone, 2-heptanone (methyl amyl ketone), 4-heptanone, 2-hexanone, diisobutyl ketone, cyclohexanone, methyl cyclohexanone, phenyl acetone, methyl isobutyl ketone, ester-based solvents such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxy butyl acetate, butyl formate, propyl formate, ethyl lactate, butyl lactate, or propyl lactate, alcohol-based solvents such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, or n-decanol, glycol-based solvents such as ethylene glycol, diethylene glycol, or triethylene glycol, glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monomethyl ether, or methoxymethyl butanol, ether-based solvents such as tetrahydrofuran, amide solvents such as N-methyl-2-pyrrolidone, N,N-dimethylacetamide, N,N-dimethylformamide, aromatic hydrocarbon-based solvents such as toluene or xylene, aliphatic hydrocarbon-based solvents such as octane or decane.

Specific examples of the organic developer particularly having a vapor pressure of 2 kPa or less which is in a particular preferable range may include ketone-based solvents such as 1-octanone, 2-octanone, 1-nonanone, 2-nonanone, 4-heptanone, 2-hexanone, diisobutyl ketone, cyclohexanone, methyl cyclohexanone, phenyl acetone, ester-based solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxy propionate, 3-methoxybutyl acetate, 3-methyl-3-methoxybutyl acetate, ethyl lactate, butyl lactate, alcohol-based solvents such as n-butyl alcohol, sec-butyl alcohol, tert-butyl alcohol, isobutyl alcohol, n-hexyl alcohol, n-heptyl alcohol, n-octyl alcohol, n-decanal, glycol based solvents such as ethylene glycol, diethylene glycol, triethylene glycol or, glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monomethyl ether, methoxymethyl butanol, amide-based solvents such as N-methyl-2-pyrrolidone, N,N-dimethylacetamide, N,N-dimethylformamide, aromatic hydrocarbon-based solvents such as xylene, and aliphatic hydrocarbon solvents such as octane or decane.

To the organic developer, an appropriate amount of the surfactant may be added, as necessary.

The surfactants are not particularly limited, but, for example, ionic or non-ionic fluorine-containing and/or silicon-containing surfactants may be used Examples of the fluorine-containing and/or silicon-containing surfactants include surfactants as disclosed in Japanese Patent. Laid-Open Publication No. S62-36663, Japanese Patent Laid-Open Publication No. S61-226746, Japanese Patent Laid-Open Publication No. S61-226745, Japanese Patent Laid-Open Publication No. S62-170950, Japanese Patent Laid-Open Publication No. S63-34540, Japanese Patent Laid-Open Publication No. H7-230165, Japanese Patent Laid-Open Publication No. H8-62834, Japanese Patent Laid-Open Publication No. H9-54432, Japanese Patent Laid-Open Publication No. H9-5988, U.S. Pat. Nos. 5,405,720, 5,360,692, 5,529,881, 5,296,330, 5,436,098, 5,576,143, 5,294,511 and 5,824,451. The non-ionic surfactant is preferred. The non-ionic surfactant is not particularly limited, but it is more preferred to use a fluorine-containing surfactant or a silicon-containing surfactant.

The amount of the surfactant used is usually from 0.001 to 5% by mass, preferably from 0.005 to 2% by mass, and more preferably from 0.01 to 0.5% by mass, based on the total amount of the developer.

Further, the organic developer may contain a basic compound in an appropriate amount as necessary. Examples of the basic compound may include those described above in the section of the basic compound.

Examples of the development method include a dipping method which immerses the substrate in a container filled with the developer for a given time (a dipping method), a paddle method that allows the developer to be present on the surface of the substrate due to surface tension for a given time (a paddle method), a spraying method which sprays the developer on the surface of the substrate (a spraying method), a dynamic dispensing method that discharges the developer to the substrate that is rotated at a certain speed while scanning with a developer discharging nozzle at a constant speed (a dynamic dispensing method), and the like.

When the above-described various development methods include a step of discharging the developer toward a resist film from a developing nozzle of the developing device, the discharge pressure of the discharged developer (a flow rate per unit area of the discharged developer) is preferably 2 mL/sec/mm$^2$ or less, more preferably 1.5 mL/sec/mm$^2$ or less, and still more preferably at 1 mL/sec/mm$^2$ or less. The lower limit of the flow rate is not particularly set, but 0.2 mL/sec/mm$^2$ or more is preferred in view of the throughput.

When the discharge pressure of the developer discharged is within the range described above, it is possible to significantly reduce the defects in the pattern derived from the resist residue after development.

Although details of this mechanism are not clear, perhaps, it is believed that, when the discharge pressure is within the above range, it suppresses the developer from decreasing the pressure applied to the resist film, and also suppresses the resist film and the resist pattern from scraping or collapsing inadvertently.

Furthermore, the discharge pressure (mL/sec/mm$^2$) of the developer is a value for the development nozzle exit present in the developing device.

The method for adjusting the discharge pressure of the developer include, for example, a method for adjusting the discharge pressure of the pump, etc., or a method for adjusting and changing the pressure in the supply from the pressure tank.

Also, after the step of the development using a developer containing an organic solvent, it is possible to perform a step of stopping the development while replacing the other solvent.

After the step of the development using a developer containing an organic solvent, it is preferred to include a step of cleaning with a rinsing liquid.

As the rinsing liquid used in the rinsing step after the step of development using a developer containing an organic solvent, it is not particularly limited unless the resist pattern is dissolved. It is possible to use a solution containing a general organic solvent. As the rinsing liquid, it is preferred to use a rinsing solution containing at least one organic solvent selected from the group consisting of a hydrocarbon-based solvent, a ketone-based solvent, an ester-based solvent, an alcohol-based solvent, an amide-based solvent and an ether-based solvent.

Specific examples of the hydrocarbon-based solvent, ketone-based solvent, ester-based solvent, alcohol-based solvent, amide-based solvent and ether-based solvent may be the same ones described with regard to the developer containing an organic solvent.

After the step of the development using a developer containing an organic solvent, it is more preferred to perform a step of washing with a rinsing liquid containing at least one organic solvent selected from the group consisting of a ketone solvent, an ester solvent, an alcohol solvent and an amide solvent. It is still more preferred to perform a step of washing with a rinsing liquid containing alcohol solvents or ester solvents. It is particularly preferred to perform the step of washing with a rinsing solution containing a monohydric alcohol. It is most preferred to perform a step of washing with a rinsing solution containing a monohydric alcohol having 5 or more carbon atoms.

Here, the monohydric alcohol used in the rinsing step includes a straight, branched or cyclic monohydric alcohols, specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol or the like. Particularly preferred monohydric alcohols having 5 or more carbon atoms, 1-hexanol, 2-hexanol, 4-methyl-2-pentanol, 1-pentanol, 3-methyl-1-butanol and the like may be used.

Each component may be mixed with two or more, or it may be mixed and used with an organic solvent other than the above.

The water content in the rinsing solution is preferably 10% by mass or less, more preferably 5% by mass or less, particularly preferably 3% by mass or less. When the water content is 10% by mass or less, it is possible to obtain good development characteristics.

The vapor pressure of the rinsing liquid used after the step of development using a developer containing an organic solvent at 20° C. is preferably 0.05 kPa or more and 5 kPa or less, more preferably 0.1 kPa or more and 5 kPa or less, most preferably 0.12 kPa or more and 3 kPa or less. When the vapor pressure of the rinsing liquid is 0.05 kPa or more and 5 kPa or less, it is possible to improve a temperature uniformity in the wafer plane, and further suppress swelling due to the penetration of the rinsing liquid and improve a dimensional uniformity in the wafer plane.

The rinsing liquid can also be used by adding the surfactant in an appropriate amount.

In the rinsing step, the wafer which performed the development with a developer containing an organic solvent is washed with a rinsing solution containing the above-described organic solvent. The method for washing is not particularly limited, but for example, a method that discharges the developer to the substrate that is rotated at a certain speed while scanning with a developer discharge nozzle at a constant speed (a rotation coating method), a method which immerses the substrate in a container filled with the rinsing liquid for a given time (a dipping method), a method which sprays the rinsing liquid on the surface of the substrate (a spraying method), and the like may be applied. Among them, it is preferred to perform the washing with the rotation coating method and rotate the substrate after the washing at a rotational speed of 2,000 rpm to 4,000 rpm to remove the rinsing liquid on the substrate. It is also preferred to include a baking step (Post Bake) after the rinsing step. The developer and rinsing solution remaining between patterns and inside pattern are removed by baking. The baking process after the rinse step is usually performed at 40 to 160° C., preferably at 70 to 95° C. for 10 seconds to 3 minutes, preferably for 30 to 90 seconds.

In the pattern forming method of the present invention, a negative resist pattern is formed on the resist film in the step (5) and then a pattern is formed on the above-mentioned protection film by using water as the developer and using the resist pattern as a mask pattern in the step (6).

Water used as a developer is preferably pure water. When other ingredients (e.g., alkali) are contained, a substrate or a film such as an organic semiconductor film formed on the substrate is contaminated and thus there is a risk of reducing functionality.

In the pattern forming method of the present invention, a pattern is formed on the organic semiconductor film by using the resist and the protection film pattern as a mask using a dry or wet etching in the step (7).

Further, according to the step (8), the resist pattern is removed using a peeling solution containing an organic solvent and further a protective film pattern is removed using water.

The peeling solution containing an organic solvent is preferably a peeling solution at least one organic solvent selected from the group consisting of alcohol-based solvents, ether-based solvents and hydrocarbon-based solvents, Also, the peeling solution containing an organic solvent may contain water.

[Electronic Device]

The invention, also relates to a method for manufacturing an electronic device, including the pattern forming method of the present invention and to an electronic device manufactured by this method.

The electronic device of the present invention is a device appropriately attached to electrical and electronic equipment (home appliances, OA media-related equipment, optical device and communication device, etc.).

Here, the electronic device is a device which contains a semiconductor and have two or more electrodes and which control an electric current or voltage flowing between the electrodes with electrical, optical, magnetic, chemical materials and the like, or a device which generates light or electric field, magnetic field and the like by the applied voltage or current. Examples thereof include organic photoelectric conversion devices, organic field effect transistors, organic electroluminescence devices, gas sensors, organic rectifier devices, organic inverters, information recording element and the like. The organic photoelectric conversion element may be used in any optical sensor applications and energy conversion applications (solar cells). Among these, preferably an organic field-effect transistor, organic photoelectric conversion element, or an organic electroluminescent device, more preferably an organic field-effect transistor, or an organic photoelectric conversion element, particularly preferably an organic field-effect transistor may be used.

EXAMPLES

Hereinafter, the present invention will be described in more detail with reference to Examples, but the present invention is not intended to be limited to the Examples below. Unless specified otherwise, "parts" and "%" are per mass.

Examples 1-5 and Comparative Examples 1 to 3

[Preparation of the Resin Composition for Forming a Protective Film]

The components shown in Table 1 were dissolved in water (and a mixed solvent) to prepare an aqueous solution for each component, and a resin composition for forming a protective film was prepared. The solid content concentration of each resin composition was adjusted appropriately in a range of 2 to 14% by mass.

[Table 1]

TABLE 1

|  | Resin | | | | Additive | | Water | Solvent | |
| --- | --- | --- | --- | --- | --- | --- | --- | --- | --- |
|  | Kind | Content (g) | Kind | Content (g) | Kind | Content (g) | Content (g) | Kind | Content (g) |
| Composition 1 | A1 | 14.1075 | A3 | 0.7425 | C1 | 0.15 | 85 | — | — |
| Composition 2 | A1 | 10.395 | A3 | 4.455 | C1 | 0.15 | 85 | — | — |
| Composition 3 | A1 | 14.1075 | A3 | 0.7425 | C2 | 0.15 | 84.5 | G4 | 0.5 |
| Composition 4 | A1 | 14.1075 | A3 | 0.7425 | C2 | 0.15 | 82 | G4 | 3 |
| Composition 5 | A2 | 1.881 | A3 | 0.099 | C1 | 0.02 | 98 | — | — |
| Composition 6 | A1 | 14.85 | — | — | C1 | 0.15 | 85 | — | — |
| Composition 7 | A2 | 1.98 | — | — | C1 | 0.02 | 85 | — | — |
| Composition 8 | A3 | 14.85 | — | — | C1 | 0.15 | 85 | — | — |

Components and abbreviations in Table 1 above are as follows.

[Two Kinds of Resins in which Main Chain Structures Having Hydroxyl Group are Different]

From the following A1 to A3, two kinds of resins are appropriately selected and used.

A1: Pullulan (weight average molecular weight: 200,000; Hayashibara Co., Ltd.)

A2: Water-soluble cellulose (weight average molecular weight: 200,000; Daicel FineChem Co., Ltd.; HEC Daicel)

A3: Polyvinyl alcohol (saponification degree: 99 mol % or more, polymerization degree: 500; Kuraray Co., Ltd.)

[Additives (Surfactant)]

C1: Emma Rex 710 (Nihon Emulsion Co., Ltd.)

C2: Emma Rex 310 (Nihon Emulsion Co., Ltd.)

[Solvent]

G4: Dipropylene glycol monomethyl ether

[Formation of a Protective Film Using the Above-described Resin Composition on Bare Silicon]

The resin compositions described in Table 1 above were coated on 4-inch bare silicon substrate with a spin coater (1,200 rpm, 30 seconds) and then baked at 100° C./60 seconds on a hot plate to obtain a protective film with an average film thickness of 1000 nm. Thereafter, the thickness of the protective film was measured at 15 points using Lambda Ace (manufactured by Dainippon Screen Co. Ltd.) as the substrate. The difference between the maximum and minimum values of the measured film thickness (film thickness range) is shown in Table 2. That is, a case where the difference is 100 nm or less is regarded as A, and a case where the difference exceeds 100 nm is regarded as B. A case where there is a release after visual confirmation is regarded as B, and a case regarded there is no release is regarded as A in Table 2.

[Formation of a Protective Film Using the Above-described Resin Composition on the Organic Semiconductor Film]

As an organic semiconductor, concentration 10 mL of P3HT (manufactured by Merck Co., Ltd.) chlorobenzene solution 10 mL having a concentration of 20 g/L and 10 mL of [60] PCBM (manufactured by Solenne Co.) chlorobenzene solution having a concentration of 14 g/L were mixed, applied on 4-inch bare silicon substrate using a spin coater (1,200 rpm, 30 seconds) and then dried at 140° C./15 minutes on a hot plate to form an organic semiconductor film having a thickness of 100 nm. The wafer formed with the organic semiconductor film on a substrate was regarded as a wafer 1. The resin compositions described in Table 1 was coated on the wafer 1 by a spin coater (1,200 rpm, 30 seconds) and then baked at 100° C. for 60 seconds to form a wafer 2 in which the protective film having a thickness of 1,000 nm are formed on the organic semiconductor film. Further, the case in which there is a coating unevenness, such as release or striation (phenomenon in which concavity and convexity of the film thickness is radically produced) by visual observation is regarded as B in Table 2, and the case in which there are no releasing and coating unevenness is regarded as A in Table 2.

Based on the result of the comprehensive determination, a case where both results on the bare silicon and on the organic semiconductor are determined as A is regarded as "pass", and a case where any one is determined as B is regarded as "fail" in Table 2.

[Table 2]

TABLE 2

|  |  | On bare silicon substrate | | On organic semiconductor substrate | |
| --- | --- | --- | --- | --- | --- |
|  | Kind | Film thickness rage | peeling | Peeling/uneven coating | Result of Determination |
| Example 1 | Composition 1 | A | A | A | Pass |
| Example 2 | Composition 2 | A | A | A | Pass |
| Example 3 | Composition 3 | A | A | A | Pass |
| Example 4 | Composition 4 | A | A | A | Pass |
| Example 5 | Composition 5 | A | A | A | Pass |
| Comparative Example 1 | Composition 6 | A | B | B | Fail |
| Comparative Example 2 | Composition 7 | B | A | B | Fail |
| Comparative Example 3 | Composition 8 | B | A | B | Fail |

As is apparent from the results shown in Table 2, Comparative Examples 1 to 3 in which a protective film was obtained using a resin composition containing one resin having a hydroxyl group showed that the thickness range is large on a bare silicon, but a release occurs and a releasing or coating unevenness is generated on the organic semiconductor film.

On the other hand, Examples 1 to 5 in which a protective film was obtained by mixing two kinds of resins in which the chain structures having hydroxyl group are different showed that the film thickness range is small on a bare silicon, no a release is presented, and a releasing or uneven coating unevenness is not generated on the organic semiconductor film.

Examples 6-9, Comparative Examples 4 and 5

[Pattern Formation Using the Actinic Ray-sensitive or Radiation-sensitive Resin Composition (I) Containing a Resin Capable of Increasing a Polarity by an Action of an Acid to Decrease the Solubility in a Developer Containing an Organic Solvent]

The actinic ray-sensitive or radiation-sensitive resin composition shown in Tables 3 and 4 below was coated on the 4-inch (8-inch in a case of KrF exposure) wafer 2 and then baked 100° C. for 60 seconds to form a wafer 3 in which the resist film having a thickness of 500 nm are formed on the wafer 2.

Next, the wafer 3 was subjected to exposure (exposure amount: 120 mJ/cm²) under optical conditions of NA: 0.57, σ: 0.60 using an i-ray projection exposure apparatus NSR2005i9C (manufactured by Nikon), or subjected to exposure (exposure amount: 25 mJ/cm²) under optical conditions of NA: 0.60, σ: 0.70 using KrF projection exposure apparatus PAS5500/850 (manufactured by ASML, Inc.), and exposed through a binary mask of 1:1 line-and-space pattern with a line width of 25 μm. Thereafter, it was baked at 110° C. for 60 seconds, developed with a developer described in Table 5 below for 15 seconds and spin-dried to obtain a resist pattern of 1:1 line-and-space pattern with a line width of 25 μm. Further, it was then developed with water (a developer solution 2 described in Table 5 below) for 30 seconds and spin-dried to obtain a pattern of 1:1 line-and-space a line width of 25 μm in the same manner as the resist pattern on the protective film.

Components and abbreviations in Table 3 are as follows.

[Resin Capable of Increasing a Polarity by an Action of an Acid to Decrease the Solubility in the Developer Solution Containing the Organic Solvent]

For resins D1 and D2, the repeating unit (unit), composition ratio (molar ratio), weight average molecular weight (Mw), and polydispersity are shown.

[Chem. 44]

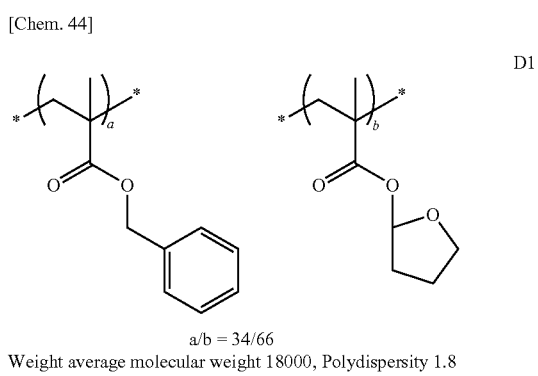

D1 a/b = 34/66
Weight average molecular weight 18000, Polydispersity 1.8

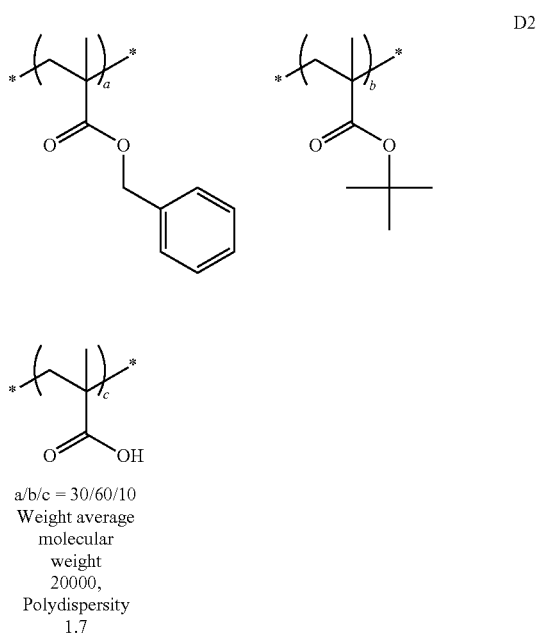

D2 a/b/c = 30/60/10
Weight average molecular weight 20000,
Polydispersity 1.7

TABLE 3

| | Acid-decomposable resin | | Acid generator | | Additives | | | | Solvent | | | |
|---|---|---|---|---|---|---|---|---|---|---|---|---|
| | Kind | Content (g) | Kind | Content (g) | Kind | Content (g) | Kind | Content (g) | Kind | Content (g) | Kind | Content (g) |
| Composition 9 | D1 | 9.698 | E1 | 0.25 | F3 | 0.05 | F1 | 0.002 | G1 | 90 | | |
| Composition 10 | D2 | 5.566 | E2 | 0.404 | F2 | 0.018 | F1 | 0.012 | G1 | 47 | G3 | 47 |

[Acid Generator (PAG)]

[Chem. 45]

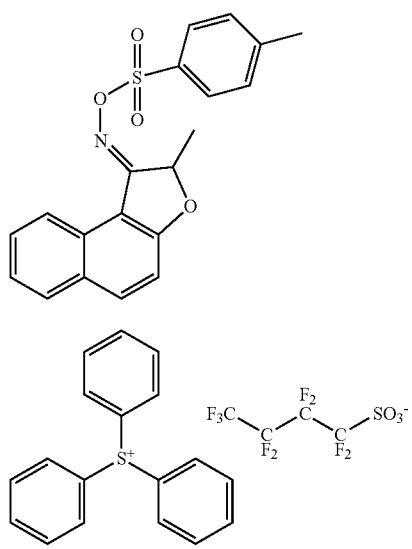

[Additives]

[Chem. 46]

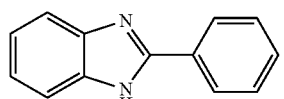

[Chem. 47]

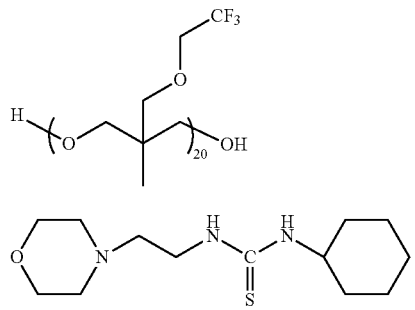

[Solvent]
G1: propylene glycol monomethyl ether acetate (PGMEA)
G3: cyclohexanone Components and abbreviations in Table 4 above are as follows.

[Crosslinking Compound, and Resin]

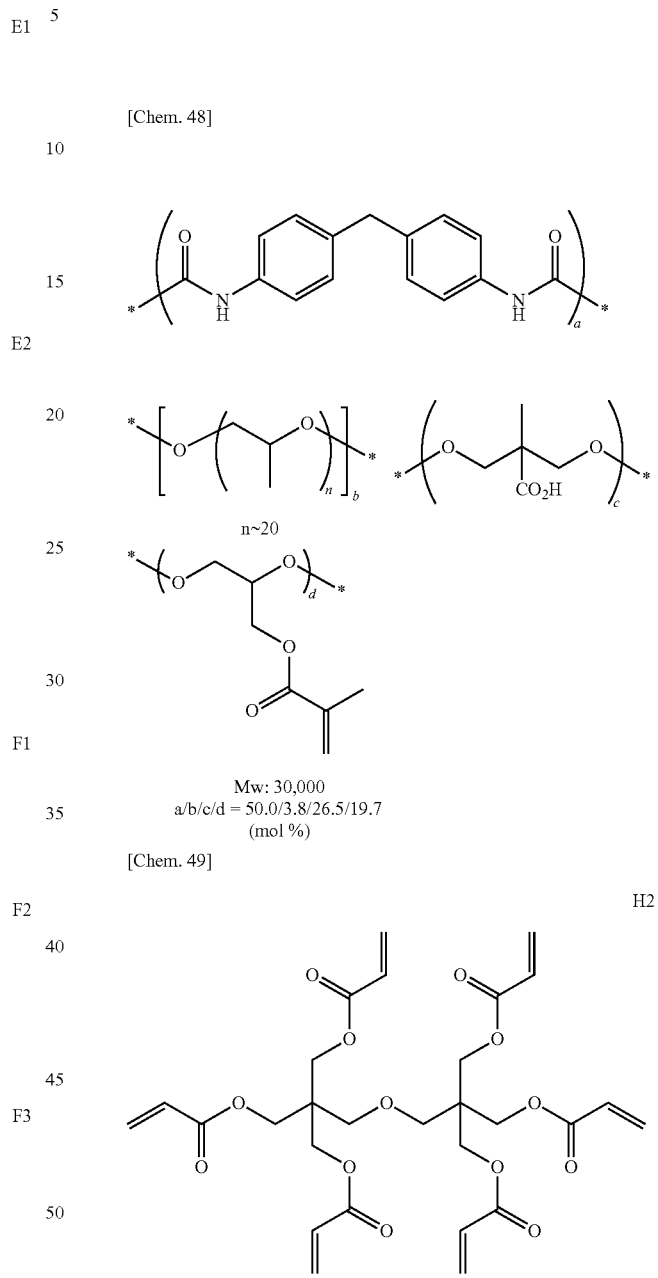

TABLE 4

| | Resin | | Crosslinking compound | | Reaction initiator | | Additive | | Solvent | |
|---|---|---|---|---|---|---|---|---|---|---|
| | Kind | Content (g) | Kind | Content (g) | Kind | Content (g) | Kind | Content (g) | Kind | Content (g) |
| Composition 11 | III | 9.44 | H2 | 9.44 | J1 | 1 | F2 | 0.12 | G1 | 80 |

[Photoinitiator]

[Chem. 50]

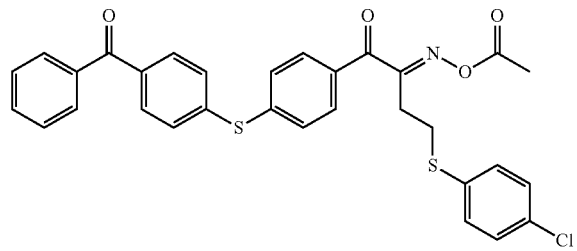

[Confirmation of Pattern Formation]

The combination of each resin composition for forming a protective film and the actinic ray-sensitive or radiation-sensitive resin composition, the exposure light source and type of the developer solution are described in Table 5 below. A case where the resist pattern could be formed is regarded as "A", and a case where the pattern was not formed is regarded as "B".

Further, after the pattern formation, the removal of the resist pattern in PGME or 4-methyl-2-pentanol (MIBC) was evaluated at room temperature for 60 seconds. The results are also listed in Table 5. A case where the releasing was possible is regarded as "A", and a case where the releasing was not possible or the case where releasable pattern could not be formed is regarded as "B".

As is apparent from the results shown in Table 5, Comparative Examples 4 and 5 using a crosslinkable actinic ray-sensitive or radiation-sensitive resin composition containing the resin and the crosslinkable compound showed that the pattern, formability was excellent and the releasing property is inferior.

On the other hand, Examples 6-9 using a protective film of the present invention and also using the actinic ray-sensitive or radiation-sensitive resin composition containing an acid-decomposable resin showed that both pattern formability and releasing property are excellent.

Examples 10-15

[Pattern Formation Using the Actinic Ray-sensitive or Radiation-sensitive Resin Composition (II) Containing a Conjugated Diene Polymer or a Cyclized Product Thereof, and a Crosslinking Agent]

The compositions described in Table 6 below was spin-coated on the wafer 2 which is a laminate to form a protective film on the organic semiconductor film, from Examples 1 to 5 and baked at 110° C. for 60 seconds to form a wafer 3 in which a resist film with a film thickness of 1.5 µm was formed on the wafer 2.

Next, the wafer 3 was subjected to contact exposure (exposure amount: 120 mJ/cm$^2$) under optical conditions of NA: 0.57, σ: 0.60 using an i-ray projection exposure apparatus NSR 2005i9C (manufactured by Nikon), and exposed through a binary mask of 1:1 line-and-space pattern with a line width of 2 µm. Thereafter, it was baked at 110° C. for

TABLE 5

| | Resin composition | Radiation-sensitive resin composition | Exposure light source | Developer 1 | Developer 2 | Resist pattern formation | Releasing property PGME | Releasing property MIBC |
|---|---|---|---|---|---|---|---|---|
| Example 6 | Composition 1 | Composition 9 | i-ray | K2 | K3 | A | A | B |
| Example 7 | Composition 1 | Composition 10 | KrF | K1 | K3 | A | A | A |
| Comparative Example 4 | Composition 1 | Composition 11 | i-ray | K2 | K3 | A | B | B |
| Example 8 | Composition 3 | Composition 9 | i-ray | K2 | K3 | A | A | B |
| Example 9 | Composition 3 | Composition 10 | KrF | K1 | K3 | A | A | A |
| Comparative Example 5 | Composition 3 | Composition 11 | i-ray | K2 | K3 | A | B | B |

Among the Table 5 above, Comparative Examples 4 and 5 are comparative examples of Claim 8.

Abbreviations in the Table 5 above are as follows.
[Developer]
K1: butyl acetate
K2: 2-heptanone
K3: water 60 seconds and then developed with a developer 1 described in Table 7 below at room temperature for 15 seconds and spin-dried to obtain a resist pattern of a line-and-space. Thereafter, it was developed with water (developer 2 shown in Table 7 below) for 30 seconds and spin-dried to obtain a pattern of a line-and-space having a line width 25 µm in the same manner as the resist patter on the protective film.

TABLE 6

| Composition 12 | Cyclized isoprene rubber 26 parts by mass | 2,6-di(para-azidobenxal)-4-methyl cyclohexanone 0.5 parts by mass | 4,4'-butadiene-bis(6-tert-butyl-m-cresol) 0.1 parts by mass | Xylene 74 parts by mass | |
| --- | --- | --- | --- | --- | --- |
| Composition 13 | Cyclized isoprene rubber 12 parts by mass | 2,6-di(para-azidobenzal)-4-methyl cyclohexanone 0.5 parts by mass | 4,4'-butadiene-bis(6-tert-butyl-m-cresol) 0.1 parts by mass | Naththalazine 0.5 parts by mass | Xylene 87 parts by mass |
| Composition 14 | Cyclized isoprene rubber 12 parts by mass | 2,6-di(para-azidobenzal)-4-methyl cyclohexanone 0.5 parts by mass | 4,4'-butadiene-bis(6-tert-butyl-m-cresol) 0.06 parts by mass | 87 parts by mass | |
| Composition 15 | Cyclized isoprene rubber 10 parts by mass | 2,6-di(para-azidobenzal)-4-methyl cyclolhexanone 0.3 parts by mass | Diazoaminobenzene 0.15 parts by mass | Oil Yellow SS special 0.1 parts by mass | Xylene 89 parts by mass |

TABLE 6-continued

| | | | | | | |
|---|---|---|---|---|---|---|
| Composition 16 | Cyclized isoprene rubber 11 parts by mass | 2,6-di(para-azidobenzal)-4-methyl cyclohexanone 0.4 parts by mass | Xylene 88 parts by mass | | | |
| Composition 17 | Cyclized isoprene rubber 7 parts by mass | 2,6-di(para-azidobenzal)-4-methyl cyclohexanone 0.2 parts by mass | Diazoaminobenzene 0.1 parts by mass | Kaycoll C 0.2 parts by mass | Oil Yellow SS special 0.1 parts by mass | Xylene 92 parts by mass |

Components and abbreviations in Table above are as follows.
[Cyclized Product of the Conjugated Diene-based Polymer]
 Cyclized isoprene rubber: weight average molecular weight: 4,9000, polydispersity (weight average molecular weight/number average molecular weight: 1.7, and cyclization: 65%.
[Crosslinking Agent]
 2,6-di(para-azidobenzal)-4-methyl cyclohexanone
[Polymerization Initiator]
 Diazoaminobenzene
[Antioxidant]
 4,4'-butadiene-bis(6-tert-butyl-m-cresol)
[Colorant]
 Naphthalazine
 Oil Yellow SS special (manufactured by Shirado Chemistry)
 Keycall C (manufactured by Nippon Soda)
[Solvent]
 Xylene
[Confirmation of Pattern Formation]
 The combination of each resin composition for forming a protective film and the actinic ray-sensitive or radiation-sensitive resin composition, and type of the developer are described in Table 7 below. A case where the resist pattern could be formed is regarded as "A", and a case where the pattern was not formed is regarded as "B".
 Further, after a pattern formation, the releasing property of the resist pattern in PGME or 4-methyl-2-pentanol (MIBC) was evaluated at room temperature for 60 seconds. The results are also listed in Table 7. A case where the releasing was made is regarded as "A", and a case where the releasing was not possible or a case where releasable pattern could not be formed is regarded as "B".

rubber and a crosslinking agent showed that both pattern formability and releasing property are excellent.

INDUSTRIAL APPLICABILITY

According to the present invention, there is provided a resin composition for forming protective film, a protective film, and a pattern forming method, which can form the protective film, having uniform film thickness without occurrence of a release or coating irregularity, on a substrate or on a film formed on the substrate, thereby forming fine and uniform pattern by a developer containing an organic solvent.
 Also, according to the pattern-forming method of the present invention, the formed resist and protective film pattern may be used a mask to form a desired pattern on the organic semiconductor film, and subsequently, the resist and protective film used as a mask may be removed without damaging on the organic semiconductor film of the underlying layer.
 In addition, there is provided the electronic device manufactured by the method for manufacturing the electronic device comprising the pattern forming method.
 While the invention has been described with reference to details or specific embodiments, it will be apparent to those skilled in the art that various changes and modifications may be made thereto without departing from the spirit and scope of the invention.
 This application is based on Japanese Patent Application filed on Oct. 19, 2012 (Japanese Patent Laid-Open Publication No. 2012-232416) and Japanese Patent Application filed on Aug. 26, 2013 (Japanese Patent Laid-Open Publication No. 2013-174743), the contents of which are incorporated herein by reference.

TABLE 7

| | Resin composition for forming a protective film | Resin composition containing a cyclized isoprene rubber | Developer 1 | Developer 2 | Resist pattern formation | Releasing property PGME | Releasing property MIBC |
|---|---|---|---|---|---|---|---|
| Example 10 | Composition 1 | Composition 12 | K1 | K3 | A | A | A |
| Example 11 | Composition 2 | Composition 13 | K2 | K3 | A | A | A |
| Example 12 | Composition 3 | Composition 14 | K1 | K3 | A | A | A |
| Example 13 | Composition 4 | Composition 15 | K2 | K3 | A | A | A |
| Example 14 | Composition 5 | Composition 16 | K1 | K3 | A | A | A |
| Example 15 | Composition 5 | Composition 17 | K2 | K3 | A | A | A |

In abbreviations in Table 7, the developers K1 to K3 are as described above.
 As apparent from the results shown in Table 7, Examples 10 to 15 which use the protective film of the present invention, and also use the actinic ray-sensitive or radiation-sensitive resin composition comprising a cyclized isoprene

What is claimed is:
 1. A pattern forming method comprising the following steps:
  (1) forming an organic semiconductor film on a substrate,
  (2) forming a protective film using a resin composition on the organic semiconductor film, wherein the resin com- position contains two or more kinds of resins in which their main chain structures having a hydroxyl group are different, and contains water, (3) forming a resist film on the protective film by an actinic ray-sensitive radiation-sensitive resin composition (I) containing a resin capable of increasing a polarity by an action of an acid to decrease the solubility in a developer containing an organic solvent, or an actinic ray-sensitive or radiation-sensitive resin composition (II) containing a conjugated diene polymer or copolymer or a cyclized product of the polymer or the copolymer, and a crosslinking agent, (4) exposing the resist film, (5) developing the resist film with a developer containing an organic solvent to form a negative type resist pattern on the resist film, (6) forming a pattern on the protective layer by using water as a developer and using the resist pattern as a mask pattern, (7) forming a pattern on the organic semiconductor film by using dry or wet etching and using the resist and protective film pattern as a mask, and (8) removing the resist pattern using a peeling solution containing an organic solvent and further removing the protective film pattern using water.

2. The pattern forming method according to claim 1, wherein the developer containing an organic solvent is a developer containing at least one organic solvent selected from the group consisting of an ester solvent, a ketone solvent, an alcohol solvent, an amide solvent, an ether solvent, and a hydrocarbon solvent.

3. The pattern forming method according claim 1, wherein the peeling solution containing an organic solvent is a peeling solution containing at least one organic solvent selected from the group consisting of an alcohol solvent, an ether solvents and a hydrocarbon solvent.

4. A method for manufacturing an electric device, comprising the pattern forming method according to claim 1.

5. A layered product comprising:
a substrate,
an organic semiconductor film on the substrate, and
a protective film comprising two or more kinds of resins in which their main chain structures having a hydroxyl group are different, on the organic semiconductor film.

6. A layered product comprising:
a substrate,
an organic semiconductor film on the substrate,
a protective film comprising two or more kinds of resins in which their main chain structures having a hydroxyl group are different, on the organic semiconductor film, and
a resist film comprising an actinic ray-sensitive or radiation-sensitive resin composition (I) containing a resin capable of increasing a polarity by an action of an acid to decrease the solubility in a developer containing an organic solvent, on the protective film.

* * * * *